(12) United States Patent
Yamazaki et al.

(10) Patent No.: US 10,038,100 B2
(45) Date of Patent: Jul. 31, 2018

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Kenichi Okazaki, Tochigi (JP); Masashi Tsubuku, Saitama (JP); Satoru Saito, Tochigi (JP); Noritaka Ishihara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/429,234

(22) Filed: Feb. 10, 2017

(65) Prior Publication Data
US 2017/0236949 A1  Aug. 17, 2017

(30) Foreign Application Priority Data

Feb. 12, 2016  (JP) ................. 2016-024845
Jun. 24, 2016  (JP) ................. 2016-125480

(51) Int. Cl.
*H01L 21/00* (2006.01)
*H01L 29/786* (2006.01)
(Continued)

(52) U.S. Cl.
CPC .... *H01L 29/78696* (2013.01); *H01L 27/1225* (2013.01); *H01L 29/045* (2013.01);
(Continued)

(58) Field of Classification Search
None
See application file for complete search history.

(56) References Cited

U.S. PATENT DOCUMENTS 4,965,218 A * 10/1990 Geissberger ...... H01L 21/02063
257/E21.173
5,731,856 A    3/1998 Kim et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Thao P Le
(74) *Attorney, Agent, or Firm* — Fish & Richardson P.C.

(57) ABSTRACT

A semiconductor device with improved electrical characteristics is provided. A semiconductor device with improved field effect mobility is provided. A semiconductor device in which the field-effect mobility is not lowered even at high temperatures is provided. A semiconductor device which can be formed at low temperatures is provided. A semiconductor device with improved productivity can be provided. In the semiconductor device, there is a range of a gate voltage where the field-effect mobility increases as the temperature increases within a range of the gate voltage from 0 V to 10 V. For example, such a range of a gate voltage exists at temperatures ranging from a room temperature (25° C.) to 120° C. In the semiconductor device, the off-state current is kept extremely low (lower than or equal to the detection limit of a measurement device) within the above temperature range.

23 Claims, 59 Drawing Sheets

(51) Int. Cl.
  *H01L 27/12* (2006.01)
  *H01L 29/04* (2006.01)
  *H01L 29/24* (2006.01)
(52) U.S. Cl.
  CPC .......... *H01L 29/24* (2013.01); *H01L 29/7869* (2013.01); *H01L 29/78648* (2013.01)

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 * | 9/2006 | Nause | H01L 29/22 257/192 |
| 7,211,825 B2 * | 5/2007 | Shih | H01L 29/78633 257/13 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,990,223 B1 * | 8/2011 | Takagi | H01L 23/66 330/296 |
| 8,247,276 B2 * | 8/2012 | Kondo | H01L 27/1259 257/E21.411 |
| 9,496,408 B2 * | 11/2016 | Yamazaki | H01L 29/7869 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0167023 A1 * | 11/2002 | Chavarkar | H01L 29/7783 257/194 |
| 2003/0189401 A1 | 10/2003 | Kido et al. | |
| 2003/0218221 A1 * | 11/2003 | Wager, III | H01L 29/02 257/410 |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Fan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2013/0334533 A1 * | 12/2013 | Yamazaki | H01L 29/7869 257/57 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2014-007399 A | 1/2014 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Trans-

(56) References Cited

OTHER PUBLICATIONS actions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers. 2007, vol. 38, pp. 1830-1833.

Hsieh.H et al., "P-29:Modeling of Amorphous Oxide Semiconductor Thin Film Transistors and Subgap Density of States", SID Digest '08 : SID International Syposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A, Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In 2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-

(56) References Cited

OTHER PUBLICATIONS crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104.3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kang. Y et al., "Cation disorder as the major electron scattering source in crystalline InGaZnO", Appl. Phys. Lett. (Applied Physics Letters), Apr. 15, 2013, vol. 102, No. 15, pp. 152104-1-152104-4.

\* cited by examiner

Sample B1 L/W = 50μm/3μm Vd = 10V

Sample B2 L/W = 50μm/3μm Vd = 10V

FIG. 32A Sample X3:R.T.,O₂=10%
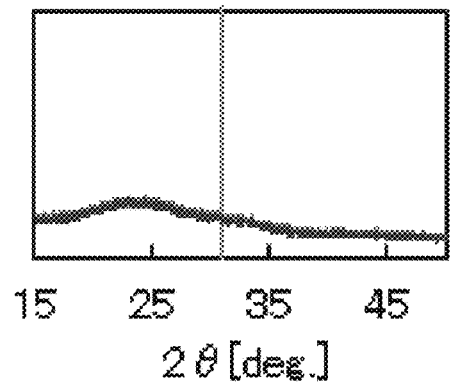
FIG. 32B Sample X3:R.T.,O₂=10%
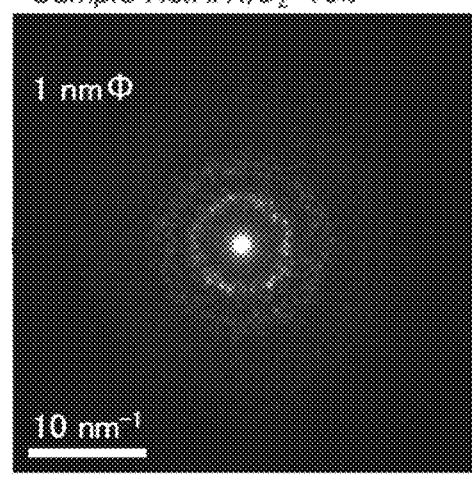
FIG. 32C Sample X3:R.T.,O₂=10%
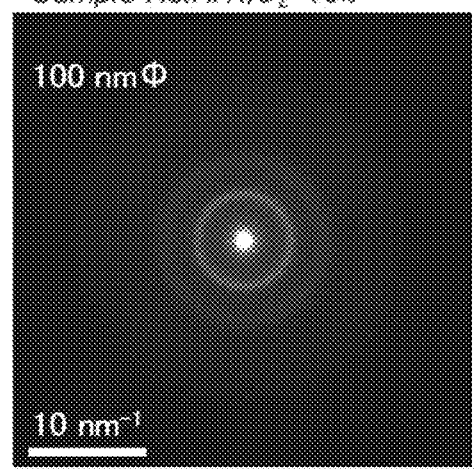

FIG. 33A
FIG. 33B
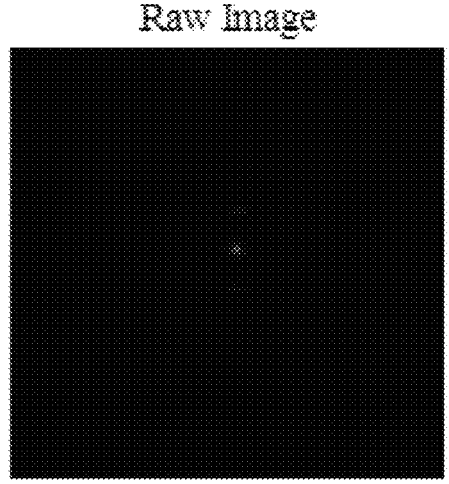
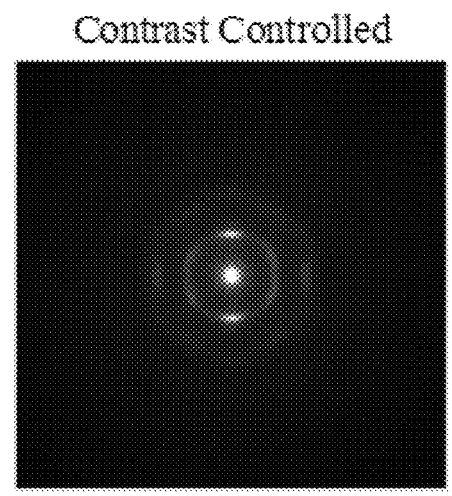

FIG. 35

| | Line Profile | | $R = \dfrac{A - A'}{B - B', C - C'}$ | FWHM |
|---|---|---|---|---|
| | A-A' | B-B', C-C' | | |
| Single Crystal | (00$l$) (00$\bar{l}$) peaks | single peak | $R \gg 1$ | Small |
| only CAAC | (00$\bar{l}$) (00$l$) peaks | single peak | $R \gg 1$ | Relatively Small |
| CAAC + Nano-crystal | (00$\bar{l}$) (00$l$) peaks | nc peaks | $R > 1$ | Middle |
| Nano-crystal | nc peaks | nc peaks | $R = 1$ | Relatively Large |
| Amorphous | halo | halo | $R = 1$ or low intensity | Large |

FIG. 36A1
Sample X1:170°C,O₂=30%
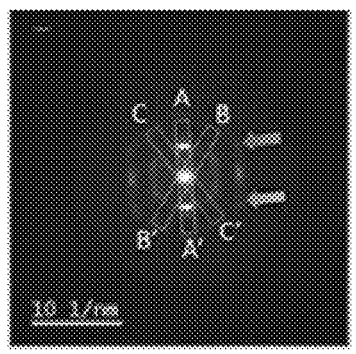
FIG. 36A2
Sample X1:170°C,O₂=30%
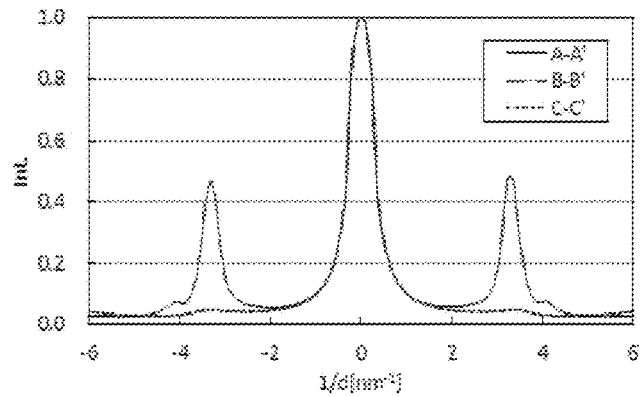
FIG. 36B1
Sample X2:130°C,O₂=10%
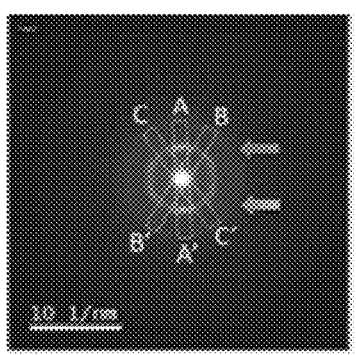
FIG. 36B2
Sample X2:130°C,O₂=10%
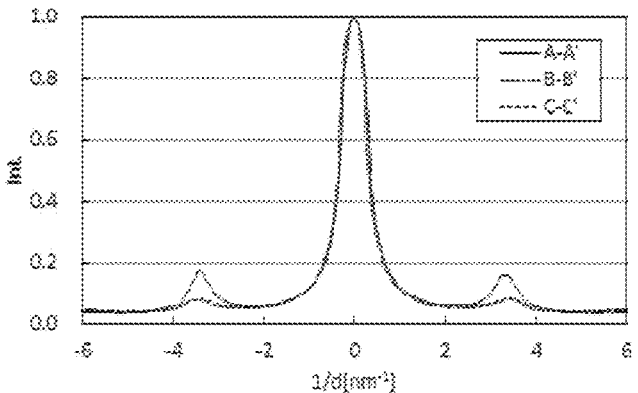
FIG. 36C1
Sample X3:R.T.,O₂=10%
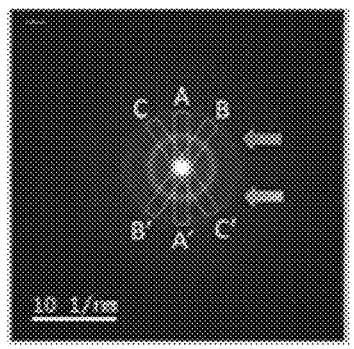
FIG. 36C2
Sample X3:R.T.,O₂=10%
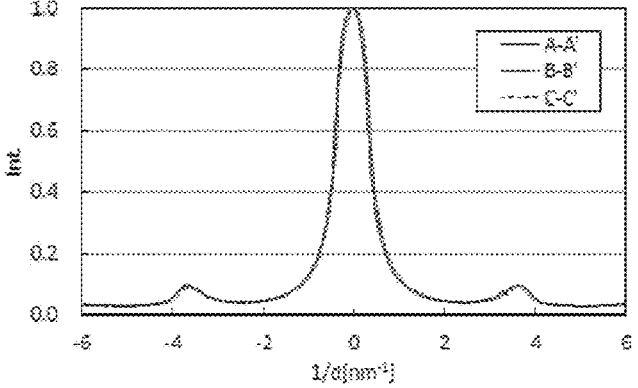

FIG. 38A1
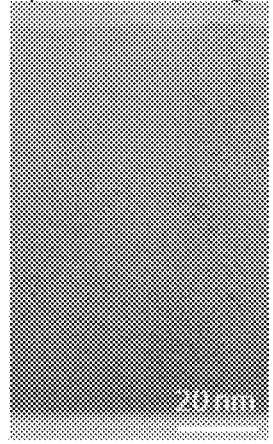
FIG. 38A2
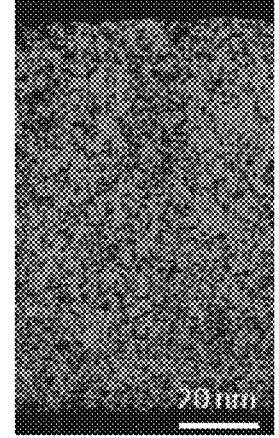
FIG. 38B1
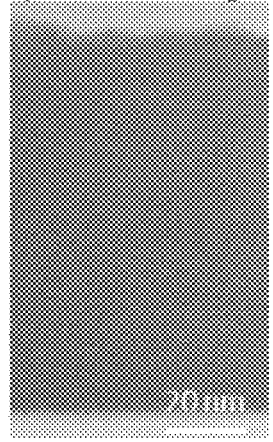
FIG. 38B2
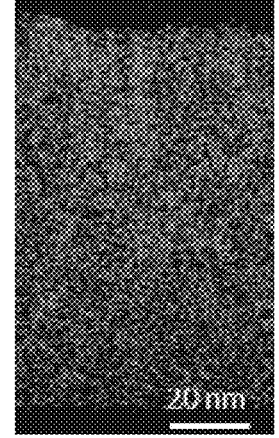
FIG. 38C1
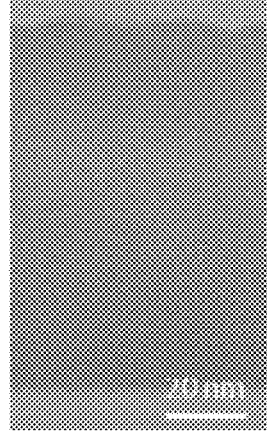
FIG. 38C2
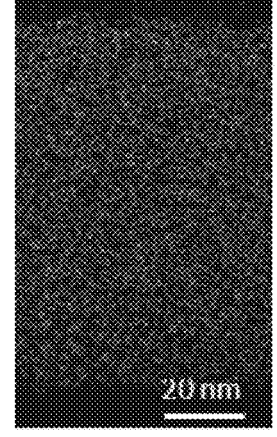

SEMICONDUCTOR DEVICE

BACKGROUND OF THE INVENTION

1. Field of the Invention

One embodiment of the present invention relates to a semiconductor device. One embodiment of the present invention relates to a semiconductor device including an oxide semiconductor.

In this specification or the like, a semiconductor device means all types of devices that can function by utilizing semiconductor characteristics, and a transistor, a semiconductor circuit, and the like are embodiments of semiconductor devices. An arithmetic device, a memory device, an imaging device, an electro-optical device, a power generation device (e.g., a thin film solar cell and an organic thin film solar cell), and an electronic appliance each may include a semiconductor device.

2. Description of the Related Art

An oxide semiconductor has attracted attention as a semiconductor material applicable to the transistor. For example, Patent Document 1 discloses a semiconductor device whose field-effect mobility (in some cases, simply referred to as mobility or $\mu_{FE}$) is improved by stacking a plurality of oxide semiconductor layers, among which the oxide semiconductor layer serving as a channel contains indium and gallium where the proportion of indium is higher than the proportion of gallium.

Non-Patent Document 1 discloses that an oxide semiconductor containing indium, gallium, and zinc has a homologous series represented by $In_{1-x}Ga_{1+x}O_3(ZnO)_m$ (x is a number which satisfies $-1 \leq x \leq 1$, and m is a natural number). Furthermore, Non-Patent Document 1 discloses a solid solution range of a homologous series. For example, in the case of a solid solution range of a homologous series when m is 1, x is within a range from −0.33 to 0.08, and in the case of a solid solution range of a homologous series when m is 2, x is within a range from −0.68 to 0.32.

REFERENCE

Patent Document

[Patent Document 1] Japanese Published Patent Application No. 2014-007339

Non-Patent Document

Non-Patent Document 1

M. Nakamura, N. Kimizuka, and T. Mohri, "The Phase Relations in the $In_2O_3$-$Ga_2ZnO_4$—ZnO System at 1350° C.," *J. Solid State Chem.*, 1991, Vol. 93, pp. 298-315.

SUMMARY OF THE INVENTION

An object of one embodiment of the present invention is to provide a semiconductor device with improved electrical characteristics. Another object is to provide a semiconductor device with improved field-effect mobility. Another object is to provide a semiconductor device in which field-effect mobility is not lowered even at high temperatures. Another object is to provide a semiconductor device which can be formed at low temperatures. Another object is to provide a semiconductor device with improved productivity. Another object is to provide a novel semiconductor device. Another object of the present invention is to provide a highly reliable semiconductor device.

Another object of one embodiment of the present invention is to provide an oxide semiconductor film having highly stable physical properties which can be formed at low temperatures and a semiconductor device including the oxide semiconductor film.

Note that the descriptions of these objects do not disturb the existence of other objects. In one embodiment of the present invention, there is no need to achieve all the objects. Note that other objects can be derived from the description of the specification, the drawings, the claims, and the like.

One embodiment of the present invention is a semiconductor device including a semiconductor layer, a gate, a gate insulating layer, a source, and a drain. The semiconductor layer includes an oxide semiconductor. In the semiconductor device, there is a range of a gate voltage where the field-effect mobility increases as the temperature increases within a range of the gate voltage from 0 V to 10 V.

Another embodiment of the present invention is a semiconductor device including a semiconductor layer, a first conductive layer, a second conductive layer, a third conductive layer, a fourth conductive layer, a first insulating layer, a second insulating layer, and a third insulating layer. The first conductive layer is provided over a formation surface. The first insulating layer covering the first conductive layer is provided. The semiconductor layer overlapping with the first conductive layer is provided over the first insulating layer. The second insulating layer and the second conductive layer are stacked over the semiconductor layer. The third insulating layer is provided to cover the semiconductor layer and the second conductive layer. The third conductive layer and the fourth conductive layer are provided apart from each other over the third insulating layer. The third conductive layer and the fourth conductive layer are provided in contact with regions of the semiconductor layer not overlapping with the second conductive layer, through openings provided in the third insulating layer. The first conductive layer and the second conductive layer are electrically connected to each other and function as gates. The semiconductor layer includes an oxide semiconductor. In the semiconductor device, there is a range of a gate voltage where the field-effect mobility increases as the temperature increases within a range of the gate voltage from 0 V to 10 V.

Another embodiment of the present invention is a semiconductor device including a semiconductor layer, a first conductive layer, a second conductive layer, a third conductive layer, a fourth conductive layer, a first insulating layer, and a second insulating layer. The first conductive layer is provided over a formation surface. The first insulating layer covering the first conductive layer is provided. The semiconductor layer overlapping with the first conductive layer is provided over the first insulating layer. The third conductive layer and the fourth conductive layer are provided apart from each other to be in contact with a top surface of the semiconductor layer. The second insulating layer covering the semiconductor layer, the third conductive layer, and the fourth conductive layer is provided. The second conductive layer overlapping with a region of the semiconductor layer where the third conductive layer and the fourth conductive layer are apart from each other is provided over the second insulating layer. The first conductive layer and the second conductive layer are electrically connected with each other and function as gates. The semiconductor layer includes an oxide semiconductor. In the semiconductor device, there is a range of a gate voltage where the field-effect mobility increases as the temperature increases within a range of the gate voltage from 0 V to 10 V.

In the above, it is preferable that there be a range of a gate voltage where the field-effect mobility increases continuously as the temperature increases at temperatures ranging from 25° C. to 120° C.

In the above, the channel length is preferably less than or equal to 3 μm.

In the above, it is preferable that there be a range of a gate voltage where the field-effect mobility is greater than or equal to 10 $cm^2/V_s$ within a range of the gate voltage from 2 V to 10 V at temperatures ranging from 25° C. to 120° C.

In the above, a drain current in an off state is preferably less than $5 \times 10^{-12}$ A at temperatures ranging from 25° C. to 120° C.

In the above, the semiconductor layer preferably includes a non-single-crystal region. Here, the semiconductor layer preferably includes a first crystal part in which a c-axis is aligned in a thickness direction. The semiconductor layer preferably includes a second crystal part with a size less than or equal to 10 nm which does not have orientation. The semiconductor layer preferably includes an amorphous region.

In the above, the semiconductor layer preferably contains In, M (M is Al, Ga, Y, or Sn), and Zn. Here, when the sum of the proportions of In, M, and Zn is defined as 1, a region in which the proportion of In is greater than 33% and less than or equal to 60% is preferably included.

In the above, the semiconductor layer is preferably formed by a sputtering method in a state where a substrate is not heated or a substrate temperature is lower than or equal to 150° C.

According to one embodiment of the present invention, a semiconductor device with improved electrical characteristics can be provided. A semiconductor device with improved field-effect mobility can be provided. A semiconductor device in which field-effect mobility is not lowered even at high temperatures can be provided. A semiconductor device which can be formed at low temperatures can be provided. A semiconductor device with improved productivity can be provided. A highly reliable semiconductor device can be provided. A novel semiconductor device can be provided. An oxide semiconductor film having highly stable physical properties which can be formed at low temperatures and a semiconductor device including the oxide semiconductor film can be provided.

BRIEF DESCRIPTION OF THE DRAWINGS

FIGS. 32A to 32C show XRD measurement results and electron diffraction patterns of an oxide semiconductor film.

FIGS. 33A and 33B show electron diffraction patterns.

FIG. 35 is a conceptual view illustrating luminance profiles of electron diffraction patterns, relative luminance R of luminance profiles, and the half widths of the profiles.

FIGS. 36A1, 36A2, 36B1, 36B2, 36C1, and 36C2 show electron diffraction patterns and luminance profiles.

FIGS. 38A1, 38A2, 38B1, 38B2, 38C1, and 38C2 show cross-sectional TEM images of oxide semiconductor films and cross-sectional TEM images obtained through analysis thereof.

DETAILED DESCRIPTION OF THE INVENTION

Figure 1A:
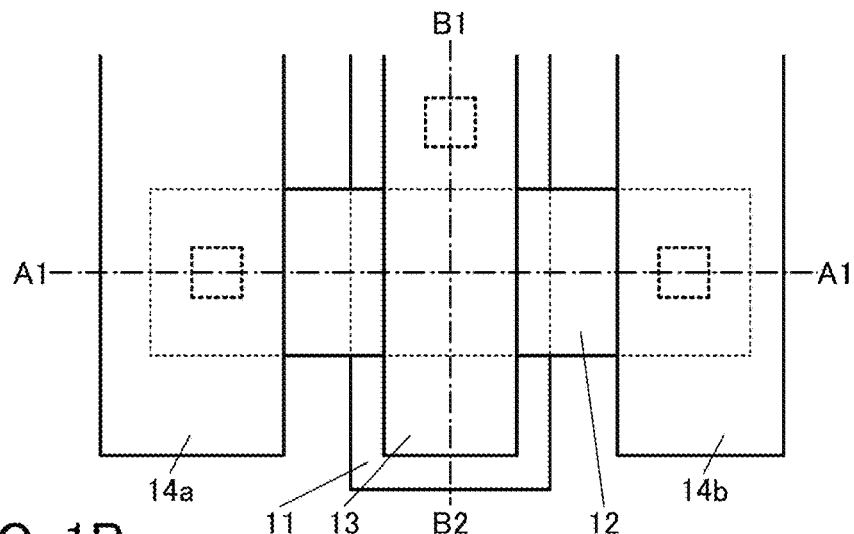
FIGS. 1A to 1C are a top view and cross-sectional views illustrating a semiconductor device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first," "second," and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is referred to as an oxide semiconductor in some cases. In other words, an OS FET is a transistor including a metal oxide or an oxide semiconductor.

In this specification and the like, a metal oxide including nitrogen is also referred a metal oxide in some cases. Furthermore, a metal oxide including nitrogen may be referred to as a metal oxynitride.

In this specification and the like, "c-axis aligned crystal (CAAC)" or "cloud-aligned composite (CAC)" may be stated in some cases. CAAC refers to an example of a crystal structure, and CAC refers to an example of a function or a material composition.

An example of a crystal structure of an oxide semiconductor or a metal oxide is described. Note that an oxide semiconductor deposited by a sputtering method using an In—Ga—Zn oxide target (In:Ga:Zn=4:2:4.1 in an atomic ratio) is described below as an example. An oxide semiconductor formed by a sputtering method using the above-mentioned target at a substrate temperature of higher than or equal to 100° C. and lower than or equal to 130° C. is referred to as sIGZO, and an oxide semiconductor formed by a sputtering method using the above-mentioned target with the substrate temperature set at room temperature (R.T.) is referred to as tIGZO. For example, sIGZO has one or both crystal structures of nano crystal (nc) and CAAC. Furthermore, tIGZO has a crystal structure of nc. Note that room temperature (R.T.) herein also refers to a temperature of the time when a substrate is not heated intentionally.

In this specification and the like, CAC-OS or CAC-metal oxide has a function of a conductor in a part of the material and has a function of a dielectric (or insulator) in another part of the material; as a whole, CAC-OS or CAC-metal oxide has a function of a semiconductor. In the case where CAC-OS or CAC-metal oxide is used in an active layer of a transistor, the conductor has a function of letting electrons (or holes) serving as carriers flow, and the dielectric has a function of not letting electrons serving as carriers flow. By the complementary action of the function as a conductor and the function as a dielectric, CAC-OS or CAC-metal oxide can have a switching function (on/off function). In the CAC-OS or CAC-metal oxide, separation of the functions can maximize each function.

In this specification and the like, CAC-OS or CAC-metal oxide includes conductor regions and dielectric regions. The conductor regions have the above-described function of the conductor, and the dielectric regions have the above-described function of the dielectric. In some cases, the conductor regions and the dielectric regions in the material are separated at the nanoparticle level. In some cases, the conductor regions and the dielectric regions are unevenly distributed in the material. When observed, the conductor regions are coupled in a cloud-like manner with their boundaries blurred, in some cases.

In other words, CAC-OS or CAC-metal oxide can be referred to as a matrix composite or a metal matrix composite.

Furthermore, in the CAC-OS or CAC-metal oxide, each of the conductor regions and the dielectric regions has a size of more than or equal to 0.5 nm and less than or equal to 10 nm, preferably more than or equal to 0.5 nm and less than or equal to 3 nm and is dispersed in the material, in some cases.

Embodiment 1

One embodiment of the present invention is a semiconductor device including a gate, a gate insulating layer, a semiconductor layer, a source, and a drain. As an example of such a semiconductor device, a transistor can be given.

The semiconductor device of one embodiment of the present invention is characterized in that field-effect mobility (saturation mobility) increases with rising temperature.

Specifically, in the semiconductor device, there is a range of a gate voltage where the field-effect mobility increases as the temperature increases within a range of the gate voltage from 0 V to 10 V. For example, such a range of a gate voltage may exist at a temperature of higher than or equal to a room temperature (25° C.) and lower than or equal to 120° C.

Here, the temperature range is not limited to the above; it is varied depending on an expected environment where a device in which the semiconductor device is incorporated is used. For example, in consideration of the use in space, the temperature range from −60° C. to 250° C. is given. Alternatively, in consideration of the use for automobiles, the temperature range from −40° C. to 150° C. is given. Alternatively, in consideration of daily use, the temperature range from −10° C. to 140° C. or the temperature range from a room temperature (25° C.) to 120° C. is given. In one embodiment of the present invention, in such a temperature range, there is a range of a gate voltage where the field-effect mobility does not decrease and increases as the temperature increases.

One embodiment of the present invention is also characterized in that a current in an off state (also referred to as off-state current) can be kept extremely low even when the temperature increases.

Specifically, the off-state current of the semiconductor device of one embodiment of the present invention can be kept extremely low within the temperature range described above. For example, when the semiconductor device is powered off by applying a voltage lower than a threshold voltage by 1 V or more to a gate, the drain current value per micrometer of a channel width can be lower than or equal to the detection limit of a measurement device. Specifically the value can be lower than or equal to $1\times10^{11}$ A/μm, preferably lower than or equal to $5\times10^{12}$ A/μm, more preferably lower than or equal to $1\times10^{12}$ A/μm, still more preferably lower than or equal to $1\times10^{13}$ A/μm, still further preferably lower than or equal to $1\times10^{14}$ A/μm. Actually, the off-state current is much lower than the above value, and the value is lower than or equal to $1\times10^{18}$ A/μm, lower than or equal to $1\times10^{21}$ A/μm, lower than or equal to $1\times10^{22}$ A/μm, or lower than or equal to $1\times10^{23}$ A/μm in some cases.

Such a semiconductor device can be suitably used for a device which is used in a high-temperature environment, for example. Thus, the amount of current flowing through the semiconductor device is not decreased in a high-temperature environment, which prevents the performance of a device from being degraded. Furthermore, since the off-state current of the semiconductor device is kept extremely low, current consumption or power consumption does not increase at high temperatures. Furthermore, in a high-temperature environment, a defect such as degradation or loss in functions of a device due to decrease in on/off ratio of a semiconductor device is not caused.

One embodiment of the present invention can be achieved by using an oxide semiconductor for a semiconductor layer of a transistor, for example. In one embodiment of the present invention, transistor characteristics with high reliability can be obtained even in a miniaturized transistor particularly with a channel length less than or equal to 6 μm, preferably less than or equal to 5 μm, and still preferably less than or equal to 3 μm. Such a miniaturized transistor cannot be obtained in the case of using low-temperature polysilicon (LTPS), for example.

Note that transistor characteristics with high reliability can be obtained even when the channel length of the transistor is greater than 6 μm.

To obtain stable electrical characteristics, it is important to use an oxide semiconductor with sufficiently reduced oxygen vacancies in a semiconductor layer even when the channel length is set extremely short. In particular, it is important that, in accordance with conditions of forming a semiconductor film including an oxide semiconductor, treatment for supplying oxygen to the semiconductor layer is performed appropriately in a later step.

Furthermore, a transistor preferably has a structure where a semiconductor layer is provided between two gates electrically connected to each other and the same gate potential is supplied to the two gates. Accordingly, field-effect mobility and a drain current in an on state (also referred to as on-state current) can be increased.

In the case where an oxide semiconductor is used for the semiconductor layer, a non-single-crystal oxide semiconductor is preferably used. Examples of the non-single-crystal oxide semiconductor include an oxide semiconductor including a region containing a crystal part having orientation with respect to a film surface or a formation surface, an oxide semiconductor including a region containing a crystal part with no orientation, and an oxide semiconductor including an amorphous region. An oxide semiconductor in which two or more of a crystal part having orientation, a crystal part with no orientation, and an amorphous region are mixed may be used.

When an oxide semiconductor with comparatively low crystallinity is used, field effect mobility can be improved. In particular, an advantageous effect that field effect mobility is improved at low gate potentials can be obtained. That is, even when the gate potential is low, a high on-state current can be obtained.

The crystallinity of an oxide semiconductor can be evaluated by observation using transmission electron microscopy (TEM), X-ray diffraction (XRD), electron diffraction, or the like.

More specific examples of the semiconductor device of one embodiment of the present invention are described below.

[Temperature Dependence of Transistor Characteristics]

The results obtained by examining the temperature dependence of a manufactured transistor are described below.

[Transistor Structure]

Figure 1B:
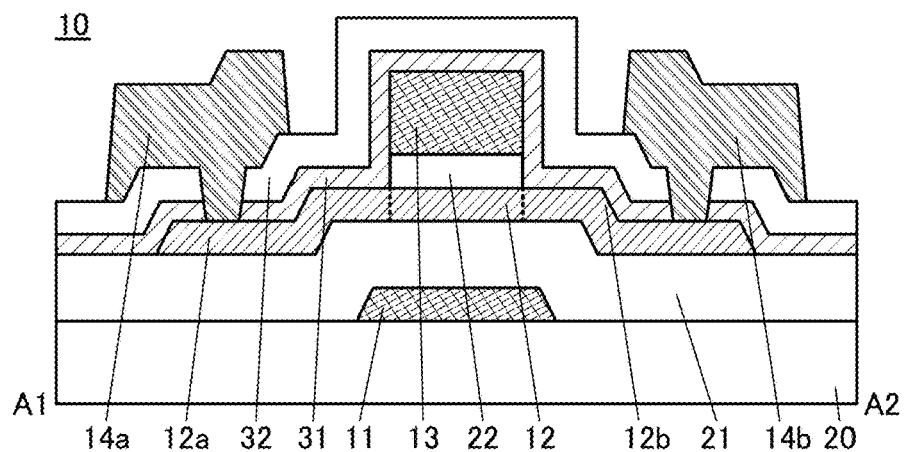
Figure 1C:
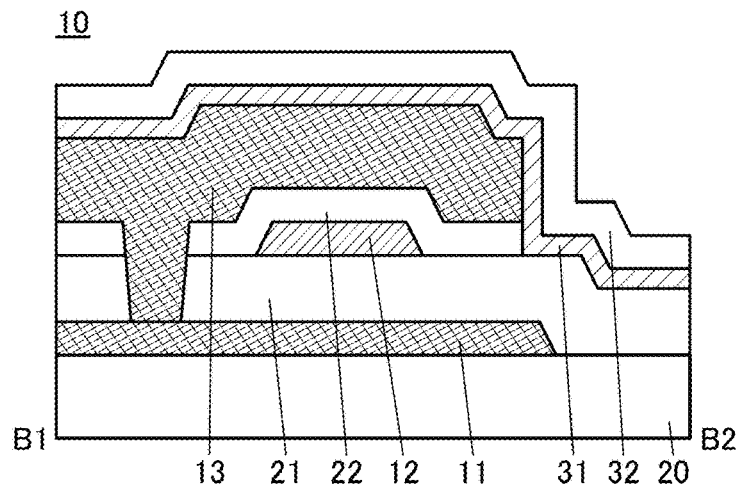

FIG. 1A is a schematic top view of a transistor 10 which is manufactured. FIGS. 1B and 1C are schematic cross-sectional views taken along A1-A2 and B1-B2 in FIG. 1A, respectively. Note that some components (an insulating layer 21 and the like) are not illustrated in FIG. 1A for simplicity.

The transistor 10 is provided over a substrate 20. The transistor 10 includes a conductive layer 11, a semiconductor layer 12, a conductive layer 13, a conductive layer 14a, a conductive layer 14b, the insulating layer 21, and an insulating layer 22. An insulating layer 31 and an insulating layer 32 are provided to cover the transistor 10.

The conductive layer 11 is provided over the substrate 20, and the insulating layer 21 is provided to cover the conductive layer 11. The semiconductor layer 12 overlapping with the conductive layer 11 is provided over the insulating layer 21. The insulating layer 22 and the conductive layer 13 are stacked over the semiconductor layer 12. The insulating layers 31 and 32 are stacked to cover the insulating layer 21, the semiconductor layer 12, the insulating layer 22, and the conductive layer 13. The conductive layers 14a and 14b are provided over the insulating layer 32. The conductive layers 14a and 14b are electrically connected to regions 12a and 12b of the semiconductor layer 12 through openings provided in the insulating layers 31 and 32.

Part of the conductive layer 11 serves as a first gate electrode. Part of the conductive layer 13 serves as a second gate electrode. The semiconductor layer 12 includes a region where a channel is formed in a portion overlapping with the conductive layer 11 or 13. The semiconductor layer 12 includes regions (the regions 12a and 12b) with lower resistance than the region where the channel is formed in portions not overlapping with the conductive layers 11 and 13. Part of the insulating layer 21 serves as a first gate insulating layer. Part of the insulating layer 22 serves as a second gate insulating layer.

As illustrated in FIG. 1C, the conductive layer 13 is electrically connected to the conductive layer 11 through an opening provided in the insulating layers 21 and 22. Thus, the conductive layers 11 and 13 are supplied with the same potential.

Figure 2A:
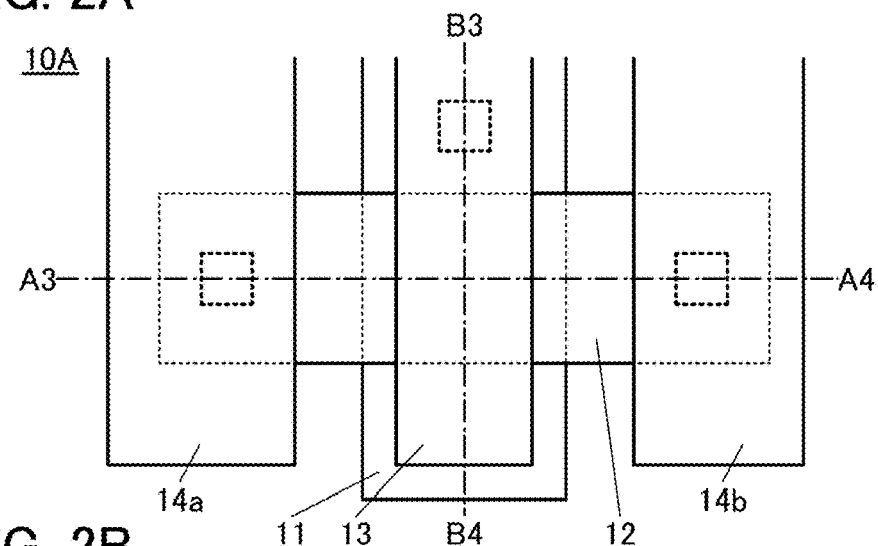
FIGS. 2A to 2C are a top view and cross-sectional views illustrating a semiconductor device.
Figure 2B:
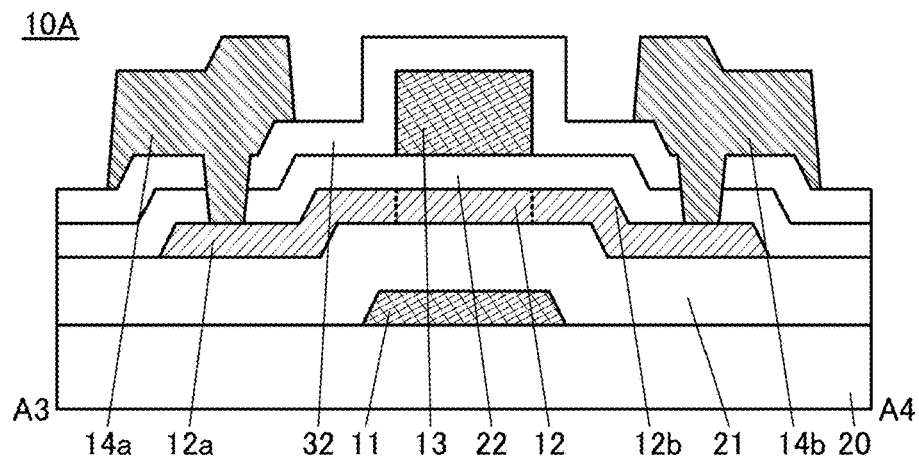
Figure 2C:
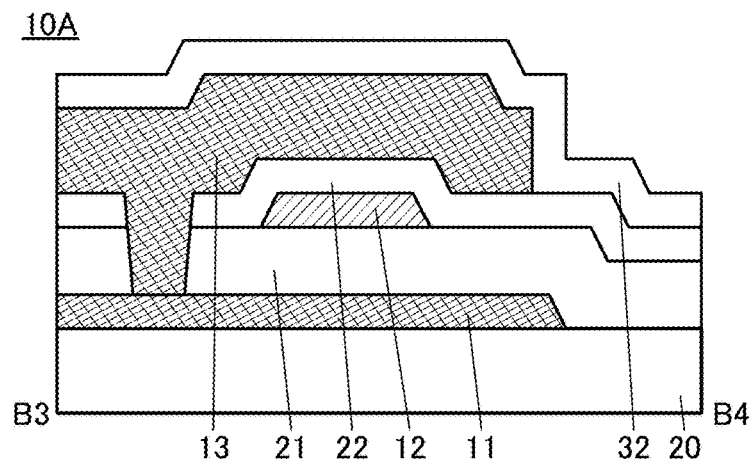

FIGS. 2A to 2C show a structure of a transistor 10A which is partly different from the transistor 10 shown in FIGS. 1A to 1C. The transistor illustrated in FIGS. 2A to 2C is different from the transistor 10 in FIGS. 1A to 1C in that the insulating layer 22 covers an end portion of the semiconductor layer 12, the region 12a, the region 12b, and the like and in that the insulating layer 31 is not included.

[Another Example of Transistor Structure]

Here, a structural example of a transistor that is partly different from the transistors in FIGS. 1A to 1C and FIGS. 2A to 2C illustrated in the above is described below.

Figure 3A:
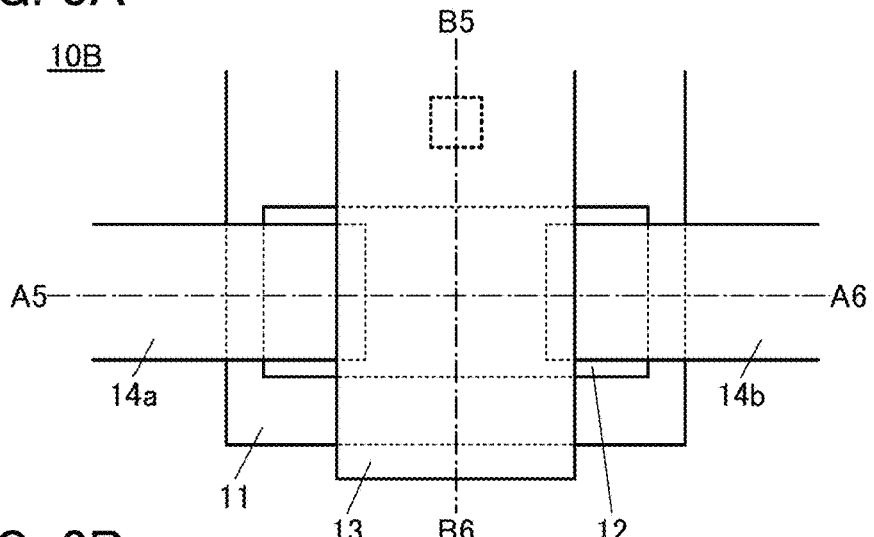
FIGS. 3A to 3C are a top view and cross-sectional views illustrating a semiconductor device.
Figure 3B:
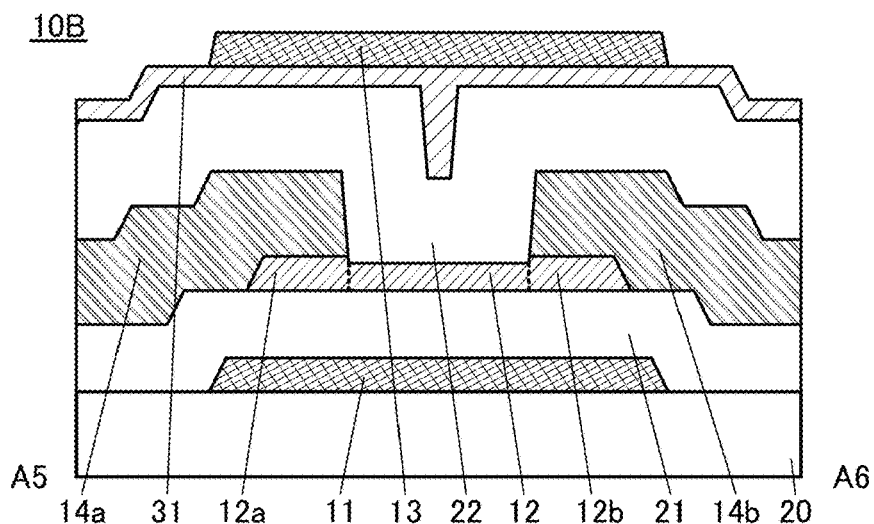
Figure 3C:
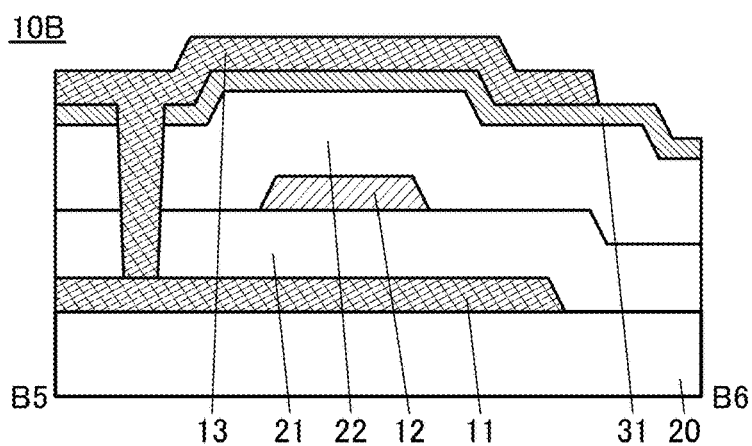

FIG. 3A is a schematic top view of a transistor 10B, and FIGS. 3B and 3C are schematic cross-sectional views of the transistor 10B.

In the transistor 10B, the conductive layer 11 is provided over the substrate 20, and the insulating layer 21 is provided to cover the conductive layer 11. The semiconductor layer 12 is provided over the insulating layer 21, and the conductive layers 14a and 14b are provided in contact with the semiconductor layer 12. The insulating layers 22 and 31 are provided to cover the conductive layers 14a and 14b and the semiconductor layer 12, and the conductive layer 13 is provided over the insulating layer 31. The conductive layer 11 is electrically connected to the conductive layer 13 through an opening provided in the insulating layers 31, 22, and 21

In the transistor 10B, the low-resistance regions 12a and 12b are provided in regions of the semiconductor layer 12 which are in contact with the conductive layer 14a and 14b.

As shown in FIGS. 3A to 3C, in the semiconductor layer 12, the thickness of a region which is not covered with the conductive layers 14a and 14b may be less than that of the other region.

With such a structure, contact portions for contact between the semiconductor layer 12 and the conductive layers 14a and 14b are not necessarily formed as compared to the structures shown in FIGS. 1A to 1C and FIGS. 2A to 2C; thus, the manufacturing process can be simplified and the area occupied by the transistor 10B can be reduced.

The above is the description of the structures of the transistor.

[Sample Fabrication 1]

A manufacturing process of the manufactured transistor is described below. Here, three samples which are different in deposition conditions of oxide semiconductor films used for the semiconductor layer 12 were formed, and the samples are referred to as Sample A1, Sample A2, and Sample A3. The transistor structure of Samples A1, A2 and A3 is the same as that shown in FIGS. 1A to 1C.

First, a glass substrate was prepared as the substrate 20.

{Conductive Layer 11}

As a conductive film, an approximately 10-nm-thick titanium film and an approximately 100-nm-thick copper film were formed over a glass substrate with a sputtering apparatus. Then, the conductive film was processed by a photolithography method.

{Insulating Layer 21}

A stack including four insulating films was formed over the substrate 20 and the conductive layer 11 as the insulating layer 21. The insulating films were formed in succession in a vacuum with a plasma-enhanced chemical deposition (PECVD) apparatus. As the insulating films, an approximately 50-nm-thick silicon nitride film, an approximately 300-nm-thick silicon nitride film, an approximately 50-nm-thick silicon nitride film, and a 50-nm-thick silicon oxynitride film were used and stacked in this order.

{Semiconductor Layer 12}

Next, an oxide semiconductor film was formed over the insulating layer 21 and was processed into an island shape, whereby the semiconductor layer 12 was formed. The thickness of the oxide semiconductor film was approximately 40 nm.

The oxide semiconductor film which is used in Sample A1 was formed under the following conditions: the substrate temperature was 170° C.; an argon gas with a flow rate of 140 sccm and an oxygen gas with a flow rate of 60 sccm were introduced into a chamber of the sputtering apparatus; the pressure was set to 0.6 Pa; and an AC power of 2.5 kW was applied to a metal oxide target containing indium, gallium, and zinc (In:Ga:Zn=4:2:4.1 [atomic ratio]). The proportion of gas flow rate may be represented by an oxygen flow rate percentage which indicates the oxygen flow rate with respect to the total gas flow rate. The oxygen flow rate percentage at this time was 30%.

The oxide semiconductor film used for Sample A2 was formed under the following conditions: the substrate temperature was 130° C.; an argon gas with a flow rate of 180 sccm and an oxygen gas with a flow rate of 20 sccm were introduced into a chamber of the sputtering apparatus; the pressure was set to 0.6 Pa; and an AC power of 2.5 kw was applied to a metal oxide target containing indium, gallium, and zinc (with an atomic ration of In:Ga:Zn=4:2:4.1). The oxygen flow rate at this time was 10%.

The oxide semiconductor film used for Sample A3 was formed under the following conditions: the substrate was not heated (the substrate was at approximately 25° C.); an argon gas with a flow rate of 180 sccm and an oxygen gas with a flow rate of 20 sccm were introduced into a chamber of the sputtering apparatus; the pressure was set to 0.6 Pa; and an AC power of 2.5 kw was applied to a metal oxide target containing indium, gallium, and zinc (with an atomic ration of In:Ga:Zn=4:2:4.1). The oxygen flow rate at this time was 10%.

{Insulating Layer 22 and Conductive Layer 13}

Next, an insulating film was formed over the insulating layer 21 and the semiconductor layer 12. As the insulating film, an approximately 150-nm-thick silicon oxynitride film was formed with a PECVD apparatus. The insulating film later serves as the insulating layer 22.

Next, heat treatment was performed. The heat treatment was performed at 350° C. for one hour in a mixed gas atmosphere of nitrogen and oxygen.

Openings were formed in desired regions of the insulating film by a photolithography method. As a method for etching the insulating film, a dry etching method was used.

Then, a conductive film was formed over the insulating film to cover the opening and the conductive film was processed into an island shape, whereby the conductive layer 13 was formed. In addition, the insulating film in contact with the bottom surface of the conductive film was processed in succession after the formation of the conductive film, whereby the insulating layer 22 was formed.

For the conductive film, an approximately 10-nm-thick oxide semiconductor film, an approximately 50-nm-thick titanium nitride film, and an approximately 100-nm-thick copper film were formed in this order. Note that the oxide semiconductor film was formed under the following conditions: the substrate temperature was 170° C.; an oxygen gas with a flow rate of 200 sccm was introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=4:2:4.1). The oxygen flow rate percentage at this time was 100%. The titanium nitride film and the copper film were formed with a sputtering apparatus.

Next, plasma treatment was performed from above the oxide semiconductor film, the insulating film, and the conductive film. The plasma treatment was performed with a PECVD apparatus at a substrate temperature 220° C. in a mixed gas atmosphere containing an argon gas and a nitrogen gas.

{Insulating Layer 31 and Insulating Layer 32}

A stack including insulating films was formed over the semiconductor layer 12, the insulating layer 22, and the conductive layer 13. The insulating film was formed by stacking an approximately 100-nm-thick silicon nitride film and an approximately 300-nm-thick silicon oxynitride film with a PECVD apparatus.

Here, a silicon nitride film was formed in contact with exposed regions of the semiconductor layer 12. Thus, low resistance regions (the regions 12a and 12b) were formed in the semiconductor layer 12 which is not covered with the conductive layer 13.

Then, a mask was formed over the formed insulating film and an opening was formed in the insulating film with use of the mask, whereby the insulating layers 31 and 32 were formed.

{Conductive Layer 14a and Conductive Layer 14b}

A conductive film was formed to fill the openings and was processed into island shapes, whereby the conductive layers 14a and 14b were formed. For the conductive films, an approximately 10-nm-thick titanium film and an approximately 100-nm-thick copper film were formed with a sputtering apparatus.

After that, an insulating film (not illustrated) was formed over the insulating layer 32, the conductive layer 14a, and the conductive layer 14b. An approximately 1.5-μm-thick acrylic-based photosensitive resin was used for the insulating film.

In the above manner, Samples A1, A2, and A3 were obtained.

[Sample Fabrication 2]

Then, a manufacturing process of a transistor different from the transistors described above is described below. Here, the case where polycrystalline silicon is used for a semiconductor film used for the semiconductor layer 12 is described. Here, an n-channel transistor and a p-channel transistor were formed, and the samples were referred to as Samples B1 and B2. The transistor structure of Samples B1 and B2 is the same as that in FIGS. 2A to 2C.

First, a glass substrate was prepared as the substrate 20.

{Conductive Layer 11}

An approximately 30-nm-thick tungsten film was formed over a glass substrate as a conductive film with a sputtering apparatus. Then, the conductive film was processed by a photolithography method to form the conductive layer 11.

{Insulating Layer 21}

A stack including two insulating films was formed over the substrate 20 and the conductive layer 11 as the insulating layer 21. The insulating films were formed in succession in a vacuum with a PECVD apparatus. As the insulating films, an approximately 140-nm-thick silicon nitride oxide film and an approximately 100-nm-thick silicon oxynitride film were stacked in this order.

{Semiconductor Layer 12}

First, an approximately 50-nm-thick amorphous silicon film was formed by a PECVD method.

Next, a catalyst was added to the amorphous silicon film. Here, a nickel acetate solution containing nickel of approximately 5 ppm by weight was applied by a spinner. Then, heat treatment was performed at 650° C. for 6 minutes with a rapid thermal annealing (RTA) apparatus.

Next, the amorphous silicon film was irradiated with laser light, whereby a polycrystalline silicon film was obtained. As a light source of laser light, an excimer laser was used.

Next, treatment of removing the above catalyst (also referred to as gettering treatment) was performed. First, an approximately 30-nm-thick amorphous silicon film was formed over the polycrystalline silicon film by a sputtering method. Then, heat treatment was performed at 650° C. for 6 minutes with an RTA apparatus, and the amorphous silicon film was removed by a wet etching method.

Next, an impurity was doped to the polycrystalline silicon film with an ion doping apparatus. In the doping treatment, boron was used, and the dosage and the acceleration voltage were set at $1\times10^{12}$ cm$^{-2}$ and approximately 15 kV, respectively.

Next, the polycrystalline silicon film was processed into an island shape by a photolithography method to form the semiconductor layer 12.

{Insulating Layer 22 and Conductive Layer 13}

Next, an insulating film was formed over the insulating layer 21 and the semiconductor layer 12. As the insulating film, an approximately 110-nm-thick silicon oxynitride film was formed by a PECVD method. The insulating film later serves as the insulating layer 22.

Next, openings were formed in desired regions of the insulating film by a photolithography method. As a method for etching the insulating film, a dry etching method was used.

Then, a conductive film was formed over the insulating film and in the opening, and the conductive film was processed into an island shape, whereby the conductive layer 13 was formed.

As a conductive film, an approximately 30-nm-thick tantalum nitride film and an approximately 370-nm-thick tungsten film were formed in this order by a sputtering method.

Next, an impurity was doped to the regions of the polycrystalline silicon film not covered with the conductive layer 13, whereby low-resistance regions (the regions 12a and 12b) were formed.

In Sample B1 including an n-channel transistor, phosphorus was used as an impurity element imparting n-type conductivity. In the doping treatment, the dosage was $2\times10^{15}$ cm$^2$ and the acceleration voltage was approximately 60 kV.

In Sample B2 including a p-channel transistor, phosphorous was used as an impurity element imparting p-type conductivity. In the doping treatment, the dosage was $2.5\times10^{15}$ cm$^{-2}$ and the acceleration voltage was approximately 70 kV.

{Insulating Layer 31}

Next, a stack including insulating films was formed over the insulating layer 22 and the conductive layer 13. The insulating films were formed by stacking an approximately 50-nm-thick silicon oxynitride film, an approximately 140-nm-thick silicon nitride oxide film, and an approximately 520-nm-thick silicon oxynitride film with a PECVD apparatus.

After that, heat treatment was performed. The heat treatment was performed at 410° C. in an atmosphere containing nitrogen for one hour.

Then, a mask was formed over the insulating films and openings were formed in the insulating film with use of the mask, whereby the insulating layer 31 was formed.

{Conductive Layer 14a and Conductive Layer 14b}

A conductive film was formed to fill the openings and was processed into island shapes, whereby the conductive layers 14a and 14b were formed. For the conductive films, an approximately 100-nm-thick titanium film, an approximately 700-nm-thick aluminum film, and an approximately 100-nm-thick titanium film were formed with a sputtering apparatus.

After that, an insulating film (not illustrated) was formed over the insulating layer 31, the conductive layer 14a, and the conductive layer 14b. A 2-µm-thick acrylic-based photosensitive resin was used for the insulating film.

Sample B1 and Sample B2 were prepared in the above manner.

[Transistor Characteristics]

$I_d$-$V_g$ characteristics of the transistors included in the fabricated samples A1, A2, A3, B1, and B2 were measured. The field-effect mobility was calculated from the characteristics.

As conditions for measuring the $I_d$-$V_g$ characteristics of each transistor, a voltage applied to a conductive film functioning as the first gate electrode of each transistor (hereinafter the voltage is also referred to as gate voltage ($V_g$)) and a voltage applied to the conductive film functioning as the second gate electrode of each transistor (hereinafter the voltage is also referred to as back gate voltage ($V_{bg}$)) changed from −10 V to +10 V in increments of 0.25 V. A voltage applied to a conductive film functioning as a source electrode (hereinafter the voltage is also referred to as source voltage ($V_s$)) was 0 V (comm), and a voltage applied to a conductive film functioning as a drain electrode (hereinafter the voltage is also referred to as drain voltage ($V_d$)) was 10 V.

The field-effect mobility $\mu_{FE}$ was calculated from the following formula (1). In the formula (1), L represents the channel length and W represents the channel width. $C_{ox}$ is the gate capacitance, which is represented by the product of the thickness of the gate insulating film and relative permittivity. Here, the thickness of the gate insulating films of Samples A1, A2, and A3 was 150 nm, and the thickness of the gate insulating films of Samples B1 and B2 was 110 nm. The relative permittivity of each of the samples was 4.0.

[Formula 1]

$$\mu_{FE} = \frac{\Delta Id}{\Delta Vg} \cdot \frac{L}{W C_{ox} VD} \quad (1)$$

In each of Samples A1, A2, and A3, a transistor having a channel length L of approximately 2 µm and a channel length W of approximately 3 µm was measured. In each of Samples B1 and B2, a transistor having a channel length L of 50 µm and the channel width W of 3 µm was measured.

Transistors were measured under the conditions where the substrate temperatures were a room temperature (25° C.), 40° C., 60° C., 80° C., 100° C., and 120° C.

Figure 4A:
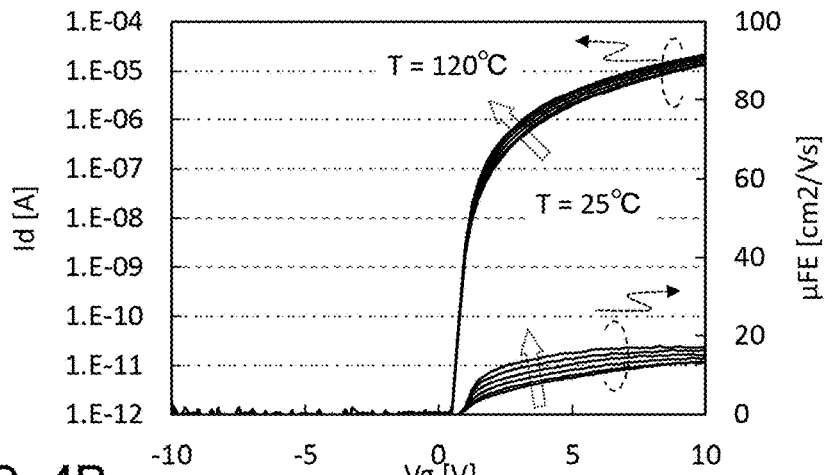
FIGS. 4A to 4C each show electrical characteristics of transistors.
Figure 4B:
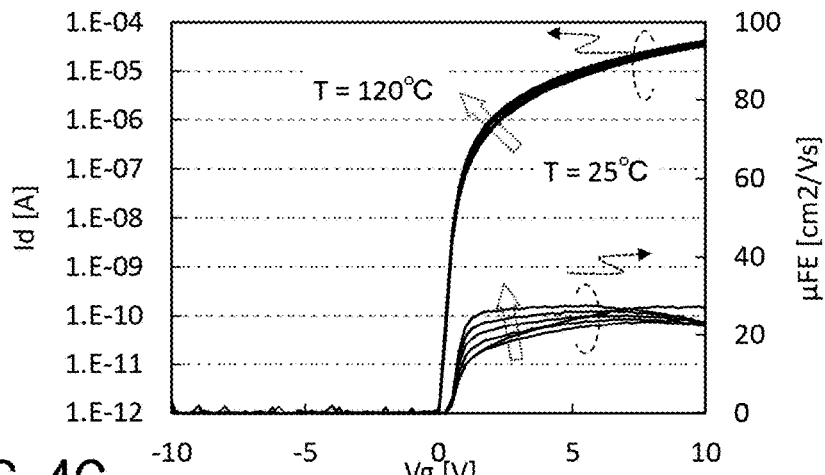
Figure 4C:
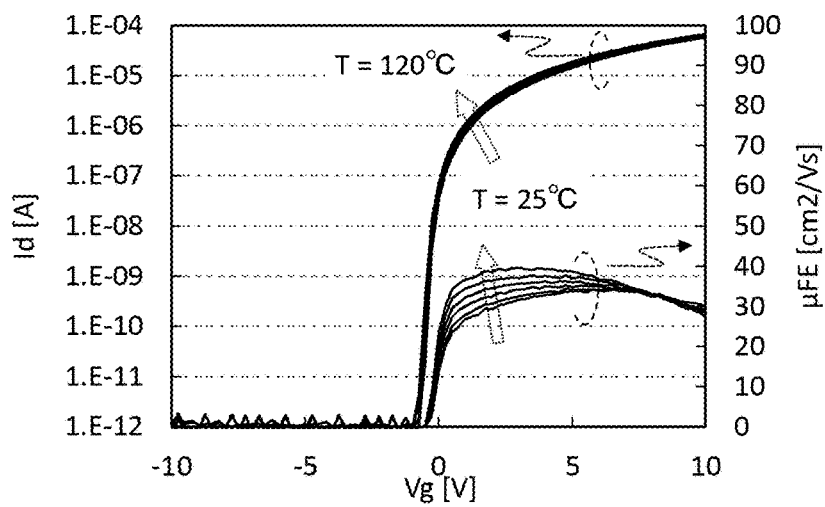

FIGS. 4A to 4C show $I_d$-$V_g$ characteristics of Samples A1, A2, and A3, respectively, each including an oxide semiconductor in a semiconductor layer. FIGS. 4A to 4C each show superimposed $I_d$-$V_g$ characteristics of six transistors measured at the above temperatures and superimposed field-effect mobilities thereof. In FIGS. 4A to 4C, the first vertical axis indicates $I_d$ [A], the second vertical axis indicates field-effect mobility [$\mu_{FE}$: cm$^2$/V$_s$], and the horizontal axis indicates $V_g$ [V]. Although the measurement values at the above temperatures are not explicitly distinguished, an arrow of a dashed line pointing from a low temperature condition (25° C.) to a high temperature condition (120° C.) is shown in FIGS. 4A to 4C.

When attention is focused on $I_d$, FIG. 4A indicates that $I_d$ in an on region (e.g., a region where $V_g$ is higher than or equal to 1 V) increases as the substrate temperature increases. On the other hand, $I_d$ in an off region (e.g., a region where $V_g$ is lower than or equal to 0 V) remains lower than or equal to the detection limit (here, $1\times10^{-12}$ [A]) even in the conditions where the substrate temperature is high.

When attention is focused on field-effect mobility, it is improved as the substrate temperature increases. It is also found that the inclination of the curve of a region where $V_g$ is low gets larger (also referred to as a steep rise) as the temperature increases.

The on-state current and the field-effect mobility of Samples A1, A2, and A3 are high in the following order: Sample A3, Sample A2, and Sample A1. That is, the on-state current and the field-effect mobility increase as the deposition temperature of the oxide semiconductor film decreases. This shows that a higher on-state current can be obtained as the crystallinity of the oxide semiconductor film gets lower.

When attention is focused on the field-effect mobility, the inclination of the curve of the region where $V_g$ is low is large in the following order: Sample A3, Sample A2, and Sample A1. That is, high on-state current (I$_d$) can be obtained at lower V$_g$ as the deposition temperature of the oxide semiconductor film decreases.

In Samples A1, A2, and A3, in a region where V$_g$ is high, the field-effect mobility is saturated or decreases as V$_g$ increases. In particular, the tendency is more noticeable as the substrate temperature at the measurement increases and the deposition temperature of the oxide semiconductor decreases.

In each of Samples A1, A2, and A3, the I$_d$-V$_g$ characteristics hardly shift as the temperature increases, the rising voltages are substantially the same.

Figure 5A:
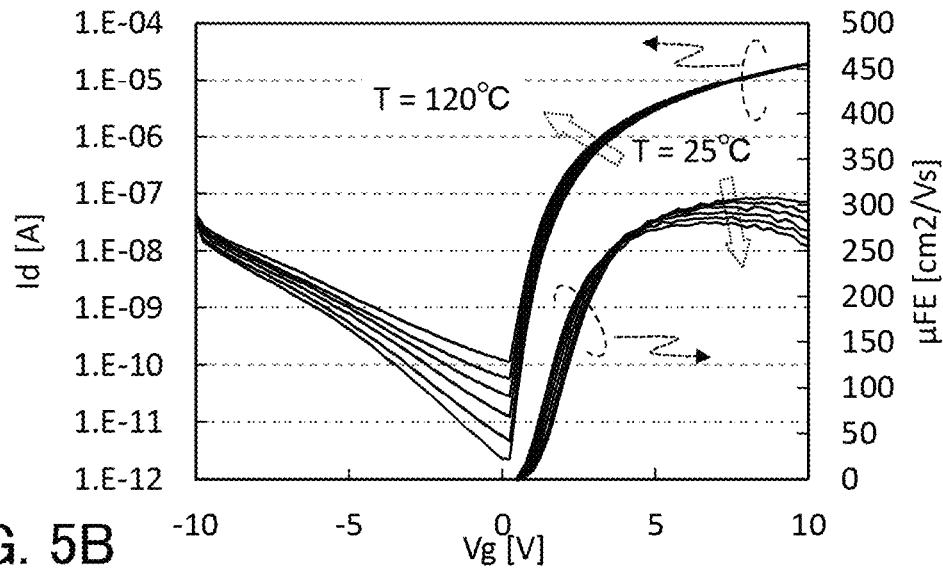
FIGS. 5A and 5B each show electrical characteristics of transistors.
Figure 5B:
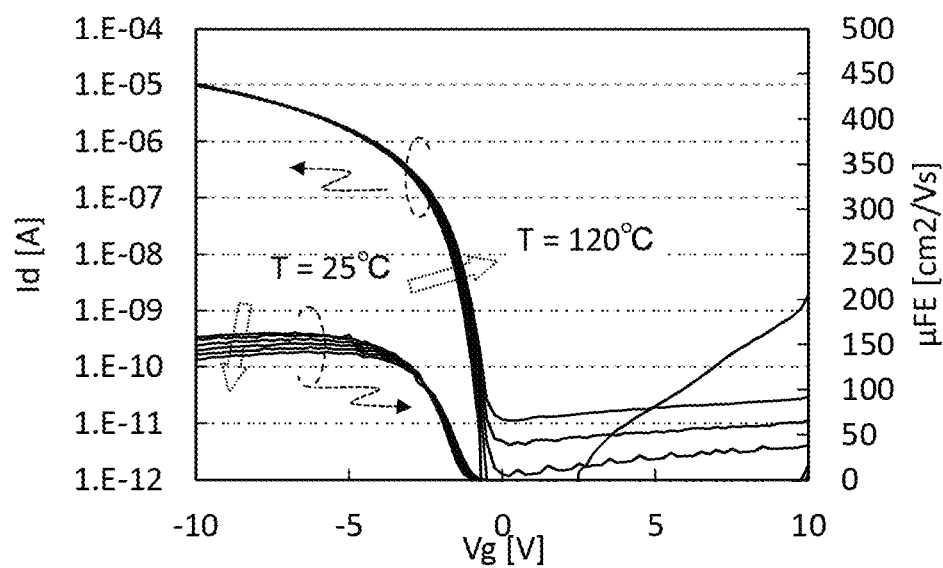

Next, FIGS. 5A and 5B show the I$_d$-V$_g$ characteristics and field effect mobility of Samples B1 and B2, respectively, each including polycrystalline silicon in a semiconductor layer.

In FIG. 5A, when attention is focused on I$_d$-V$_g$ characteristics, the I$_d$-V$_g$ curve shifts in the negative direction of V$_g$ (off region side) as the substrate temperature increases. That is, the threshold voltage shifts in the negative direction as the temperature increases. It can also be seen that I$_d$ in an off region (e.g., a region where V$_g$ is lower than or equal to 0 V) increases as the substrate temperature increases.

When attention is focused on the field-effect mobility, though the field effect mobility seems to increase as the substrate temperature increases in a region where V$_g$ is low (e.g., a region where V$_g$ is lower than or equal to 4 V), this is caused by the shift of the threshold voltage in the negative direction. Actually, the field-effect mobilities are approximately the same or slightly decrease. When V$_g$ is higher than 4 V, the field-effect mobility tends to decrease rapidly at high substrate temperatures.

As shown in FIG. 5B, Sample B2 has a similar tendency to that of Sample B1. In other words, Sample B2 and Sample B1 are common in that, as the substrate temperature increases, the I$_d$-V$_g$ curve shifts to the off region side (the positive direction), I$_d$ in an off region increases, and the field effect mobility at high V$_g$ decreases.

According to these results, the field-effect mobility and the on-state current of the transistor including polycrystalline silicon decrease as the operating temperature increases, and this tendency is particularly noticeable at a high V$_g$, and the I$_d$-V$_g$ curve tends to shift in an off side.

In contrast, it can be found that the on-state current of the transistor including an oxide semiconductor tends to increase as the operating temperature increases, and the increase in field-effect mobility and the on-state current at a low V$_g$ is significant.

Specifically, in each of Samples A1, A2, and A3, there is a range of a gate voltage (V$_g$) where the field-effect mobility increases as the temperature increases within a range of the gate voltage from 0 V to 10 V. At least in a temperature range from a room temperature (25° C.) to 120° C., there is a range of a gate voltage where the field-effect mobility increases continuously as the temperature increases. Furthermore, at least in a temperature range of 25° C. to 120° C., there is a range of a gate voltage where the field-effect mobility is greater than or equal to 10 cm$^2$/V$_s$ within a range from 2 V to 10 V.

As described above, in the transistor including an oxide semiconductor of one embodiment of the present invention, the field-effect mobility, especially at low V$_g$, is high even when the temperature in a usage environment is high. Thus, for example, in the case where a wiring or an element is charged or discharged through the transistor, a defect such as extension of charge and discharge time due to the increase in the temperature is not caused.

In general, when the channel length is less than 6 μm, a transistor including silicon, especially a transistor including polycrystalline silicon, has difficulty in obtaining characteristics sufficiently reliable to mass-production because of a problem in characteristics such as difficulty in reducing variation due to the existence of a grain boundary or decrease in on/off ratio due to the short channel length and a problem of reliability such as significant hot-carrier degradation. Therefore, in order to obtain a high on-state current, the channel length L is difficult to be reduced and the channel width W is increased, so that the area occupied by the transistor is increased.

On the other hand, as shown in FIGS. 4A to 4C, in the transistor including an oxide semiconductor, favorable characteristics with less variation can be obtained even with an extremely small channel length of less than or equal to 2 μm. Thus, the channel length can be reduced, whereby both reduction in area occupied by the transistor and a high on-state current can be achieved. In particular, small shift in characteristics due to temperature, a low off-state current, and the like are significant characteristics which cannot be obtained by a transistor including silicon, especially polycrystalline silicon.

In the transistor including an oxide semiconductor of one embodiment of the present invention, the field-effect mobility and the on-state current hardly decrease at high temperatures. Therefore, the transistor can be suitably used in a display device such as a liquid crystal display device or an organic EL display device. In particular, the transistor is suitable for use in a wide operating temperature range to be expected, such as vehicles or aircrafts.

[Field-Effect Mobility]

The difference in temperature dependence of field-effect mobility due to the difference in materials of a semiconductor is considered below.

Mobility is an indicator of the ease of movement of carriers (electrons or holes) in a substance. When an electric field E is applied to a substance and carriers move at an average speed v, the mobility is expressed by a proportionality coefficient μ. The relationship between the average speed v and the electric field E is represented by the following Formula 2.

[Formula 2]

$$v = \mu E \qquad (2)$$

When carriers move in a substance, the movement speed is limited due to various scattering factors; thus, the mobility μ is a value influenced by the scattering factors. It is known that, in the case where there are a plurality of mechanisms by which carriers moving in the substance are scattered, the inverse of the actual mobility μ is expressed by summing up the inverses of mobilities (denoted by $\mu_1$, $\mu_2$, $\mu_3$, and the like) which are influenced by respective scattering factors as shown in Formula 3 (Matthiessen's rule).

[Formula 3]

$$\frac{1}{\mu} = \frac{1}{\mu_1} + \frac{1}{\mu_2} + \frac{1}{\mu_3} + \ldots \qquad (3)$$

Although there are various scattering factors of carriers in a substance, here, the description is made focusing on impurity scattering (coulomb scattering) and lattice scattering (phonon scattering), which are typical scattering factors.

In the case where impurities exist in the substance, carriers are scattered due to potentials of impurities, whereby the speed is limited. This is referred to as impurity scattering or coulomb scattering in some cases. As shown in Formula 4, the mobility affected by coulomb scattering is inversely proportional to the density Ni of ionized impurities and proportional to the 3/2-th power of the temperature T.

[Formula 4]

$$\mu_i \propto \frac{1}{Ni} \cdot T^{3/2} \quad (4)$$

The carriers are scattered by lattice vibration (phonon) in a substance, whereby the speed is limited. This is referred to as lattice scattering or phonon scattering in some cases. The phonon scattering is commonly researched using a single crystal as a model. As shown in Formula 5, the mobility influenced by phonon scattering is proportional to the −3/2-th power of the temperature T.

[Formula 5]

$$\mu_1 \propto T^{-3/2} \quad (5)$$

Here, the field-effect mobility $\mu_{FE}$ of the field-effect transistor can be regarded as the mobility of carriers induced by an electric field of a gate voltage. The number of induced carriers, i.e., the carrier density depends on the intensity of the electric field.

The temperature dependence of the field-effect mobility $\mu_{FE}$ of a transistor is determined by whether phonon scattering or coulomb scattering is more dominant.

As shown in FIGS. 5A and 5B, in the case where polycrystalline silicon is used for a semiconductor layer, although change in threshold voltage (a shift to the off region side) is observed at high temperatures in a range where $V_g$ is low, i.e., the range where carrier density is low, the field-effect mobility does not change or slightly decreases. This indicates that, in a range where carrier density is low, the effect of phonon scattering is small and coulomb scattering is relatively more dominant.

However, the field-effect mobility decreases as the temperature increases when $V_g$ and the carrier density increases. That is, in a range where the carrier density is high, phonon scattering is more dominant than coulomb scattering. In addition, as $V_g$ increases, the difference in the field-effect mobility due to the difference between temperatures tends to be large (diverge). That is, as the temperature or $V_g$ increases, the field-effect mobility tends to decrease.

In contrast, as shown in FIG. 4A, in the case where an oxide semiconductor is used for a semiconductor layer, the field-effect mobility increases as the temperature increases, regardless of $V_g$. This indicates that coulomb scattering is more dominant than phonon scattering regardless of carrier density.

FIGS. 4B and 4C show that the field-effect mobility gets lower as the crystallinity is lower in a region where $V_g$ is high. However, this tendency is different from that in the case of using polycrystalline silicon shown in FIG. 5A. Specifically, the difference between the field-effect mobilities at the temperatures gets smaller as $V_g$ increases, and the mobilities tend to converge. That is, in the transistor including an oxide semiconductor, a scattering factor other than coulomb scattering or phonon scattering is likely to exist as a dominant scattering factor. As a scattering factor other than coulomb scattering and phonon scattering, interface scattering at the interface between the semiconductor layer and the insulating layer in contact with the semiconductor layer, a scattering factor derived from cation disorder, and the like can be given.

Thus, in the case of using polycrystalline silicon, the field-effect mobility is likely to decrease as the temperature increases because phonon scattering is dominant particularly in a region where $V_g$ is high.

In contrast, in the case of using an oxide semiconductor, the effect of phonon scattering is small and coulomb scattering is dominant; thus, the field-effect mobility probably increases as the temperature increases. Furthermore, in the case of using an oxide semiconductor, there may be another dominant scattering factor and the effect of the scattering factor may vary depending on the crystallinity.

The above is a consideration of the temperature dependence of the field-effect mobility.

At least part of this embodiment can be implemented in combination with any of the other embodiments and the other examples described in this specification as appropriate.

Embodiment 2

In this embodiment, a transistor that can be used for the semiconductor device of one embodiment of the present invention will be described.

In this embodiment, a top-gate transistor will be described with reference to FIGS. 6A to 6C, FIGS. 7A to 7C, FIGS. 8A and 8B, FIGS. 9A and 9B, FIGS. 10A and 10B, FIGS. 11A and 11B, FIGS. 12A and 12B, FIGS. 13A and 13B, FIGS. 14A and 14B, FIGS. 15A and 15B, and FIGS. 16A and 16B.

STRUCTURE EXAMPLE 1 OF TRANSISTOR

Figure 6A:
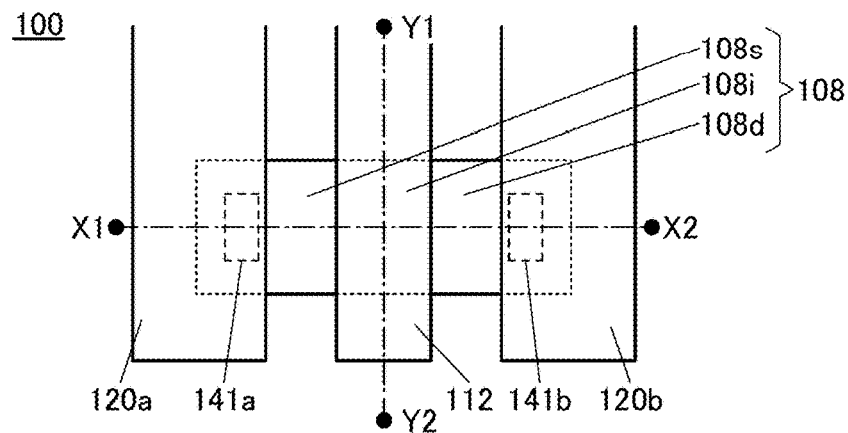
FIGS. 6A to 6C are a top view and cross-sectional views illustrating a semiconductor device.
Figure 6B:
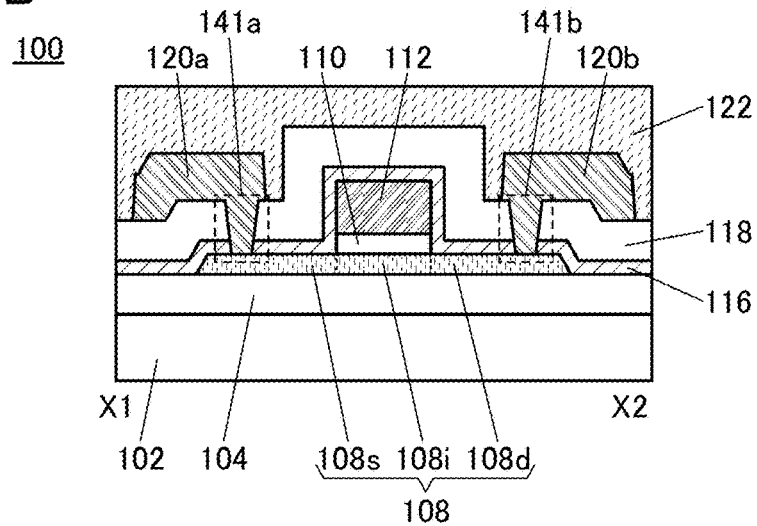
Figure 6C:
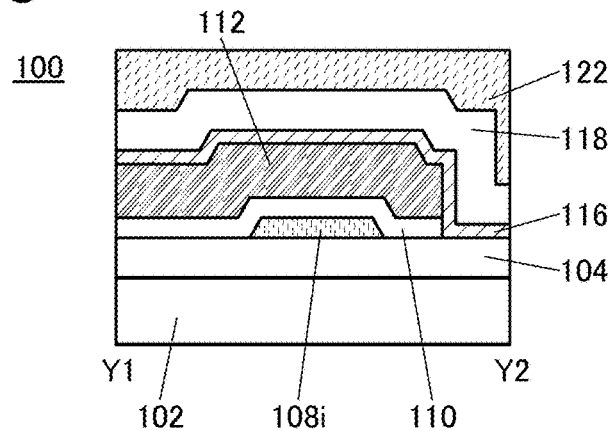

FIG. 6A is a top view of a transistor 100. FIG. 6B is a cross-sectional view taken along the dashed-dotted line X1-X2 in FIG. 6A. FIG. 6C is a cross-sectional view taken along the dashed-dotted line Y1-Y2 in FIG. 6A. For clarity, some components such as an insulating film 110 are not illustrated in FIG. 6A. As in FIG. 6A, some components are not illustrated in some cases in top views of transistors described below. In addition, the direction of the dashed-dotted line X1-X2 may be referred to as the channel length (L) direction, and the direction of the dashed-dotted line Y1-Y2 may be referred to as the channel width (W) direction.

The transistor 100 illustrated in FIGS. 6A to 6C includes an insulating film 104 over a substrate 102, an oxide semiconductor film 108 over the insulating film 104, the insulating film 110 over the oxide semiconductor film 108, a conductive film 112 over the insulating film 110, and an insulating film 116 over the insulating film 104, the oxide semiconductor film 108, and the conductive film 112. The oxide semiconductor film 108 includes a channel region 108i overlapping with the conductive film 112, a source region 108s in contact with the insulating film 116, and a drain region 108d in contact with the insulating film 116.

The insulating film 116 contains nitrogen or hydrogen. The insulating film 116 is in contact with the source region 108s and the drain region 108d, so that nitrogen or hydrogen that is contained in the insulating film 116 is added to the source region 108s and the drain region 108d. The source region 108s and the drain region 108d each have a high carrier density when nitrogen or hydrogen is added thereto.

The transistor 100 may further include an insulating film 118 over the insulating film 116, a conductive film 120a electrically connected to the source region 108s through an opening 141a provided in the insulating films 116 and 118, and a conductive film 120b electrically connected to the drain region 108d through an opening 141b provided in the insulating films 116 and 118.

The transistor 100 may include an insulating film 122 over the conductive films 120a and 120b and the insulating film 118.

The insulating film 122 has a function of covering unevenness and the like caused by the transistor or the like. The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

In this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive film 112 functions as a gate electrode. The conductive film 120a and the conductive film 120b function as a source electrode and a drain electrode, respectively.

The insulating film 110 functions as a gate insulating film. The insulating film 110 includes an excess oxygen region. Since the insulating film 110 includes the excess oxygen region, excess oxygen can be supplied to the channel region 108i included in the oxide semiconductor film 108. As a result, oxygen vacancies that might be formed in the channel region 108i can be filled with excess oxygen, which can provide a highly reliable semiconductor device.

To supply excess oxygen to the oxide semiconductor film 108, excess oxygen may be supplied to the insulating film 104 that is formed under the oxide semiconductor film 108. In that case, excess oxygen contained in the insulating film 104 might also be supplied to the source region 108s and the drain region 108d included in the oxide semiconductor film 108. When excess oxygen is supplied to the source region 108s and the drain region 108d, the resistance of the source region 108s and the drain region 108d might be increased.

In contrast, in the structure in which the insulating film 110 formed over the oxide semiconductor film 108 contains excess oxygen, excess oxygen can be selectively supplied only to the channel region 108i. Alternatively, the carrier density of the source and drain regions 108s and 108d can be selectively increased after excess oxygen is supplied to the channel region 108i and the source and drain regions 108s and 108d, in which case an increase in the resistance of the source and drain regions 108s and 108d can be prevented.

Furthermore, each of the source region 108s and the drain region 108d included in the oxide semiconductor film 108 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element include helium, neon, argon, krypton, and xenon. The element that forms an oxygen vacancy is diffused from the insulating film 116 to the source region 108s and the drain region 108d in the case where the insulating film 116 contains one or more such elements. In addition or alternatively, the element that forms an oxygen vacancy is added to the source region 108s and the drain region 108d by impurity addition treatment.

An impurity element added to the oxide semiconductor film cuts a bond between a metal element and oxygen in the oxide semiconductor film, so that an oxygen vacancy is formed. Alternatively, when an impurity element is added to the oxide semiconductor film, oxygen bonded to a metal element in the oxide semiconductor film is bonded to the impurity element and detached from the metal element, so that an oxygen vacancy is formed. As a result, the oxide semiconductor film has a higher carrier density, and thus, the conductivity thereof becomes higher.

Next, details of the components of the semiconductor device in FIGS. 6A to 6C will be described.

[Substrate]

The substrate 102 can be formed using a material having heat resistance high enough to withstand heat treatment in the manufacturing process.

Specifically, non-alkali glass, soda-lime glass, potash glass, crystal glass, quartz, sapphire, or the like can be used. Alternatively, an inorganic insulating film may be used. Examples of the inorganic insulating film include a silicon oxide film, a silicon nitride film, a silicon oxynitride film, and an aluminum oxide film.

The non-alkali glass may have a thickness of greater than or equal to 0.2 mm and less than or equal to 0.7 mm, for example. The non-alkali glass may be polished to obtain the above thickness.

As the non-alkali glass, a large-area glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, as the substrate 102, a single-crystal semiconductor substrate or a polycrystalline semiconductor substrate made of silicon or silicon carbide, a compound semiconductor substrate made of silicon germanium or the like, an SOI substrate, or the like may be used.

For the substrate 102, an inorganic material such as a metal may be used. Examples of the inorganic material such as a metal include stainless steel and aluminum.

Alternatively, for the substrate 102, an organic material such as a resin, a resin film, or plastic may be used. Examples of the resin film include polyester, polyolefin, polyamide (e.g., nylon or aramid), polyimide, polycarbonate, polyurethane, an acrylic resin, an epoxy resin, polyethylene terephthalate (PET), polyethylene naphthalate (PEN), polyether sulfone (PES), and a resin having a siloxane bond.

For the substrate 102, a composite material of an inorganic material and an organic material may be used. Examples of the composite material include a resin film to which a metal plate or a thin glass plate is bonded, a resin film into which a fibrous or particulate metal or a fibrous or particulate glass is dispersed, and an inorganic material into which a fibrous or particulate resin is dispersed.

The substrate 102 can at least support films or layers formed thereover or thereunder and may be one or more of an insulating film, a semiconductor film, and a conductive film.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure of an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the channel region 108i of the oxide semiconductor film 108 can be reduced.

For example, the insulating film 104 can be formed to have a single-layer structure or stacked-layer structure of a silicon oxide film, a silicon oxynitride film, a silicon nitride oxide film, a silicon nitride film, an aluminum oxide film, a hafnium oxide film, a gallium oxide film, a Ga—Zn oxide film, or the like. In this embodiment, the insulating film 104 has a stacked-layer structure of a silicon nitride film and a silicon oxynitride film. With the insulating film 104 having such a layered structure including a silicon nitride film as a lower layer and a silicon oxynitride film as an upper layer, oxygen can be efficiently introduced into the oxide semiconductor film 108.

[Oxide Semiconductor Film]

As the oxide semiconductor film 108, the oxide semiconductor film described in Embodiment 1 can be used.

It is suitable to form the oxide semiconductor film 108 by a sputtering method because the film density can be high. In the case where the oxide semiconductor film 108 is formed by a sputtering method, a rare gas (argon, as a typical example), oxygen, or a mixed gas of a rare gas and oxygen is used as a sputtering gas, as appropriate. In addition, increasing the purity of a sputtering gas is necessary. For example, as an oxygen gas or an argon gas used for a sputtering gas, a gas that is highly purified to have a dew point of $-60°$ C. or lower, preferably $-100°$ C. or lower, is used, whereby entry of moisture or the like into the oxide semiconductor film 108 can be minimized.

In the case where the oxide semiconductor film 108 is formed by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film 108, as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa.

[Second Insulating Film]

The insulating film 110 functions as a gate insulating film of the transistor 100. In addition, the insulating film 110 has a function of supplying oxygen to the oxide semiconductor film 108, particularly to the channel region 108i. The insulating film 110 can be formed to have a single-layer structure or a stacked-layer structure of an oxide insulating film or a nitride insulating film, for example. To improve the interface properties with the oxide semiconductor film 108, a region which is in the insulating film 110 and in contact with the oxide semiconductor film 108 is preferably formed using at least an oxide insulating film. For example, a silicon oxide film, a silicon oxynitride film, a silicon nitride oxide film, or a silicon nitride film may be used as the insulating film 110.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3\times10^{17}$ spins/cm$^3$ and preferably lower than or equal to $5\times10^{16}$ spins/cm$^3$ may be used.

In addition to the above-described signal, a signal due to nitrogen dioxide ($NO_2$) might be observed in the insulating film 110. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density of a signal due to nitrogen dioxide ($NO_2$) is higher than or equal to $1\times10^{17}$ spins/cm$^3$ and lower than $1\times10^{18}$ spins/cm$^3$ as the insulating film 110, for example.

Note that a nitrogen oxide ($NO_x$) such as nitrogen dioxide ($NO_2$) forms a state in the insulating film 110. The state is positioned in the energy gap of the oxide semiconductor film 108. Thus, when nitrogen oxide ($NO_x$) is diffused to the interface between the insulating film 110 and the oxide semiconductor film 108, an electron might be trapped by the state on the insulating film 110 side. As a result, the trapped electron remains in the vicinity of the interface between the insulating film 110 and the oxide semiconductor film 108, leading to a positive shift of the threshold voltage of the transistor. Accordingly, the use of a film with a low nitrogen oxide content as the insulating film 110 can reduce a shift of the threshold voltage of the transistor.

As an insulating film that releases a small amount of nitrogen oxide ($NO_x$), for example, a silicon oxynitride film can be used. The silicon oxynitride film releases more ammonia than nitrogen oxide (NO)) in thermal desorption spectroscopy (TDS); the typical released amount of ammonia is greater than or equal to $1\times10^{18}$/cm$^3$ and less than or equal to $5\times10^{19}$/cm$^3$. Note that the released amount of ammonia is the total amount of ammonia released by heat treatment in a range of 50° C. to 650° C. or 50° C. to 550° C. in TDS.

Since nitrogen oxide (NO)) reacts with ammonia and oxygen in heat treatment, the use of an insulating film that releases a large amount of ammonia reduces nitrogen oxide ($NO_x$).

Note that in the case where the insulating film 110 is analyzed by SIMS, nitrogen concentration in the film is preferably lower than or equal to $6\times10^{20}$ atoms/cm$^3$.

The insulating film 110 may be formed using a high-k material such as hafnium silicate ($HfSiO_x$), hafnium silicate containing nitrogen (HfSi$_x$O$_y$N$_z$), hafnium aluminate containing nitrogen (HfAl$_x$O$_y$N$_z$), or hafnium oxide. The use of such a high-k material enables a reduction in gate leakage current of a transistor.

[Third Insulating Film]

The insulating film 116 contains nitrogen or hydrogen. The insulating film 116 may contain fluorine. As the insulating film 116, for example, a nitride insulating film can be used. The nitride insulating film can be formed using silicon nitride, silicon nitride oxide, silicon oxynitride, silicon nitride fluoride, silicon fluoronitride, or the like. The hydrogen concentration in the insulating film 116 is preferably higher than or equal to $1\times10^{22}$ atoms/cm$^3$. Furthermore, the insulating film 116 is in contact with the source region 108s and the drain region 108d of the oxide semiconductor film 108. Thus, the concentration of an impurity (nitrogen or hydrogen) in the source region 108s and the drain region 108d in contact with the insulating film 116 is increased, leading to an increase in the carrier density of the source region 108s and the drain region 108d.

[Fourth Insulating Film]

As the insulating film 118, an oxide insulating film can be used. Alternatively, a layered film of an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Conductive Film]

The conductive films 112, 120a, and 120b can be formed by a sputtering method, a vacuum evaporation method, a pulsed laser deposition (PLD) method, a thermal CVD method, or the like. As each of the conductive films 112, 120a, and 120b, a conductive metal film, a conductive film that has a function of reflecting visible light, or a conductive film having a function of transmitting visible light may be used.

A material containing a metal element selected from aluminum, gold, platinum, silver, copper, chromium, tantalum, titanium, molybdenum, tungsten, nickel, iron, cobalt, palladium, neodymium, scandium, and manganese can be used for the metal film having conductivity. Alternatively, an alloy containing any of the above metal elements may be used. Alternatively, a metal nitride film containing any of the elements as a component (a titanium nitride film, a molybdenum nitride film, or a tungsten nitride film) may be used. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added may be used. Alternatively, an oxide semiconductor whose resistance is reduced may be used. Alternatively, a semiconductor typified by polycrystalline silicon doped with an impurity element such as phosphorus, or a silicide such as nickel silicide may be used.

For the metal film having conductivity, specifically a two-layer structure in which a copper film is stacked over a titanium film, a two-layer structure in which a copper film is stacked over a titanium nitride film, a two-layer structure in which a copper film is stacked over a tantalum nitride film, a three-layer structure in which a titanium film, a copper film, and a titanium film are stacked in this order, or the like may be used. In particular, a conductive film containing a copper element is preferably used because the resistance can be reduced. As an example of the conductive film containing a copper element, an alloy film containing copper and manganese is given. The alloy film is favorable because it can be processed by a wet etching method.

Note that a tantalum nitride film is preferably used for the conductive films 112, 120a, and 120b. A tantalum nitride film has conductivity and a high barrier property against copper or hydrogen. Because a tantalum nitride film releases little hydrogen from itself, it can be favorably used as a metal film in contact with the oxide semiconductor film 108 or a metal film in the vicinity of the oxide semiconductor film 108.

As the conductive film having conductivity, a conductive macromolecule or a conductive polymer may be used.

For the conductive film having a function of reflecting visible light, a material containing a metal element selected from gold, silver, copper, and palladium can be used. In particular, a conductive film containing a silver element is preferably used because reflectance of visible light can be improved.

For the conductive film having a function of transmitting visible light, a material containing an element selected from indium, tin, zinc, gallium, and silicon can be used. Specifically, an In oxide, a Zn oxide, an In—Sn oxide (also referred to as ITO), an In—Sn—Si oxide (also referred to as ITSO), an In—Zn oxide, an In—Ga—Zn oxide, or the like can be used.

As the conductive film having a function of transmitting visible light, a film containing graphene or graphite may be used. The film containing graphene can be formed in the following manner: a film containing graphene oxide is formed and is reduced. As a reducing method, a method with application of heat, a method using a reducing agent, or the like can be employed.

The conductive films 112, 120a, and 120b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

When the conductive film is formed by electroless plating, a diffusion prevention film may be formed under the conductive film to prevent component elements of the conductive film from diffusing outward. A seed layer that can make the conductive film grow may be formed between the diffusion prevention film and the conductive film. The diffusion prevention film can be formed by sputtering, for example. For the diffusion prevention film, a tantalum nitride film or a titanium nitride film can be used, for example. The seed layer can be formed by electroless plating. For the seed layer, a material similar to the material for the conductive film that can be formed by electroless plating can be used.

Note that an oxide semiconductor typified by an In—Ga—Zn oxide may be used for the conductive film 112. The oxide semiconductor can have a high carrier density when nitrogen or hydrogen is supplied from the insulating film 116. In other words, the oxide semiconductor functions as an oxide conductor (OC). Accordingly, the oxide semiconductor can be used for a gate electrode.

The conductive film 112 can have, for example, a single-layer structure of an oxide conductor (OC), a single-layer structure of a metal film, or a stacked-layer structure of an oxide conductor (OC) and a metal film.

Note that it is suitable that the conductive film 112 has a single-layer structure of a light-shielding metal film or a stacked-layer structure of an oxide conductor (OC) and a light-shielding metal film because the channel region 108*i* formed under the conductive film 112 can be shielded from light. In the case where the conductive film 112 has a stacked-layer structure of an oxide semiconductor or an oxide conductor (OC) and a light-shielding metal film, formation of a metal film (e.g., a titanium film or a tungsten film) over the oxide semiconductor or the oxide conductor (OC) produces any of the following effects: the resistance of the oxide semiconductor or the oxide conductor (OC) is reduced by the diffusion of the constituent element of the metal film to the oxide semiconductor or oxide conductor (OC) side, the resistance is reduced by damage (e.g., sputtering damage) during the deposition of the metal film, and the resistance is reduced when oxygen vacancies are formed by the diffusion of oxygen in the oxide semiconductor or the oxide conductor (OC) to the metal film.

The thickness of the conductive films 112, 120*a*, and 120*b* can be greater than or equal to 30 nm and less than or equal to 500 nm, or greater than or equal to 100 nm and less than or equal to 400 nm.

STRUCTURE EXAMPLE 2 OF TRANSISTOR

Next, a structure of a transistor different from that in FIGS. 6A to 6C is described with reference to FIGS. 7A to 7C.

Figure 7A:
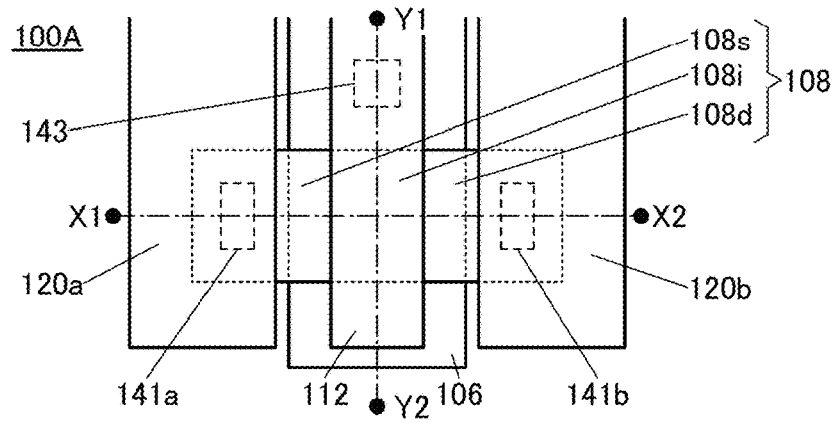
FIGS. 7A to 7C are a top view and cross-sectional views illustrating a semiconductor device.

FIG. 7A is a top view of a transistor 100A. FIG. 7B is a cross-sectional view taken along dashed-dotted line X1-X2 in FIG. 7A. FIG. 7C is a cross-sectional view taken along dashed-dotted line Y1-Y2 in FIG. 7A.

Figure 7B:
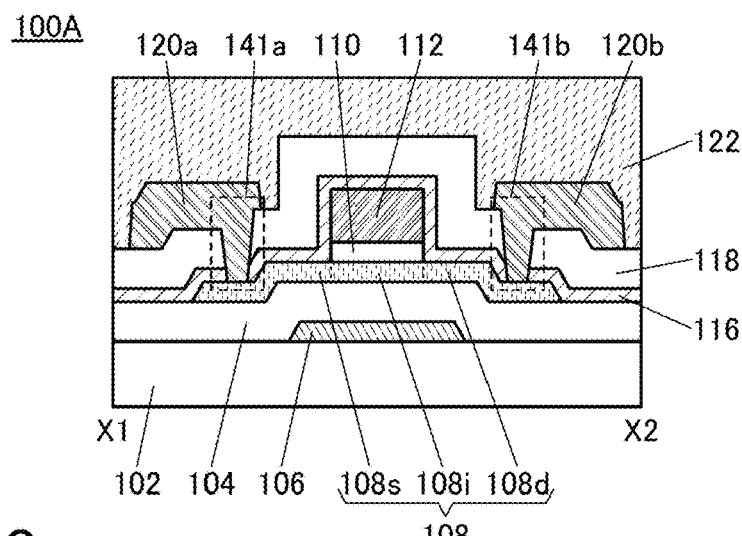
Figure 7C:
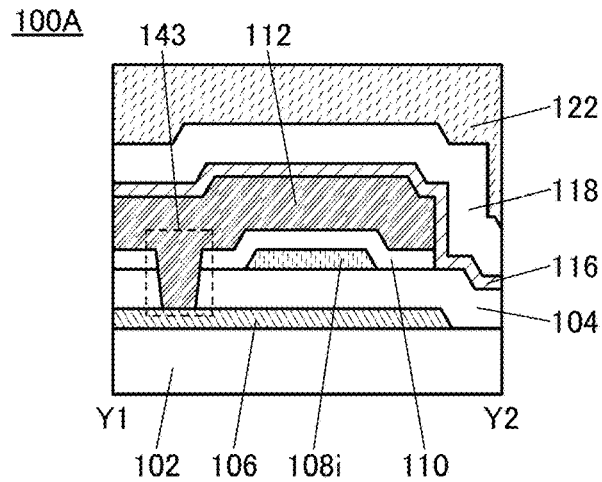

The transistor 100A illustrated in FIGS. 7A to 7C includes a conductive film 106 over the substrate 102, the insulating film 104 over the conductive film 106, the oxide semiconductor film 108 over the insulating film 104, the insulating film 110 over the oxide semiconductor film 108, the conductive film 112 over the insulating film 110, and the insulating film 116 over the insulating film 104, the oxide semiconductor film 108, and the conductive film 112. The oxide semiconductor film 108 includes the channel region 108*i* overlapping with the conductive film 112, the source region 108*s* in contact with the insulating film 116, and the drain region 108*d* in contact with the insulating film 116.

The transistor 100A may include the insulating film 118 over the insulating film 116, and the insulating film 122 over the conductive films 120*a* and 120*b* and the insulating film 118.

The transistor 100A includes the conductive film 106 and an opening 143 in addition to the components of the transistor 100 described above.

Note that the opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-shielding film without providing the opening 143. When the conductive film 106 is formed using a light-shielding material, for example, light irradiating the channel region 108*i* from the bottom can be reduced.

In the case of the structure of the transistor 100A, the conductive film 106 functions as a first gate electrode (also referred to as a bottom-gate electrode), the conductive film 112 functions as a second gate electrode (also referred to as a top-gate electrode), the insulating film 104 functions as a first gate insulating film, and the insulating film 110 functions as a second gate insulating film.

The conductive film 106 can be formed using a material similar to the above-described materials of the conductive films 112, 120*a*, and 120*b*. It is particularly suitable to use a material containing copper as the conductive film 106 because the resistance can be reduced. It is favorable that, for example, each of the conductive films 106, 120*a*, and 120*b* has a stacked-layer structure in which a copper film is over a titanium nitride film, a tantalum nitride film, or a tungsten film. In that case, by using the transistor 100A as a pixel transistor and/or a driving transistor of a display device, parasitic capacitance generated between the conductive films 106 and 120*a* and between the conductive films 106 and 120*b* can be reduced. Thus, the conductive films 106, 120*a*, and 120*b* can be used not only as the first gate electrode, the source electrode, and the drain electrode of the transistor 100A, but also as power source supply wirings, signal supply wirings, connection wirings, or the like of the display device.

In this manner, unlike the transistor 100 described above, the transistor 100A in FIGS. 7A to 7C has a structure in which a conductive film functioning as a gate electrode is provided over and under the oxide semiconductor film 108. As in the transistor 100A, a semiconductor device of one embodiment of the present invention may have a plurality of gate electrodes.

As illustrated in FIGS. 7B and 7C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is greater than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening 143 provided in the insulating films 104 and 110, a side surface of the oxide semiconductor film 108 in the channel width direction faces the conductive film 112 with the insulating film 110 placed therebetween.

In other words, in the channel width direction of the transistor 100A, the conductive films 106 and 112 are connected to each other through the opening 143 provided in the insulating films 104 and 110, and the conductive films 106 and 112 surround the oxide semiconductor film 108 with the insulating films 104 and 110 positioned therebetween.

Such a structure enables the oxide semiconductor film 108 included in the transistor 100A to be electrically surrounded by electric fields of the conductive film 106 functioning as a first gate electrode and the conductive film 112 functioning as a second gate electrode. A device structure of a transistor, like that of the transistor 100A, in which electric fields of a first gate electrode and a second gate electrode electrically surround the oxide semiconductor film 108 in which a channel region is formed can be referred to as a surrounded channel (S-channel) structure.

Since the transistor 100A has the S-channel structure, an electric field for inducing a channel can be effectively applied to the oxide semiconductor film 108 by the conductive film 106 or the conductive film 112; thus, the current drive capability of the transistor 100A can be improved and high on-state current characteristics can be obtained. As a result of the high on-state current, it is possible to reduce the size of the transistor 100A. Furthermore, since the transistor 100A has a structure in which the oxide semiconductor film 108 is surrounded by the conductive film 106 and the conductive film 112, the mechanical strength of the transistor 100A can be increased.

When seen in the channel width direction of the transistor 100A, an opening different from the opening 143 may be formed on the side of the oxide semiconductor film 108 on which the opening 143 is not formed.

When a transistor has a pair of gate electrodes between which a semiconductor film is positioned as in the transistor 100A, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential $V_1$ and a potential $V_2$ ($V_1 > V_2$). For example, the potential $V_1$ can be a high power supply potential, and the potential $V_2$ can be a low power supply potential. The signal A may be an analog signal.

The fixed potential $V_b$ is, for example, a potential for controlling a threshold voltage $V_{thA}$ of the transistor. The fixed potential $V_b$ may be the potential $V_1$ or the potential $V_2$. In that case, a potential generator circuit for generating the fixed potential $V_b$ is not necessary, which is preferable. The fixed potential $V_b$ may be different from the potential $V_1$ or the potential $V_2$. When the fixed potential $V_b$ is low, the threshold voltage $V_{thA}$ can be high in some cases. As a result, the drain current flowing when the gate-source voltage $V_g$s is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_g$s is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential $V_3$ and a potential $V_4$ ($V_3 > V_4$). For example, the potential $V_3$ can be a high power supply potential, and the potential $V_4$ can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential $V_1$ and the potential $V_2$ of the signal A may be different from the potential $V_3$ and the potential $V_4$ of the signal B. For example, if a gate insulating film for the gate to which the signal B is input is thicker than a gate insulating film for the gate to which the signal A is input, the potential amplitude of the signal B ($V_3$-$V_4$) may be larger than the potential amplitude of the signal A ($V_1$-$V_2$). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential $V_1$ and the signal B has the potential $V_3$, or the transistor is turned off only when the signal A has the potential $V_2$ and the signal B has the potential $V_4$. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

The other components of the transistor 100A are similar to those of the transistor 100 described above and have similar effects.

STRUCTURE EXAMPLE 3 OF TRANSISTOR

Next, structures of transistors different from the structure of the transistor illustrated in FIGS. 7A to 7C will be described with reference to FIGS. 8A and 8B, FIGS. 9A and 9B, and FIGS. 10A and 10B.

Figure 8A:
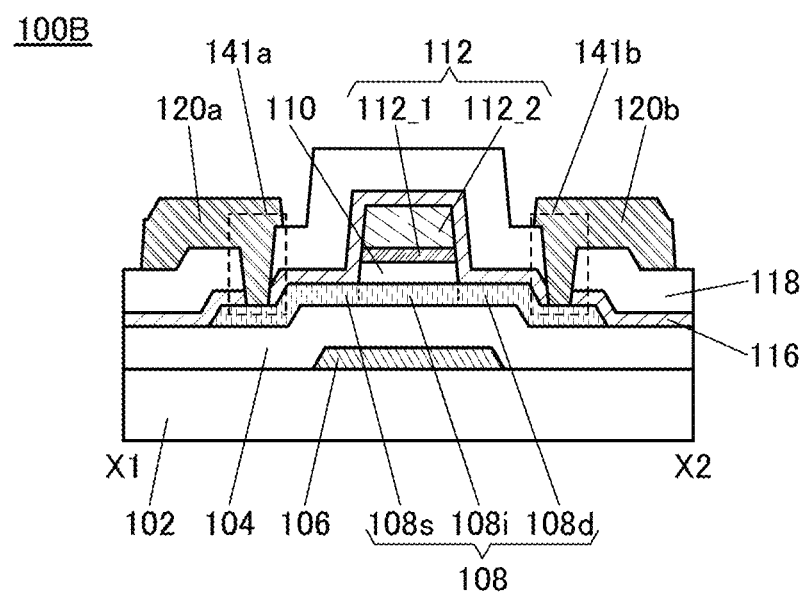
FIGS. 8A and 8B are cross-sectional views illustrating a semiconductor device.
Figure 8B:
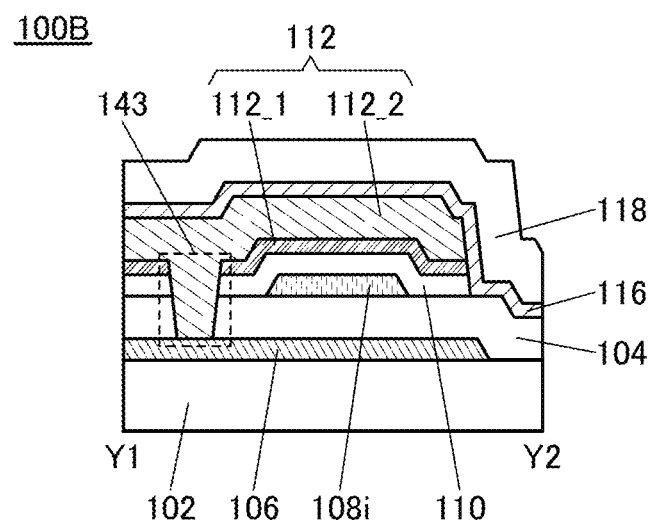
Figure 9A:
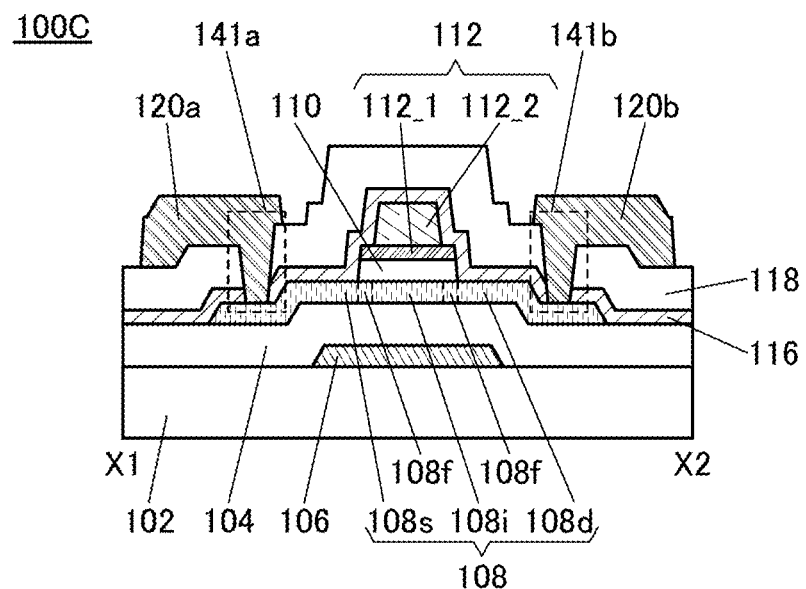
FIGS. 9A and 9B are cross-sectional views illustrating a semiconductor device.
Figure 9B:
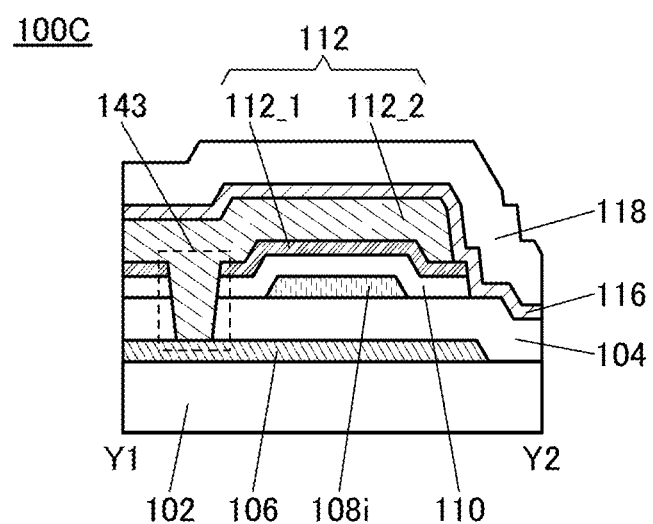
Figure 10A:
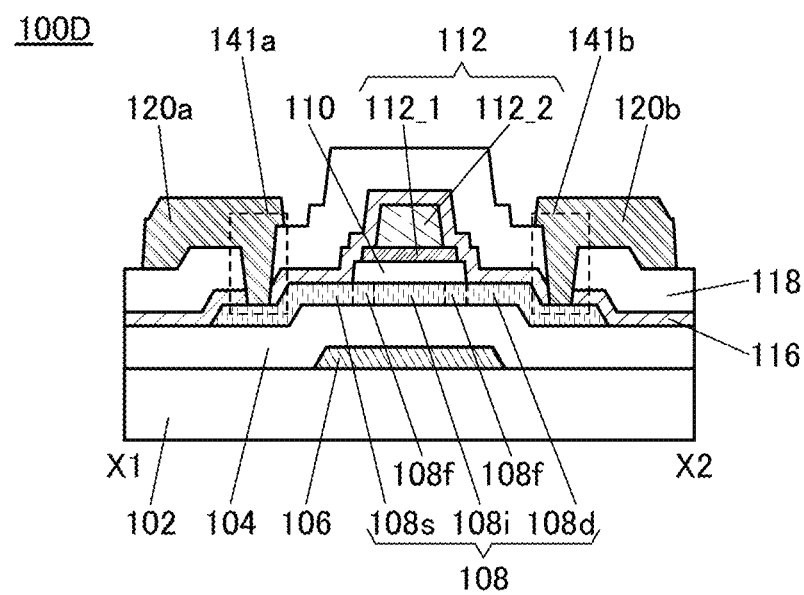
FIGS. 10A and 10B are cross-sectional views illustrating a semiconductor device.
Figure 10B:
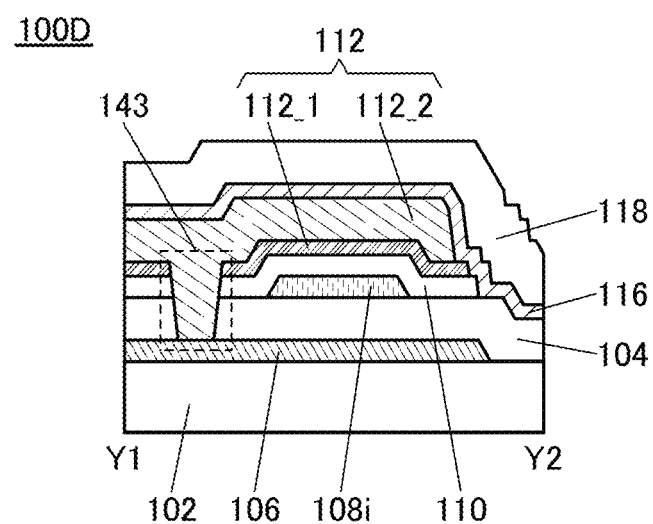

FIGS. 8A and 8B are cross-sectional views of a transistor 100B. FIGS. 9A and 9B are cross-sectional views of a transistor 100C. FIGS. 10A and 10B are cross-sectional views of a transistor 100D. The top views of the transistors 100B, 100C, and 100D are not illustrated because they are similar to the top view of the transistor 100A in FIG. 7A.

The transistor 100B illustrated in FIGS. 8A and 8B is different from the transistor 100A in the layered structure of the conductive film 112, the shape of the conductive film 112, and the shape of the insulating film 110.

The conductive film 112 in the transistor 100B includes a conductive film 112_1 over the insulating film 110 and the conductive film 112_2 over the conductive film 112_1. For example, an oxide conductive film is used as the conductive film 112_1, so that excess oxygen can be added to the insulating film 110. The oxide conductive film can be formed by a sputtering method in an atmosphere containing an oxygen gas. As the oxide conductive film, an oxide containing indium and tin, an oxide containing tungsten and indium, an oxide containing tungsten, indium, and zinc, an oxide containing titanium and indium, an oxide containing titanium, indium, and tin, an oxide containing indium and zinc, an oxide containing silicon, indium, and tin, or an oxide containing indium, gallium, and zinc can be used, for example.

As illustrated in FIG. 8B, the conductive film 112_2 is connected to the conductive film 106 through the opening 143. By forming the opening 143 after a conductive film to be the conductive film 112_1 is formed, the shape illustrated in FIG. 8B can be obtained. In the case where an oxide conductive film is used as the conductive film 112_1, the structure in which the conductive film 112_2 is connected to the conductive film 106 can decrease the contact resistance between the conductive film 112 and the conductive film 106.

The conductive film 112 and the insulating film 110 in the transistor 100B have a tapered shape. More specifically, the lower edge portion of the conductive film 112 is positioned outside the upper edge portion of the conductive film 112. The lower edge portion of the insulating film 110 is positioned outside the upper edge portion of the insulating film 110. In addition, the lower edge portion of the conductive film 112 is formed in substantially the same position as that of the upper edge portion of the insulating film 110.

It is suitable that the conductive film 112 and the insulating film 110 have tapered shapes as in the transistor 100B, because the coverage with the insulating film 116 can be high as compared with the case of the transistor 100A in which the conductive film 112 and the insulating film 110 are rectangular.

The other components of the transistor 100B are similar to those of the transistor 100A described above and have similar effects.

The transistor 100C illustrated in FIGS. 9A and 9B is different from the transistor 100A in the layered structure of the conductive film 112, the shape of the conductive film 112, and the shape of the insulating film 110.

The conductive film 112 in the transistor 100C includes the conductive film 112_1 over the insulating film 110 and the conductive film 112_2 over the conductive film 112_1. A lower end portion of the conductive film 112_1 is located outward from a lower end portion of the conductive film 112_2. The conductive film 112_1, the conductive film 112_2, and the insulating film 110 can be formed by processing with the same mask. To obtain the above structure, for example, the conductive film 112_2 is processed by a wet etching method and the conductive film 112_1 and the insulating film 110 are processed by a dry etching method.

With the structure of the transistor 100C, regions 108f are formed in the oxide semiconductor film 108 in some cases. The regions 108f are formed between the channel region 108i and the source region 108s and between the channel region 108i and the drain region 108d.

The regions 108f function as high-resistance regions or low-resistance regions. The high-resistance regions have the same level of resistance as the channel region 108i and do not overlap with the conductive film 112 functioning as a gate electrode. In the case where the regions 108f are high-resistance regions, the regions 108f function as offset regions. To suppress a decrease in the on-state current of the transistor 100C, the regions 108f functioning as offset regions may each have a length of 1 μm or less in the channel length (L) direction.

The low-resistance regions have a resistance that is lower than that of the channel region 108i and higher than that of the source region 108s and the drain region 108d. In the case where the regions 108f are low-resistance regions, the regions 108f function as lightly doped drain (LDD) regions. The regions 108f functioning as LDD regions can relieve an electric field in the drain region, thereby reducing a change in the threshold voltage of the transistor due to the electric field in the drain region.

Note that in the case where the regions 108f serve as LDD regions, for example, the regions 108f are formed by supplying one or more of nitrogen, hydrogen, and fluorine from the insulating film 116 to the regions 108f or by adding an impurity element from above the conductive film 112_1 using the insulating film 110 and the conductive film 112_1 as a mask so that the impurity element is added to the oxide semiconductor film 108 through the conductive film 112_1 and the insulating film 110.

As illustrated in FIG. 9B, the conductive film 112_2 is connected to the conductive film 106 through the opening 143.

The other components of the transistor 100C are similar to those of the transistor 100A described above and have similar effects.

The transistor 100D illustrated in FIGS. 10A and 10B is different from the transistor 100A in the layered structure of the conductive film 112, the shape of the conductive film 112, and the shape of the insulating film 110.

The conductive film 112 in the transistor 100D includes the conductive film 112_1 over the insulating film 110 and the conductive film 112_2 over the conductive film 112_1. A lower end portion of the conductive film 112_1 is located outward from a lower end portion of the conductive film 112_2. Furthermore, a lower end portion of the insulating film 110 is located outward from the lower end portion of the conductive film 112_1. The conductive film 112_1, the conductive film 112_2, and the insulating film 110 can be formed by processing with the same mask. To obtain the above structure, for example, the conductive film 112_2 and the conductive film 112_1 are processed by a wet etching method and the insulating film 110 is processed by a dry etching method.

Like the transistor 100C, regions 108f are formed in the oxide semiconductor film 108 in the transistor 100D, in some cases. The regions 108f are formed between the channel region 108i and the source region 108s and between the channel region 108i and the drain region 108d.

As illustrated in FIG. 10B, the conductive film 112_2 is connected to the conductive film 106 through the opening 143.

The other components of the transistor 100D are similar to those of the transistor 100A described above and have similar effects.

STRUCTURE EXAMPLE 4 TRANSISTOR

Next, structures of transistors different from the structure of the transistor 100A illustrated in FIGS. 7A to 7C will be described with reference to FIGS. 11A and 11B, FIGS. 12A and 12B, FIGS. 13A and 13B, FIGS. 14A and 14B, and FIGS. 15A and 15B.

Figure 11A:
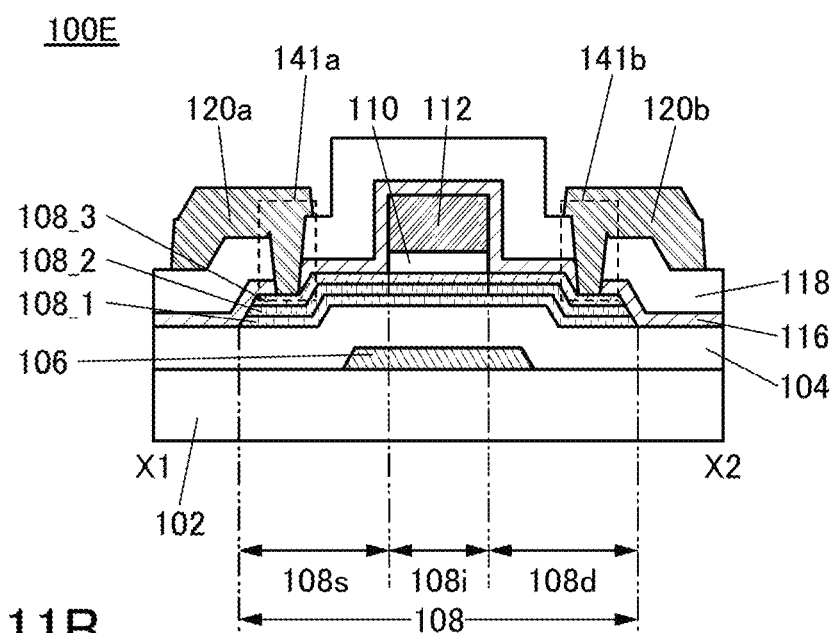
FIGS. 11A and 11B are cross-sectional views illustrating a semiconductor device.
Figure 11B:
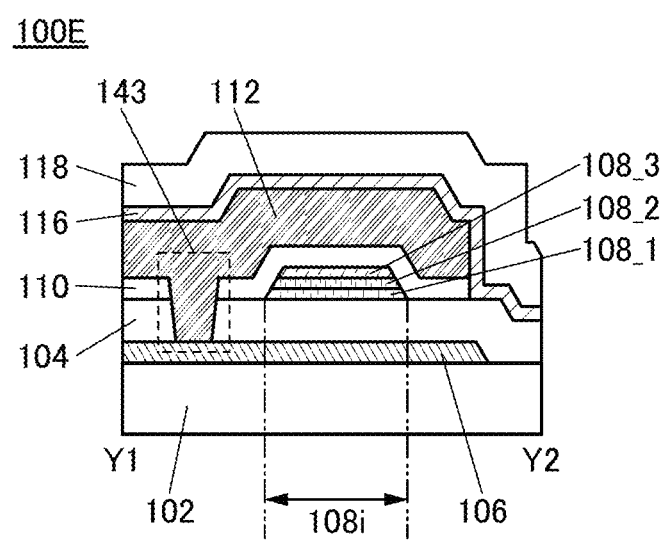
Figure 12A:
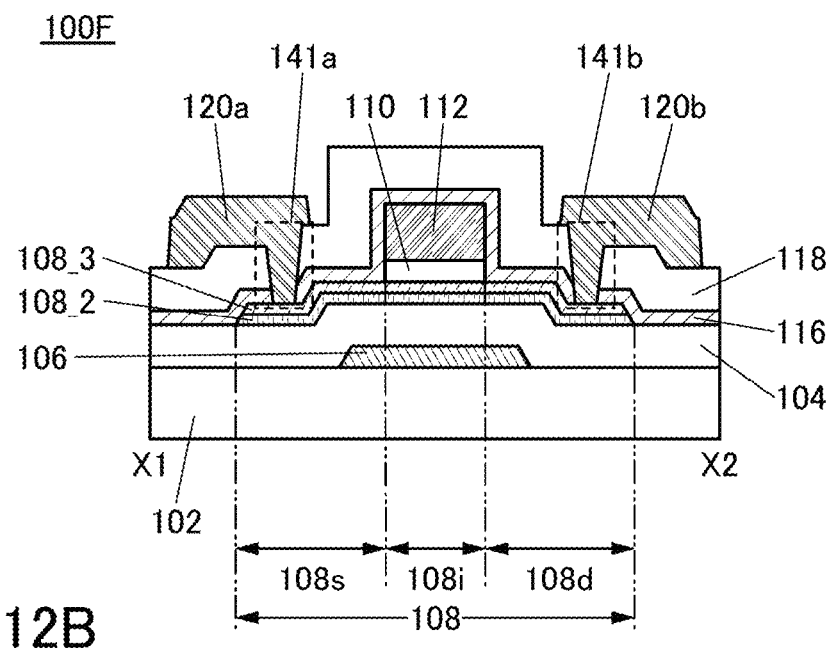
FIGS. 12A and 12B are cross-sectional views illustrating a semiconductor device.
Figure 12B:
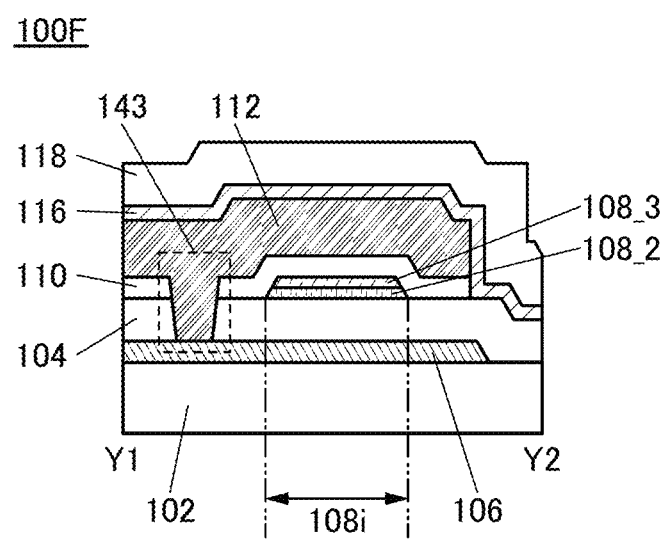
Figure 13A:
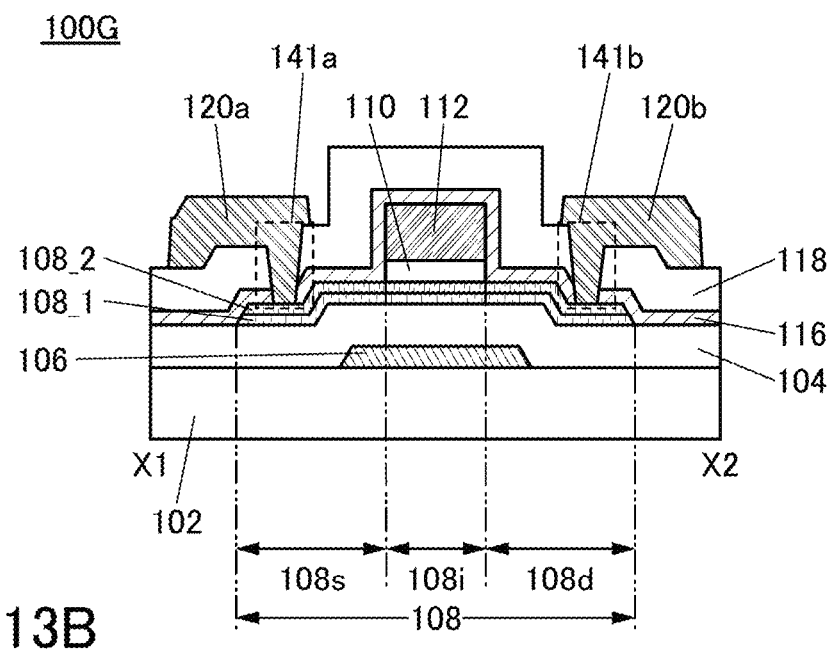
FIGS. 13A and 13B are cross-sectional views illustrating a semiconductor device.
Figure 13B:
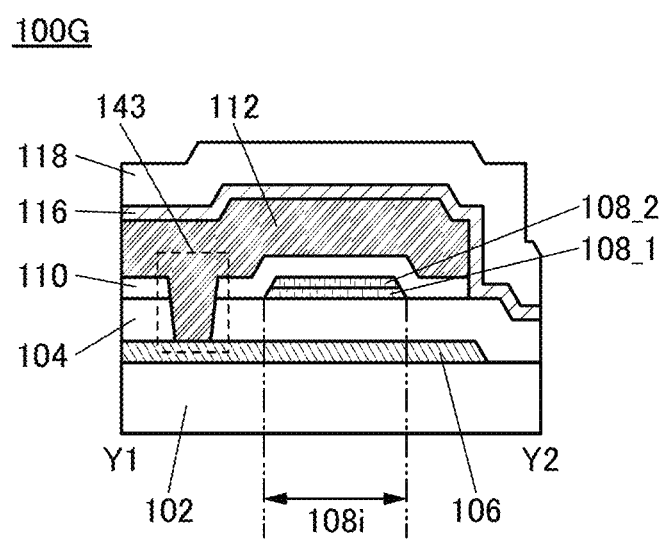
Figure 14A:
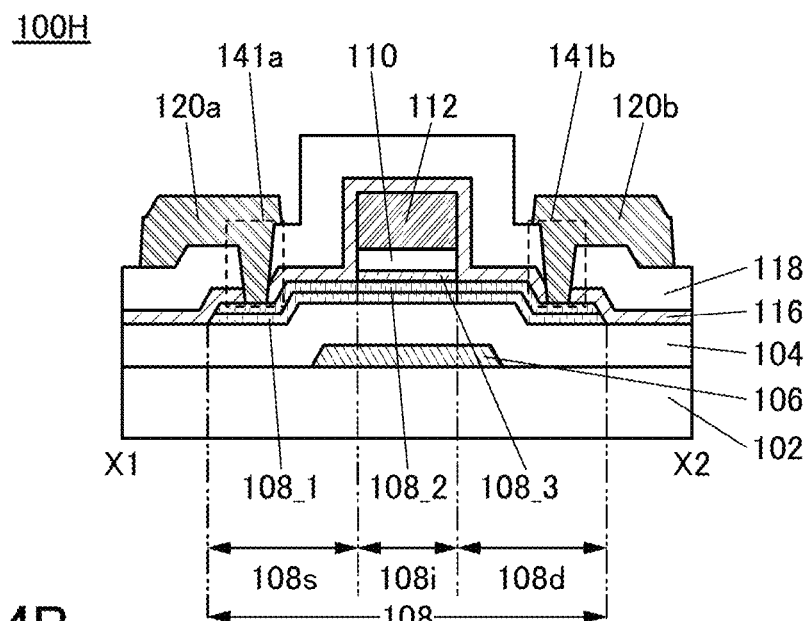
FIGS. 14A and 14B are cross-sectional views illustrating a semiconductor device.
Figure 14B:
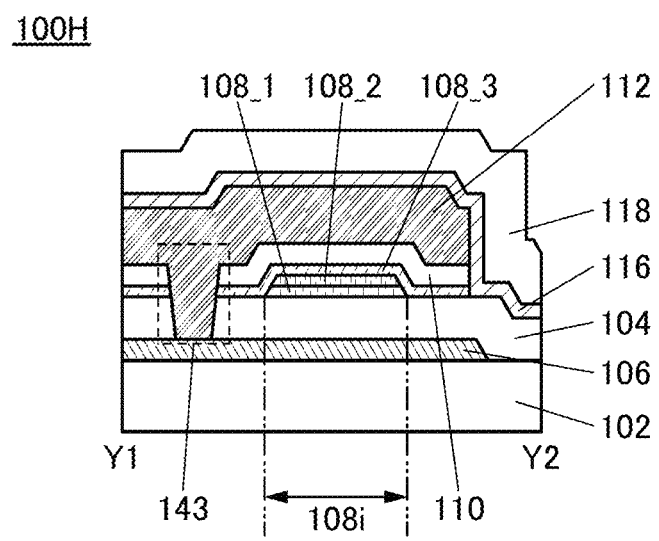
Figure 15A:
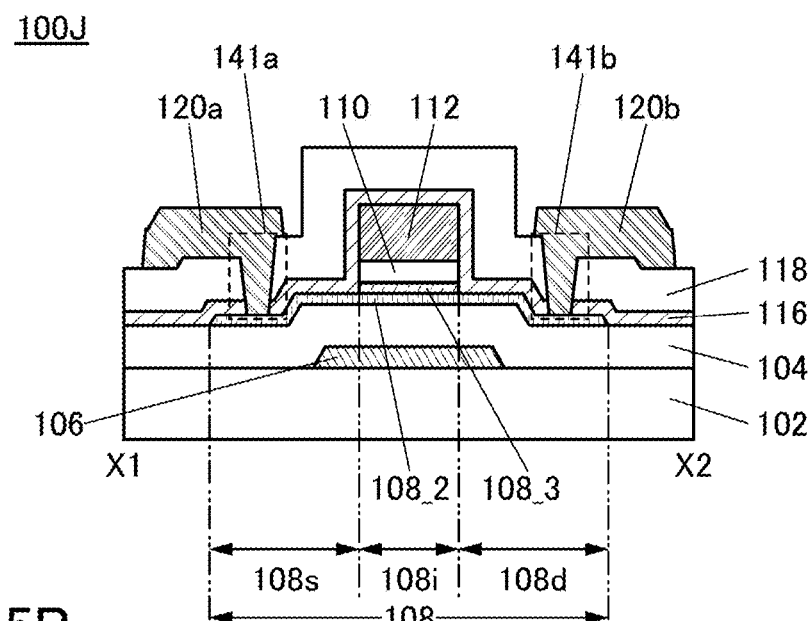
FIGS. 15A and 15B are cross-sectional views illustrating a semiconductor device.
Figure 15B:
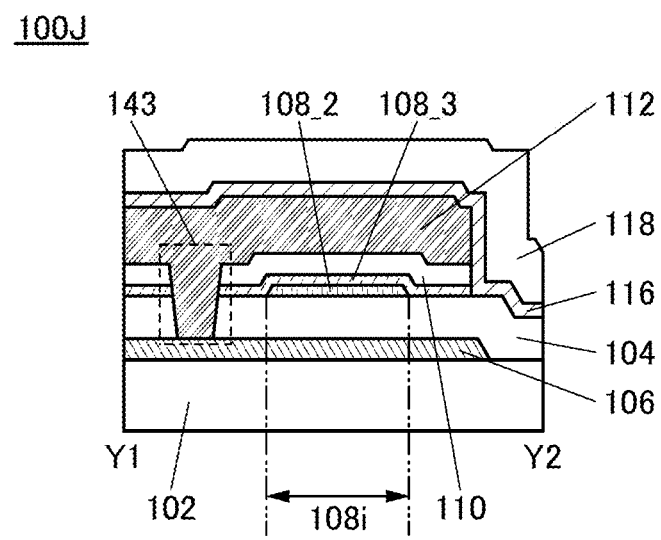

FIGS. 11A and 11B are cross-sectional views of a transistor 100E. FIGS. 12A and 12B are cross-sectional views of a transistor 100F. FIGS. 13A and 13B are cross-sectional views of a transistor 100G. FIGS. 14A and 14B are cross-sectional views of a transistor 100H. FIGS. 15A and 15B are cross-sectional views of a transistor 100J. Note that top views of the transistor 100E, the transistor 100F, the transistor 100G, the transistor 100H, and the transistor 100J are similar to that of the transistor 100A illustrated in FIG. 7A and thus are not described here.

The transistors 100E, 100F, 100G, 100H, and 100J are different from the above-described the transistor 100A in the structure of the oxide semiconductor film 108. The other components are similar to those of the transistor 100A and have similar effects.

The oxide semiconductor film 108 of the transistor 100E illustrated in FIGS. 11A and 11B includes an oxide semiconductor film 108_1 over the insulating film 104, an oxide semiconductor film 108_2 over the oxide semiconductor film 108_1, and an oxide semiconductor film 108_3 over the oxide semiconductor film 108_2. The channel region 108i, the source region 108s, and the drain region 108d each have a three-layer structure of the oxide semiconductor film 108_1, the oxide semiconductor film 108_2, and the oxide semiconductor film 108_3.

The oxide semiconductor film 108 of the transistor 100F illustrated in FIGS. 12A and 12B includes the oxide semiconductor film 108_2 over the insulating film 104, and the oxide semiconductor film 108_3 over the oxide semiconductor film 108_2. The channel region 108i, the source region 108s, and the drain region 108d each have a two-layer structure of the oxide semiconductor film 108_2 and the oxide semiconductor film 108_3.

The oxide semiconductor film 108 of the transistor 100G illustrated in FIGS. 13A and 13B includes the oxide semiconductor film 108_1 over the insulating film 104, and the oxide semiconductor film 108_2 over the oxide semiconductor film 108_1. The channel region 108i, the source region 108s, and the drain region 108d each have a two-layer structure of the oxide semiconductor film 108_1 and the oxide semiconductor film 108_2.

The oxide semiconductor film 108 of the transistor 100H illustrated in FIGS. 14A and 14B includes the oxide semiconductor film 108_1 over the insulating film 104, the oxide semiconductor film 108_2 over the oxide semiconductor film 108_1, and the oxide semiconductor film 108_3 over the oxide semiconductor film 108_2. The channel region 108i has a three-layer structure of the oxide semiconductor film 108_1, the oxide semiconductor film 108_2, and the oxide semiconductor film 108_3. The source region 108s and the drain region 108d each have a two-layer structure of the oxide semiconductor film 108_1 and the oxide semiconductor film 108_2. Note that in the cross section of the transistor 100H in the channel width (W) direction, the oxide semiconductor film 108_3 covers side surfaces of the oxide semiconductor film 108_1 and the oxide semiconductor film 108_2.

The oxide semiconductor film 108 of the transistor 100J illustrated in FIGS. 15A and 15B includes the oxide semiconductor film 108_2 over the insulating film 104, and the oxide semiconductor film 108_3 over the oxide semiconductor film 108_2. The channel region 108i has a two-layer structure of the oxide semiconductor film 108_2 and the oxide semiconductor film 108_3. The source region 108s and the drain region 108d each have a single-layer structure of the oxide semiconductor film 108_2. Note that in the cross section of the transistor 100J in the channel width (W) direction, the oxide semiconductor 108_3 covers side surfaces of the oxide semiconductor 108_2.

A side surface of the channel region 108i in the channel width (W) direction or a region in the vicinity of the side surface is easily damaged by processing, resulting in a defect (e.g., oxygen vacancy), or easily contaminated by an impurity attached thereto. Therefore, even when the channel region 108i is substantially intrinsic, stress such as an electric field applied thereto activates the side surface of the channel region 108i in the channel width (W) direction or the region in the vicinity of the side surface and turns it into a low-resistance (n-type) region easily. Moreover, if the side surface of the channel region 108i in the channel width (W) direction or the region in the vicinity of the side surface is an n-type region, a parasitic channel may be formed because the n-type region serves as a carrier path.

Thus, in the transistor 100H and the transistor 100J, the channel region 108i has a stacked-layer structure and side surfaces of the channel region 108i in the channel width (W) direction are covered with one layer of the stacked layers. With such a structure, defects on or in the vicinity of the side surfaces of the channel region 108i can be suppressed or adhesion of an impurity to the side surfaces of the channel region 108i or to regions in the vicinity of the side surfaces can be reduced.

[Band Structure]

Here, a band structure of the insulating film 104, the oxide semiconductor films 108_1, 108_2, and 108_3, and the insulating film 110, a band structure of the insulating film 104, the oxide semiconductor films 108_2 and 108_3, and the insulating film 110, and a band structure of the insulating film 104, the oxide semiconductor films 108_1 and 108_2, and the insulating film 110 will be described with reference to FIGS. 16A to 16C. Note that FIGS. 16A to 16C are each a band structure of the channel region 108i.

Figure 16A:
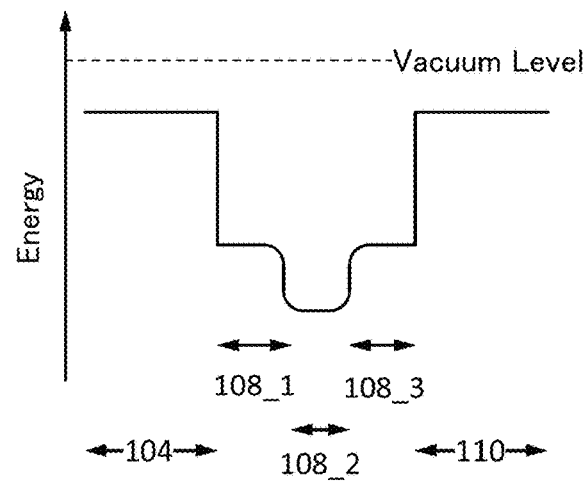
FIGS. 16A to 16C illustrate band structures.

FIG. 16A shows an example of a band structure in the thickness direction of a stack including the insulating film 104, the oxide semiconductor films 108_1, 108_2, and 108_3, and the insulating film 110. FIG. 16B shows an example of a band structure in the thickness direction of a stack including the insulating film 104, the oxide semiconductor films 108_2 and 108_3, and the insulating film 110. FIG. 16C shows an example of a band structure in the thickness direction of a stack including the insulating film 104, the oxide semiconductor films 108_1 and 108_2, and the insulating film 110. For easy understanding, the band structures show the conduction band minimum ($E_c$) of the insulating film 104, the oxide semiconductor films 108_1, 108_2, and 108_3, and the insulating film 110.

In the band structure of FIG. 16A, a silicon oxide film is used as each of the insulating films 104 and 110, an oxide semiconductor film formed using a metal oxide target whose atomic ratio of In to Ga and Zn is 1:3:2 is used as the oxide semiconductor film 108_1, an oxide semiconductor film formed using a metal oxide target whose atomic ratio of In to Ga and Zn is 4:2:4.1 is used as the oxide semiconductor film 108_2, and an oxide semiconductor film formed using a metal oxide target whose atomic ratio of In to Ga and Zn is 1:3:2 is used as the oxide semiconductor film 108_3.

Figure 16B:
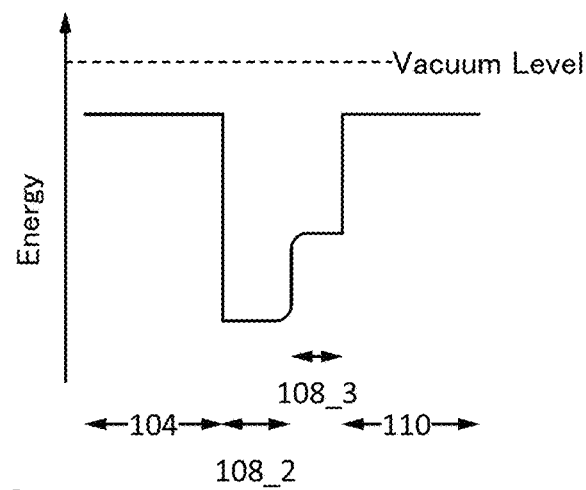
Figure 16C:
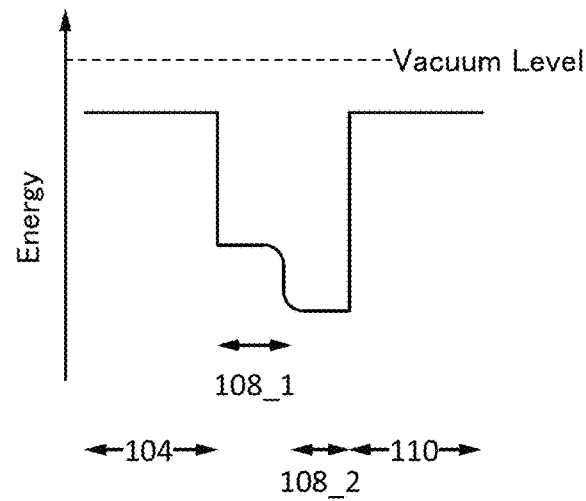

In the band structure of FIG. 16B, a silicon oxide film is used as each of the insulating films 104 and 110, an oxide semiconductor film formed using a metal oxide target whose atomic ratio of In to Ga to Zn is 4:2:4.1 is used as the oxide semiconductor film 108_2, and an oxide semiconductor film formed using a metal oxide target whose atomic ratio of In to Ga to Zn is 1:3:2 is used as the oxide semiconductor film 108_3.

In the band structure of FIG. 16C, a silicon oxide film is used as each of the insulating films 104 and 110, an oxide semiconductor film formed using a metal oxide target whose atomic ratio of In to Ga and Zn is 1:3:2 is used as the oxide semiconductor film 108_1, and an oxide semiconductor film formed using a metal oxide target whose atomic ratio of In to Ga and Zn is 4:2:4.1 is used as the oxide semiconductor film 108_2.

As illustrated in FIG. 16A, the conduction band minimum gradually varies between the oxide semiconductor films 108_1, 108_2, and 108_3. As illustrated in FIG. 16B, the conduction band minimum gradually varies between the oxide semiconductor films 108_2 and 108_3. As illustrated in FIG. 16C, the conduction band minimum gradually varies between the oxide semiconductor films 108_1 and 108_2. In other words, the conduction band minimum is continuously changed or continuously connected. To obtain such a band structure, there exists no impurity, which forms a defect state such as a trap center or a recombination center, at the interface between the oxide semiconductor films 108_1 and 108_2 or the interface between the oxide semiconductor films 108_2 and 108_3.

To form a continuous junction between the oxide semiconductor films 108_1, 108_2, and 108_3, it is necessary to form the films successively without exposure to the air with a multi-chamber deposition apparatus (sputtering apparatus) provided with a load lock chamber.

With the band structure of FIG. 16A, FIG. 16B, or FIG. 16C, the oxide semiconductor film 108_2 serves as a well, and a channel region is formed in the oxide semiconductor film 108_2 in the transistor with the stacked-layer structure.

By providing the oxide semiconductor films 108_1 and 108_3, the oxide semiconductor film 108_2 can be distanced away from defect states.

In addition, the defect states might be more distant from the vacuum level than the conduction band minimum ($E_c$) of the oxide semiconductor film 108_2 functioning as a channel region, so that electrons are likely to be accumulated in the defect states. When the electrons are accumulated in the defect states, the electrons become negative fixed electric charge, so that the threshold voltage of the transistor is shifted in the positive direction. Therefore, it is preferable that the defect states be closer to the vacuum level than the conduction band minimum ($E_c$) of the oxide semiconductor film 108_2. Such a structure inhibits accumulation of electrons in the defect states. As a result, the on-state current and the field-effect mobility of the transistor can be increased.

The conduction band minimum of each of the oxide semiconductor films 108_1 and 108_3 is closer to the vacuum level than that of the oxide semiconductor film 108_2. A typical difference between the conduction band minimum of the oxide semiconductor film 108_2 and the conduction band minimum of each of the oxide semiconductor films 108_1 and 108_3 is 0.15 eV or more or 0.5 eV or more and 2 eV or less or 1 eV or less. That is, the difference between the electron affinity of each of the oxide semiconductor films 108_1 and 108_3 and the electron affinity of the oxide semiconductor film 108_2 is 0.15 eV or more or 0.5 eV or more and 2 eV or less or 1 eV or less.

In such a structure, the oxide semiconductor film 108_2 serves as a main path of a current. In other words, the oxide semiconductor film 108_2 serves as a channel region, and the oxide semiconductor films 108_1 and 108_3 serve as oxide insulating films. It is preferable that the oxide semiconductor films 108_1 and 108_3 each include one or more metal elements constituting a part of the oxide semiconductor film 108_2 in which a channel region is formed. With such a structure, interface scattering hardly occurs at the interface between the oxide semiconductor film 108_1 and the oxide semiconductor film 108_2 or at the interface between the oxide semiconductor film 108_2 and the oxide semiconductor film 108_3. Thus, the transistor can have high field-effect mobility because the movement of carriers is not hindered at the interface.

To prevent each of the oxide semiconductor films 108_1 and 108_3 from functioning as part of a channel region, a material having sufficiently low conductivity is used for the oxide semiconductor films 108_1 and 108_3. Thus, the oxide semiconductor films 108_1 and 108_3 can be referred to as oxide insulating films for such properties and/or functions. Alternatively, a material that has a smaller electron affinity (a difference between the vacuum level and the conduction band minimum) than the oxide semiconductor film 108_2 and has a difference in the conduction band minimum from the oxide semiconductor film 108_2 (band offset) is used for the oxide semiconductor films 108_1 and 108_3. Furthermore, to inhibit generation of a difference in threshold voltage due to the value of the drain voltage, it is preferable to form the oxide semiconductor films 108_1 and 108_3 using a material whose conduction band minimum is closer to the vacuum level than that of the oxide semiconductor film 108_2. For example, a difference between the conduction band minimum of the oxide semiconductor film 108_2 and the conduction band minimum of each of the oxide semiconductor films 108_1 and 108_3 is preferably greater than or equal to 0.2 eV, more preferably greater than or equal to 0.5 eV.

It is preferable that the oxide semiconductor films 108_1 and 108_3 not have a spinel crystal structure. This is because if the oxide semiconductor films 108_1 and 108_3 have a spinel crystal structure, constituent elements of the conductive films 120a and 120b might be diffused into the oxide semiconductor film 108_2 at the interface between the spinel crystal structure and another region. Note that each of the oxide semiconductor films 108_1 and 108_3 is preferably a CAAC-OS film described later, in which case a higher blocking property against constituent elements of the conductive films 120a and 120b, for example, copper elements, can be obtained.

Although the example where an oxide semiconductor film formed using a metal oxide target whose atomic ratio of In to Ga and Zn is 1:3:2, is used as each of the oxide semiconductor films 108_1 and 108_3 is described in this embodiment, one embodiment of the present invention is not limited thereto. For example, an oxide semiconductor film formed using a metal oxide target whose atomic ratio of In to Ga and Zn is 1:1:1, 1:1:1.2, 1:3:4, 1:3:6, 1:4:5, 1:5:6, or 1:10:1 may be used as each of the oxide semiconductor films 108_1 and 108_3. Alternatively, oxide semiconductor films formed using a metal oxide target whose atomic ratio of Ga to Zn is 10:1 may be used as the oxide semiconductor films 108_1 and 108_3. It is suitable that an oxide semiconductor film formed using a metal oxide target whose atomic ratio of In to Ga and Zn is 1:1:1 is used as the oxide semiconductor film 108_2 and an oxide semiconductor film formed using a metal oxide target whose atomic ratio of Ga to Zn is 10:1 is used as each of the oxide semiconductor films 108_1 and 108_3 because the difference between the conduction band minimum of the oxide semiconductor film 108_2 and the conduction band minimum of the oxide semiconductor film 108_1 or 108_3 can be 0.6 eV or more.

When the oxide semiconductor films 108_1 and 108_3 are formed using a metal oxide target whose atomic ratio of In to Ga and Zn is 1:1:1, the atomic ratio of In to Ga and Zn in the oxide semiconductor films 108_1 and 108_3 might be 1:β1:β2 (0<β1≤2, 0<β2≤2). When the oxide semiconductor films 108_1 and 108_3 are formed using a metal oxide target whose atomic ratio of In to Ga and Zn is 1:3:4, the atomic ratio of In to Ga and Zn in the oxide semiconductor films 108_1 and 108_3 might be 1:β3:β4 (1≤β3≤5, 2≤β4≤6). When the oxide semiconductor films 108_1 and 108_3 are formed using a metal oxide target whose atomic ratio of In to Ga and Zn is 1:3:6, the atomic ratio of In to Ga and Zn in the oxide semiconductor films 108_1 and 108_3 might be 1:β5:β6 (1≤β5, 4≤β6≤8).

At least part of this embodiment can be implemented in combination with any of the other embodiments described in this specification as appropriate.

Embodiment 3

In this embodiment, a transistor that can be used as the semiconductor device of one embodiment of the present invention will be described.

In this embodiment, bottom-gate transistors will be described with reference to FIGS. 17A to 17C to FIGS. 23A to 23C.

STRUCTURE EXAMPLE 1 OF TRANSISTOR

Figure 17A:
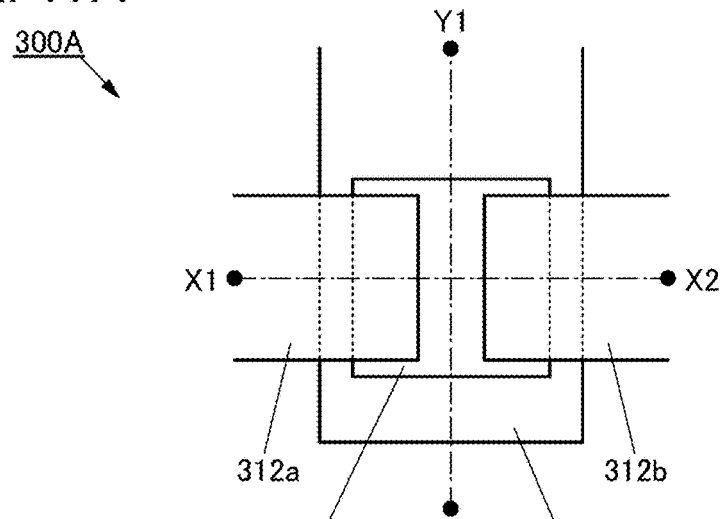
FIGS. 17A to 17C are a top view and cross-sectional views illustrating a semiconductor device.
Figure 17B:
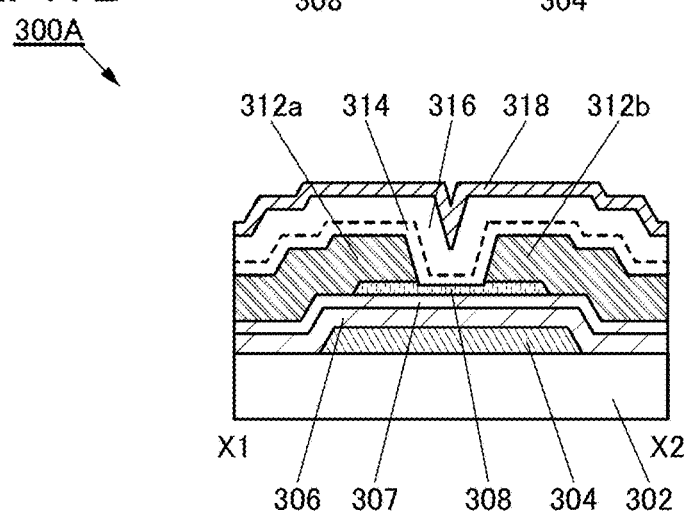
Figure 17C:
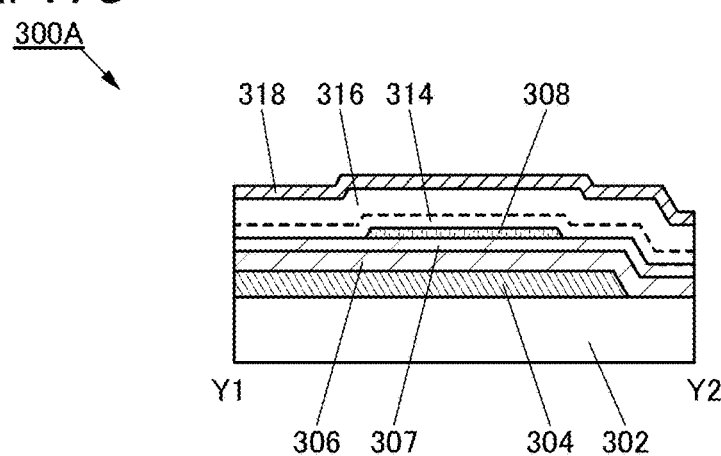

FIG. 17A is a top view of a transistor 300A. FIG. 17B is a cross-sectional view taken along dashed-dotted line X1-X2 in FIG. 17A. FIG. 17C is a cross-sectional view taken along dashed-dotted line Y1-Y2 in FIG. 17A. Note that in FIG. 17A, some components of the transistor 300A (e.g., an insulating film functioning as a gate insulating film) are not illustrated to avoid complexity. The direction of dashed-dotted line X1-X2 may be referred to as a channel length direction, and the direction of dashed-dotted line Y1-Y2 may be referred to as a channel width direction. As in FIG. 17A, some components are not illustrated in some cases in top views of transistors described below.

The transistor 300A illustrated in FIGS. 17A to 17C includes a conductive film 304 over a substrate 302, an insulating film 306 over the substrate 302 and the conductive film 304, an insulating film 307 over the insulating film 306, an oxide semiconductor film 308 over the insulating film 307, a conductive film 312a over the oxide semiconductor film 308, and a conductive film 312b over the oxide semiconductor film 308. Over the transistor 300A, specifically, over the conductive films 312a and 312b and the oxide semiconductor film 308, an insulating film 314, an insulating film 316, and an insulating film 318 are provided.

In the transistor 300A, the insulating films 306 and 307 function as the gate insulating films of the transistor 300A, and the insulating films 314, 316, and 318 function as protective insulating films of the transistor 300A. Furthermore, in the transistor 300A, the conductive film 304 functions as a gate electrode, the conductive film 312a functions as a source electrode, and the conductive film 312b functions as a drain electrode.

In this specification and the like, the insulating films 306 and 307 may be referred to as a first insulating film, the insulating films 314 and 316 may be referred to as a second insulating film, and the insulating film 318 may be referred to as a third insulating film.

The transistor 300A illustrated in FIGS. 17A to 17C is a channel-etched transistor. The oxide semiconductor film of one embodiment of the present invention is suitable for a channel-etched transistor.

STRUCTURE EXAMPLE 2 OF TRANSISTOR

Figure 18A:
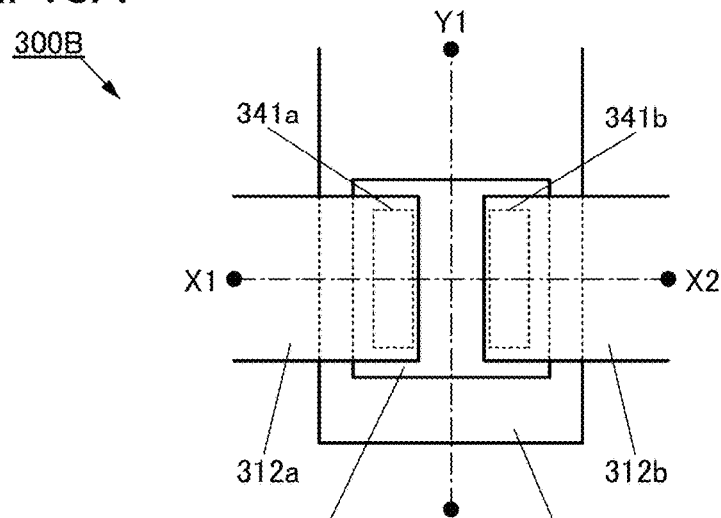
FIGS. 18A to 18C are a top view and cross-sectional views illustrating a semiconductor device.
Figure 18B:
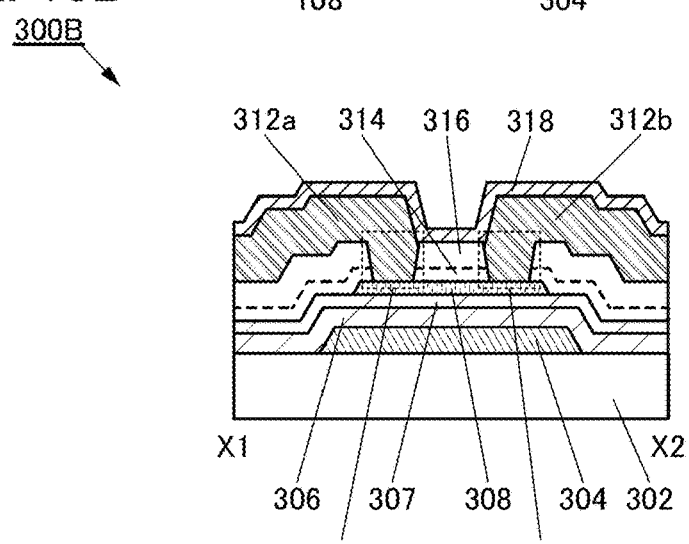
Figure 18C:
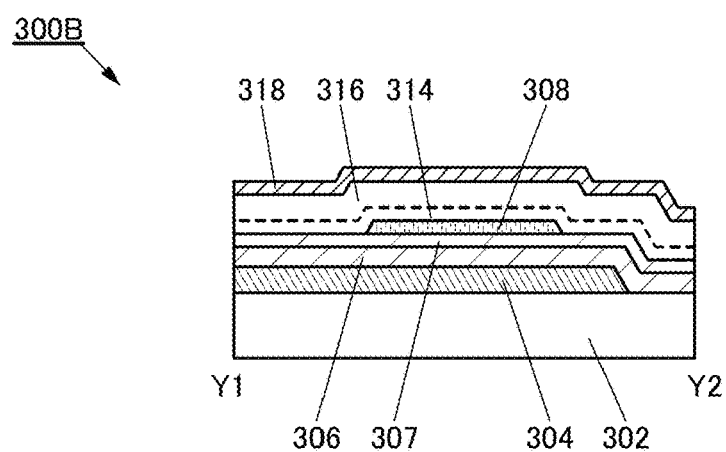

FIG. 18A is a top view of a transistor 300B. FIG. 18B is a cross-sectional view taken along dashed-dotted line X1-X2 in FIG. 18A. FIG. 18C is a cross-sectional view taken along dashed-dotted line Y1-Y2 in FIG. 18A.

The transistor 300B illustrated in FIGS. 18A to 18C includes the conductive film 304 over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312a electrically connected to the oxide semiconductor film 308 through an opening 341a provided in the insulating films 314 and 316, and the conductive film 312b electrically connected to the oxide semiconductor film 308 through an opening 341b provided in the insulating films 314 and 316. Over the transistor 300B, specifically, over the conductive films 312a and 312b and the insulating film 316, the insulating film 318 is provided.

In the transistor 300B, the insulating films 314 and 316 function as protective insulating films of the oxide semiconductor film 308

The transistor 300A illustrated in FIGS. 17A to 17C has a channel-etched structure, whereas the transistor 300B in FIGS. 18A to 18C has a channel-protective structure. The oxide semiconductor film of one embodiment of the present invention is suitable for a channel-protective transistor as well.

STRUCTURE EXAMPLE 3 OF TRANSISTOR

Figure 19A:
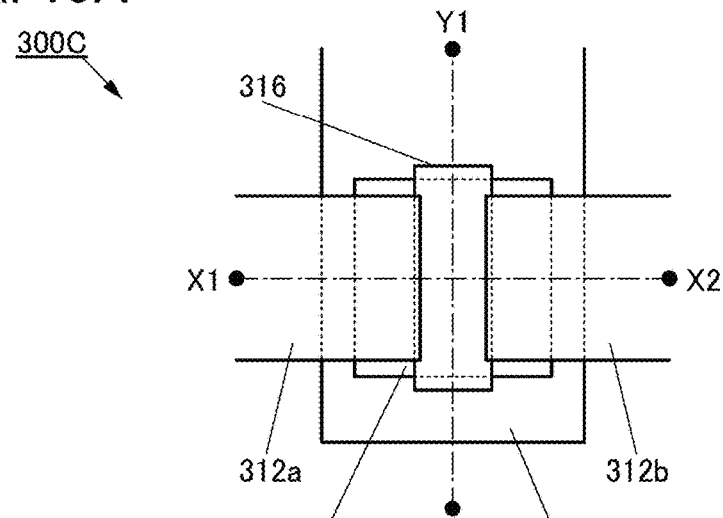
FIGS. 19A to 19C are a top view and cross-sectional views illustrating a semiconductor device.
Figure 19B:
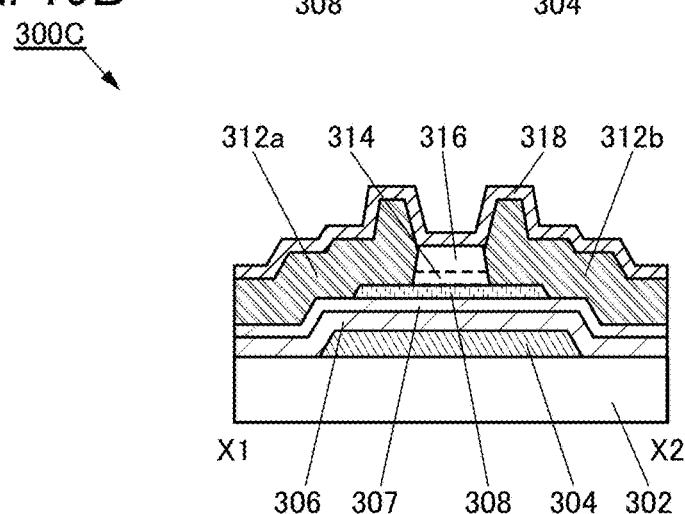
Figure 19C:
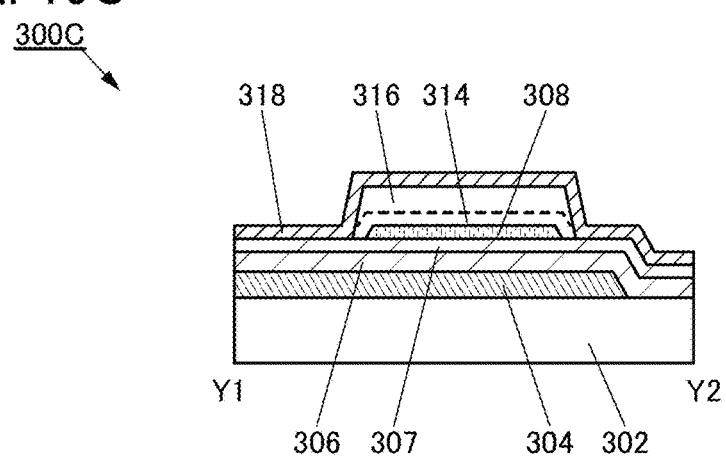

FIG. 19A is a top view of a transistor 300C. FIG. 19B is a cross-sectional view taken along dashed-dotted line X1-X2 in FIG. 19A. FIG. 19C is a cross-sectional view taken along dashed-dotted line Y1-Y2 in FIG. 19A.

The transistor 300C illustrated in FIGS. 19A to 19C is different from the transistor 300B in FIGS. 18A to 18C in the shapes of the insulating films 314 and 316. Specifically, the insulating films 314 and 316 of the transistor 300C have island shapes and are provided over a channel region of the oxide semiconductor film 308. Other components are similar to those of the transistor 300B.

STRUCTURE EXAMPLE 4 OF TRANSISTOR

Figure 20A:
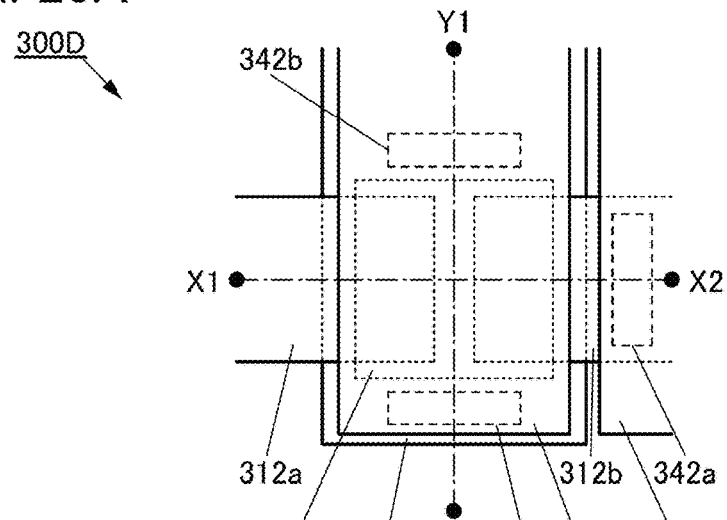
FIGS. 20A to 20C are a top view and cross-sectional views illustrating a semiconductor device.
Figure 20B:
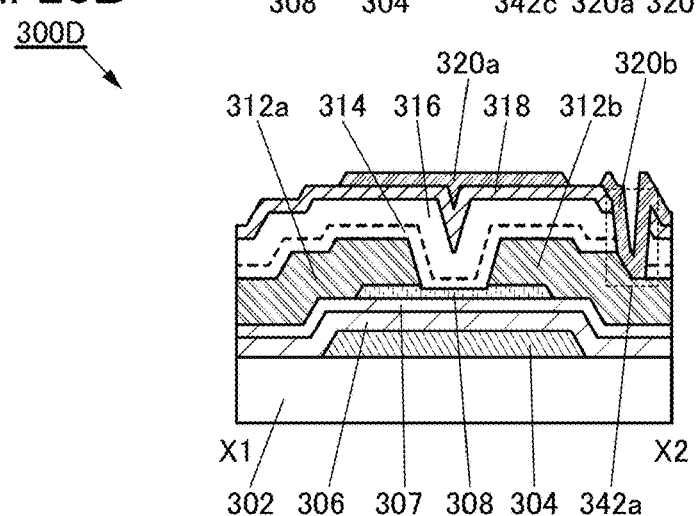
Figure 20C:
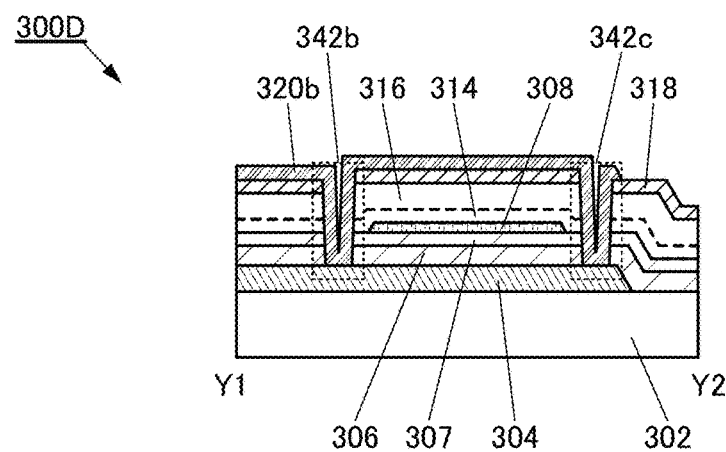

FIG. 20A is a top view of a transistor 300D. FIG. 20B is a cross-sectional view taken along dashed-dotted line X1-X2 in FIG. 20A. FIG. 20C is a cross-sectional view taken along dashed-dotted line Y1-Y2 in FIG. 20A.

The transistor 300D illustrated in FIGS. 20A to 20C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308 and the conductive films 312a and 312b, the insulating film 316 over the insulating film 314, the insulating film 318 over the insulating film 316, and conductive films 320a and 320b over the insulating film 318.

In the transistor 300D, the insulating films 306 and 307 function as first gate insulating films of the transistor 300D, and the insulating films 314, 316, and 318 function as second gate insulating films of the transistor 300D. Furthermore, in the transistor 300D, the conductive film 304 functions as a first gate electrode, the conductive film 320a functions as a second gate electrode, and the conductive film 320b functions as a pixel electrode used for a display device, for example. The conductive film 312a functions as a source electrode, and the conductive film 312b functions as a drain electrode.

As illustrated in FIG. 20C, the conductive film 320a is connected to the conductive film 304 in an opening 342b and an opening 342c provided in the insulating films 306, 307, 314, 316, and 318. Thus, the same potential is applied to the conductive film 320a and the conductive film 304.

The structure of the transistor 300D is not limited to that described above, in which the openings 342b and 342c are provided so that the conductive film 320a is connected to the conductive film 304. For example, a structure in which only one of the openings 342b and 342c is provided so that the conductive film 320a is connected to the conductive film 304, or a structure in which the conductive film 320a is not connected to the conductive film 304 without providing the openings 342b and 342c may be employed. Note that in the case where the conductive film 320a is not connected to the conductive film 304, it is possible to apply different potentials to the conductive film 320a and the conductive film 304.

The conductive film 320b is connected to the conductive film 312b through an opening 342a provided in the insulating films 314, 316, and 318.

Note that the transistor 300D has the S-channel structure described above.

STRUCTURE EXAMPLE 5 TRANSISTOR

The oxide semiconductor film 308 included in the transistor 300A in FIGS. 17A to 17C may have a stacked-layer structure. FIGS. 21A and 21B and FIGS. 22A and 22B illustrate examples of such a case.

Figure 21A:
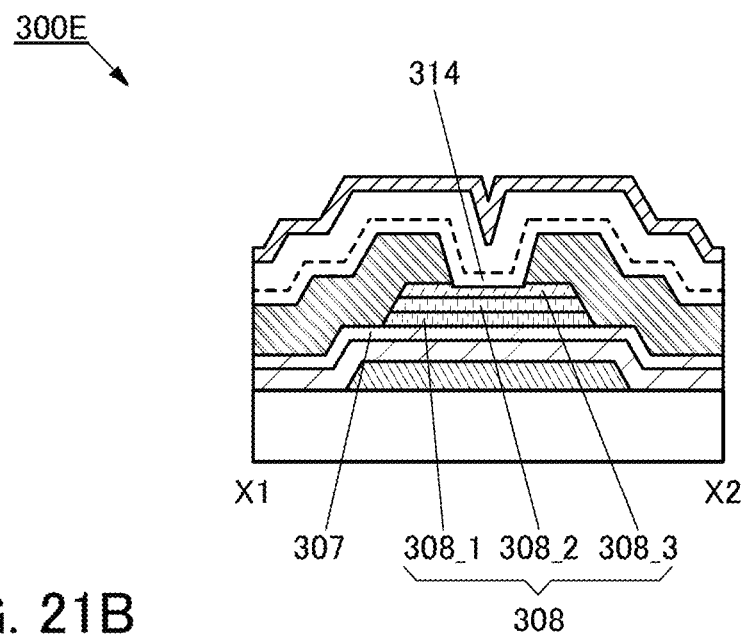
FIGS. 21A and 21B are cross-sectional views illustrating a semiconductor device.
Figure 21B:
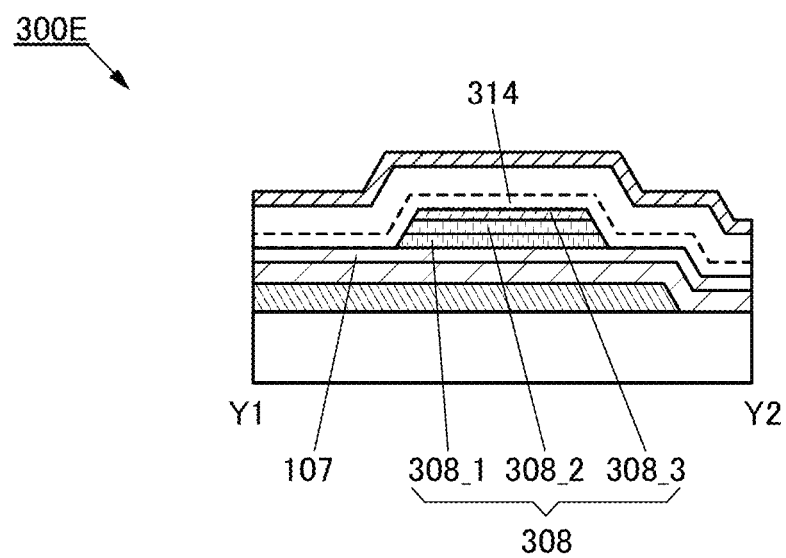
Figure 22A:
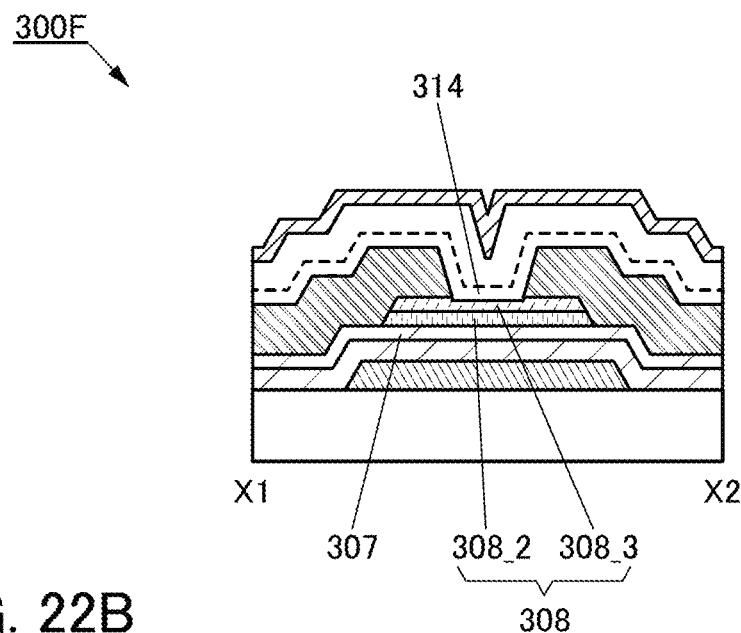
FIGS. 22A and 22B are cross-sectional views illustrating a semiconductor device.
Figure 22B:
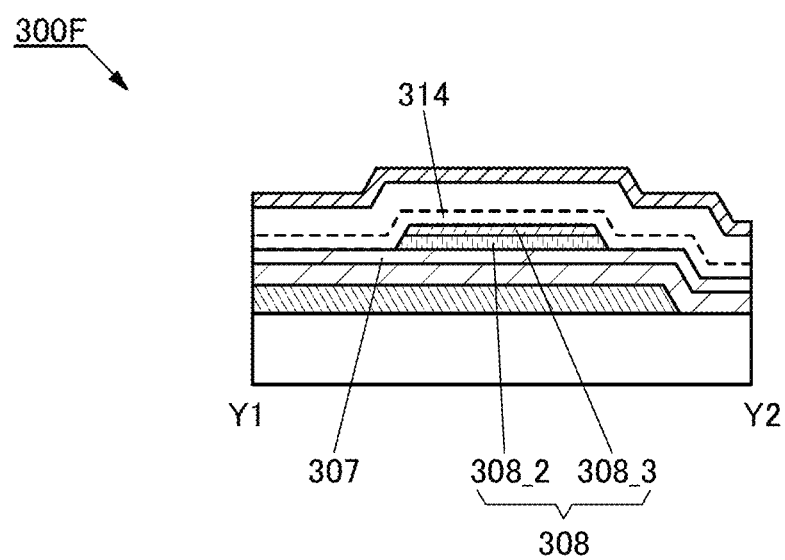

FIGS. 21A and 21B are cross-sectional views of a transistor 300E and FIGS. 22A and 22B are cross-sectional views of a transistor 300F. The top views of the transistors 300E and 300F are similar to that of the transistor 300A illustrated in FIG. 17A.

The oxide semiconductor film 308 of the transistor 300E illustrated in FIGS. 21A and 21B includes an oxide semiconductor film 308_1, an oxide semiconductor film 308_2, and an oxide semiconductor film 308_3. The oxide semiconductor film 308 of the transistor 300F illustrated in FIGS. 22A and 22B includes the oxide semiconductor film 308_2 and the oxide semiconductor film 308_3.

Note that the conductive film 304, the insulating film 306, the insulating film 307, the oxide semiconductor film 308, the oxide semiconductor film 308_1, the oxide semiconductor film 308_2, the oxide semiconductor film 308_3, the conductive films 312a and 312b, the insulating film 314, the insulating film 316, the insulating film 318, and the conductive films 320a and 320b can be formed using the materials of the conductive film 106, the insulating film 116, the insulating film 114, the oxide semiconductor film 108, the oxide semiconductor film 108_1, the oxide semiconductor film 108_2, the oxide semiconductor film 108_3, the conductive films 120a and 120b, the insulating film 104, the insulating film 118, the insulating film 116, and the conductive film 112, respectively, described in the above embodiments.

STRUCTURE EXAMPLE 6 TRANSISTOR

Figure 23A:
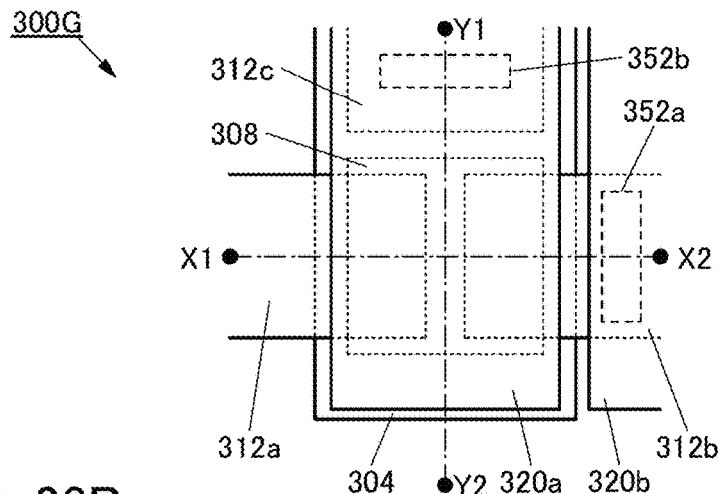
FIGS. 23A to 23C are a top view and cross-sectional views illustrating a semiconductor device.
Figure 23B:
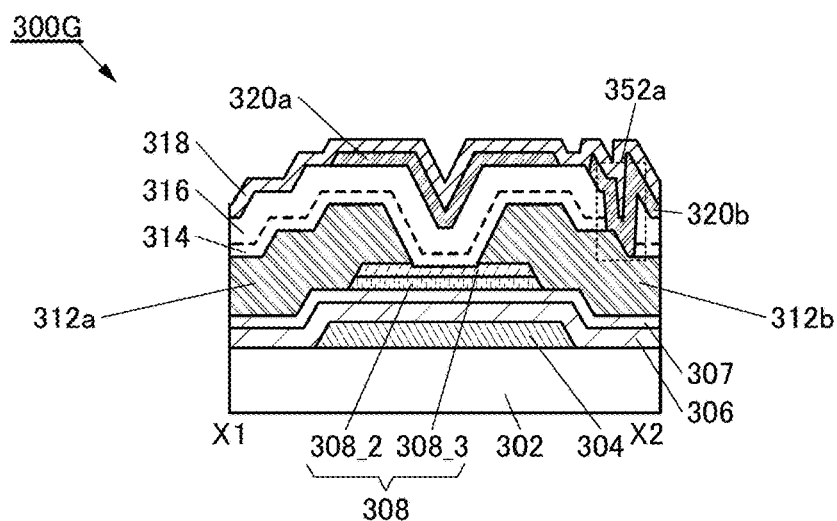
Figure 23C:
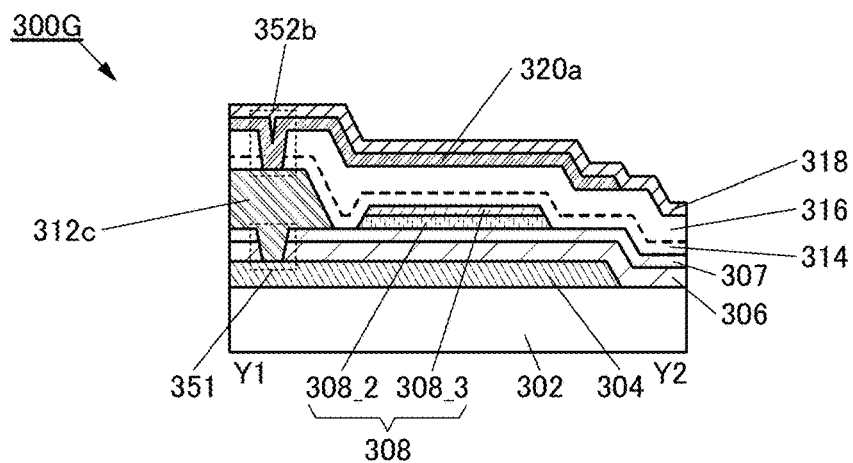

FIG. 23A is a top view of a transistor 300G. FIG. 23B is a cross-sectional view taken along dashed-dotted line X1-X2 in FIG. 23A. FIG. 23C is a cross-sectional view taken along dashed-dotted line Y1-Y2 in FIG. 23A.

The transistor 300G illustrated in FIGS. 23A to 23C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308 and the conductive films 312a and 312b, the insulating film 316 over the insulating film 314, the conductive film 320a over the insulating film 316, and the conductive film 320b over the insulating film 316.

The insulating films 306 and 307 have an opening 351. A conductive film 312c, which is electrically connected to the conductive film 304 through the opening 351, is formed over the insulating films 306 and 307. The insulating films 314 and 316 have an opening 352a that reaches the conductive film 312b and an opening 352b that reaches the conductive film 312c.

The oxide semiconductor film 308 includes the oxide semiconductor film 308_2 on the conductive film 304 side and the oxide semiconductor film 308_3 over the oxide semiconductor film 308_2.

The insulating film 318 is provided over the transistor 300G. The insulating film 318 is formed to cover the insulating film 316, the conductive film 320a, and the conductive film 320b.

In the transistor 300G, the insulating films 306 and 307 function as first gate insulating films of the transistor 300G, and the insulating films 314 and 316 function as second gate insulating films of the transistor 300G, and the insulating film 318 functions as a protective insulating film of the transistor 300G. Furthermore, in the transistor 300G, the conductive film 304 functions as a first gate electrode, the conductive film 320a functions as a second gate electrode, and the conductive film 320b functions as a pixel electrode used for a display device, for example. Moreover, in the transistor 300G, the conductive film 312a functions as a source electrode, the conductive film 312b functions as a drain electrode, and the conductive film 312c functions as a connection electrode.

Note that the transistor 300G has the S-channel structure described above.

The structures of the transistors 300A to 300G can be freely combined with each other.

At least part of this embodiment can be implemented in combination with any of the other embodiments described in this specification as appropriate.

Embodiment 4

In this embodiment, the composition and structure of an oxide semiconductor film that can be used in one embodiment of the present invention are described with reference to FIGS. 24A to 24C, FIG. 25, FIG. 26, FIGS. 27A to 27C, FIGS. 28A to 28C, FIGS. 29A to 29C, FIGS. 30A to 30C, FIGS. 31A to 31C, FIGS. 32A to 32C, FIGS. 33A and 33B, FIG. 34, FIG. 35, FIGS. 36A1 to 36C2, FIG. 37, FIGS. 38A1 to 38C2, and FIGS. 39A to 39C.

[Oxide Semiconductor Film]

The oxide semiconductor film of one embodiment of the present invention includes indium (In), M (M is Al, Ga, Y, or Sn), and zinc (Zn). Specifically, M is preferably gallium (Ga).

An oxide semiconductor film containing In has high carrier mobility (electron mobility), for example. An oxide semiconductor film has high energy gap (Eg) by containing Ga, for example. Note that Ga is an element having high bonding energy with oxygen, which is higher than the bonding energy of In with oxygen. In addition, an oxide semiconductor film containing Zn is easily crystallized.

The oxide semiconductor film of one embodiment of the present invention preferably has a crystal structure exhibiting a single phase, particularly, homologous series. For example, the oxide semiconductor film has a composition of $In_{1+x}M_{1-x}O_3(ZnO)_y$ structure (x satisfies $0<x<0.5$, and y is approximately 1) where the content of In is higher than that of M, so that the carrier density (electron mobility) of the oxide semiconductor film can be high.

In particular, the oxide semiconductor film of one embodiment of the present invention preferably has a composition in the neighborhood of the $In_{1+x}M_{1-x}O_3(ZnO)_y$ structure (x satisfies $0<x<0.5$, and y is approximately 1), specifically a composition in the neighborhood of a structure where In:M:Zn=1.33:0.67:1 (around In:M:Zn=4:2:3). The oxide semiconductor film having such a composition can have high carrier mobility and high film stability.

Note that the composition of the oxide semiconductor film is not limited thereto.

In this specification and the like, "neighborhood" means a range of ±1, preferably ±0.5 with respect to the proportion of atoms of a metal element. For example, in the case where the oxide semiconductor film has a composition in the neighborhood of In:Ga:Zn=4:2:3 where the proportion of In is 4, the proportion of Ga may be greater than or equal to 1 and less than or equal to 3 ($1 \leq Ga \leq 3$) and the proportion of Zn is greater than or equal to 2 and less than or equal to 4 ($2 \leq Zn \leq 4$), preferably the proportion of Ga is greater than or equal to 1.5 and less than or equal to 2.5 ($1.5 \leq Ga \leq 2.5$) and the proportion of Zn is greater than or equal to 2 and less than or equal to 4 ($2 \leq Zn \leq 4$).

[Composition of Oxide Semiconductor Film]

First, composition of an oxide semiconductor film is described.

An oxide semiconductor film preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor film contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in an oxide semiconductor film according to an embodiment of the present invention are described with reference to FIGS. 24A to 24C. Note that the proportion of oxygen atoms is not shown in FIGS. 24A to 24C. The terms of the atomic ratio of indium to the element M and zinc in the oxide semiconductor film are denoted by [In], [M], and [Zn], respectively.

Figure 24A:
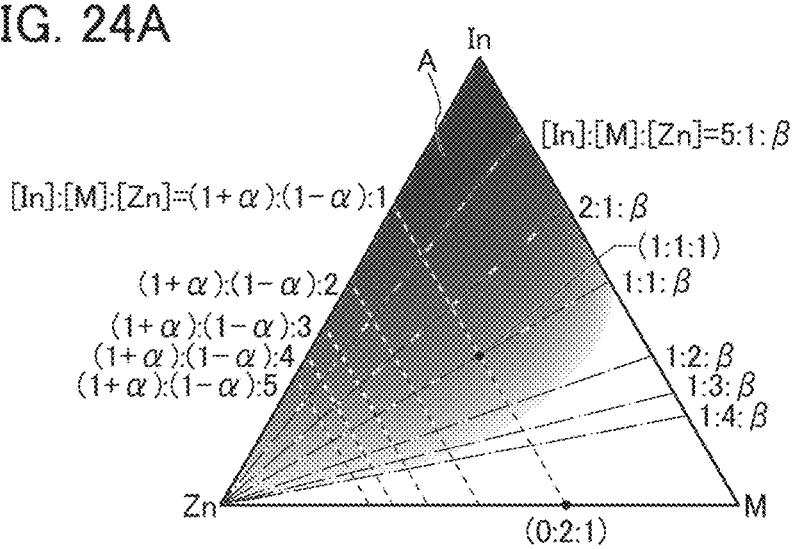
FIGS. 24A to 24C each show the range of the atomic ratio of an oxide semiconductor.
Figure 24B:
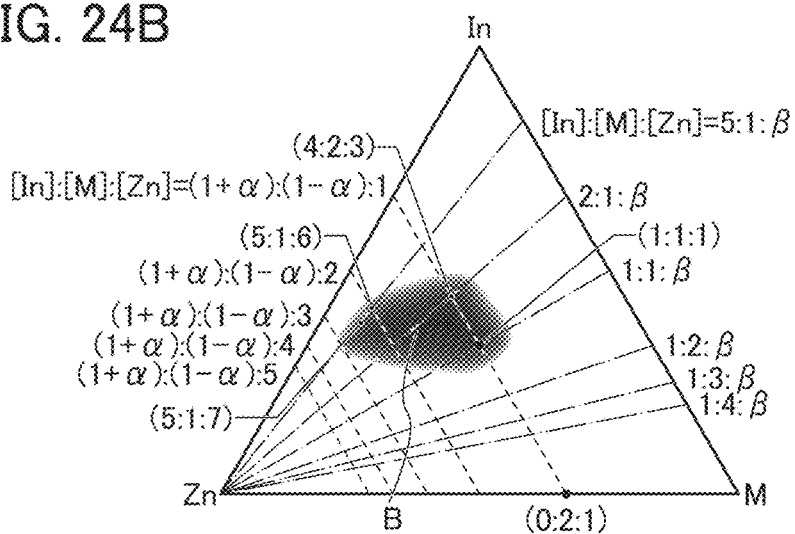
Figure 24C:
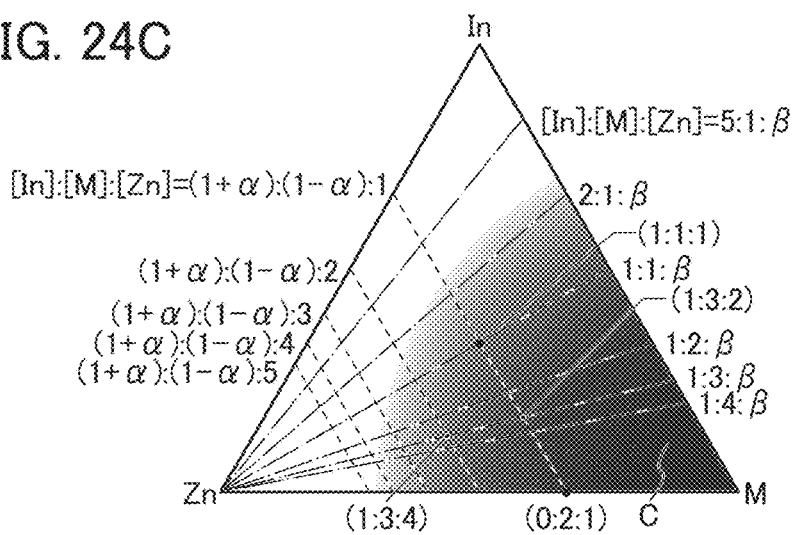

In FIGS. 24A to 24C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \leq 0$, a line where the atomic ratio [In]:[M]:[Zn] is $1:2\beta$, a line where the atomic ratio [In]:[M]:[Zn] is $1:3\beta$, a line where the atomic ratio [In]:[M]:[Zn] is $1:4\beta$, a line where the atomic ratio [In]:[M]:[Zn] is $2:1\beta$, and a line where the atomic ratio [In]:[M]:[Zn] is $5:1:\beta$.

An oxide semiconductor film having the atomic ratio of [In]:[M]:[Zn]=0:2:1 or a neighborhood thereof in FIGS. 24A to 24C tends to have a spinel crystal structure.

FIGS. 24A and 24B show examples of the preferred ranges of the atomic ratio of indium, the element M, and zinc contained in an oxide semiconductor film in one embodiment of the present invention.

Figure 25:
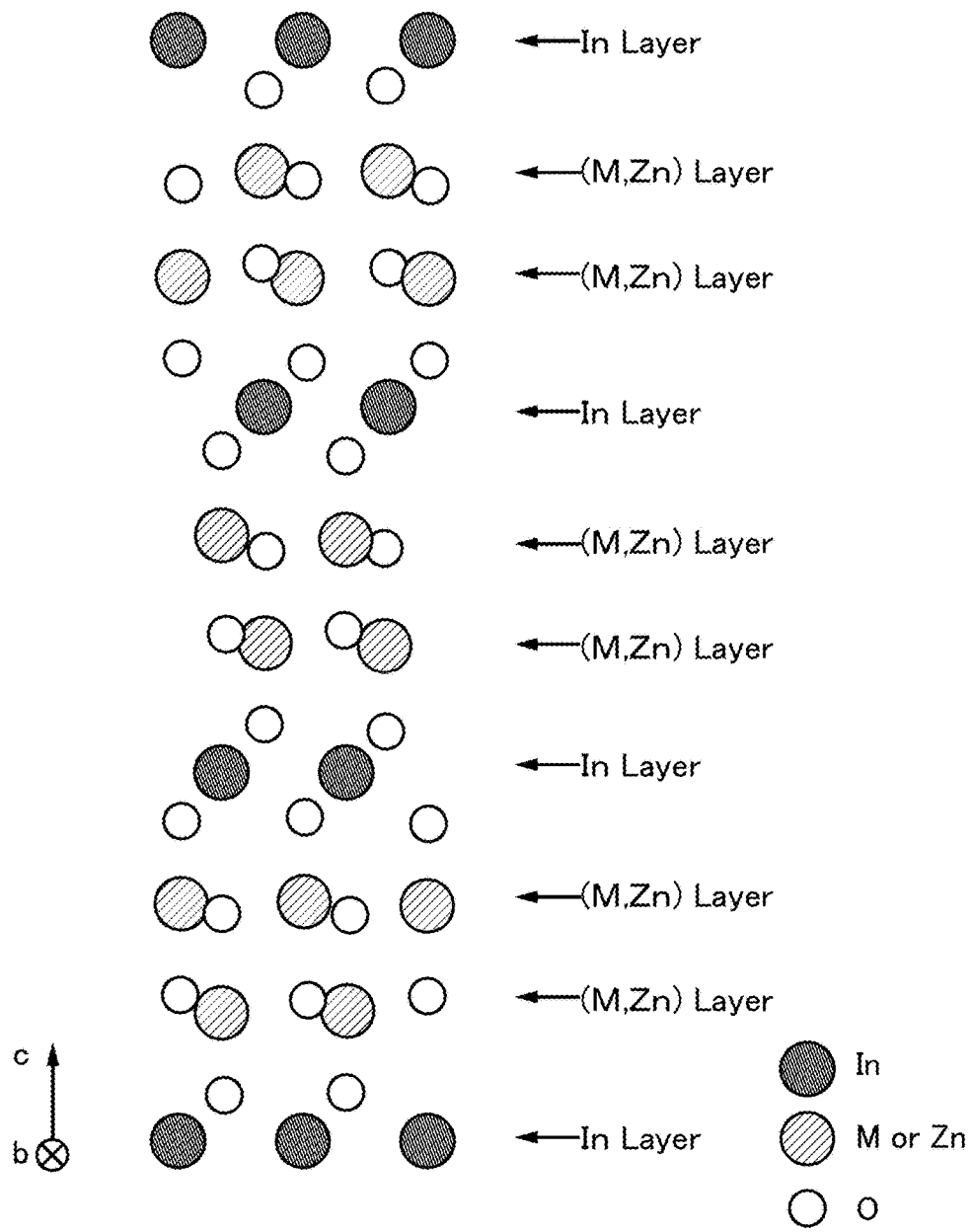
FIG. 25 illustrates a crystal of $InMZnO_4$.

FIG. 25 illustrates an example of the crystal structure of $InMZnO_4$ whose atomic ratio of [In]:[M]:[Zn] is 1:1:1. The crystal structure illustrated in FIG. 25 is $InMZnO_4$ observed from a direction parallel to a b-axis. Note that a metal element in a layer that contains M, Zn, and oxygen (hereinafter, this layer is referred to as an "(M,Zn) layer") in FIG. 25 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 25.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide semiconductor film whose atomic ratio [In]:[M]:[Zn] is 1:1:2 has a layered structure that includes one In layer for every three (M,Zn) layers. In other words, if [Zn] is higher than [In] and [M], the proportion of the (M,Zn) layer to the In layer becomes higher when the oxide semiconductor film is crystallized.

Note that in the case where the number of (M,Zn) layers for every In layers is not an integer in the oxide semiconductor film, the oxide semiconductor film might have plural kinds of layered structures where the number of (M,Zn) layers for every In layers is an integer. For example, in the case of [In]:[M]:[Zn]=1:1:1.5, the oxide semiconductor film might have the following layered structures: a layered structure of one In layer for every two (M,Zn) layers and a layered structure of one In layer for every three (M,Zn) layers.

For example, in the case where the oxide semiconductor film is formed with a sputtering apparatus, a film having an atomic ratio deviated from the atomic ratio of a target is formed. In particular, [Zn] in the film might be lower than [Zn] in the target depending on the substrate temperature in deposition.

A plurality of phases (e.g., two phases or three phases) exists in the oxide semiconductor film in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor film, a grain boundary might be formed between different crystal structures.

In contrast, when the indium content and the zinc content in an oxide semiconductor film become lower, carrier mobility becomes lower. Thus, with atomic ratios of [In]:[M]:[Zn]=0:1:0 and in the vicinity thereof (e.g., a region C in FIG. 24C), insulation performance becomes better.

Accordingly, an oxide semiconductor film in one embodiment of the present invention preferably has an atomic ratio represented by a region A in FIG. 24A. With the atomic ratio, a layered structure with high carrier mobility and a few grain boundaries is easily obtained.

A region B in FIG. 24B represents an atomic ratio of [In]:[M]:[Zn]=4:2:3 or 4:2:4.1 and the vicinity thereof. The vicinity includes an atomic ratio of [In]:[M]:[Zn]=5:3:4. An oxide semiconductor film with an atomic ratio represented by the region B is an excellent oxide semiconductor film that has particularly high crystallinity and high carrier mobility.

Note that a condition where an oxide semiconductor film forms a layered structure is not uniquely determined by an atomic ratio. There is a difference in the degree of difficulty in forming a layered structure among atomic ratios. Even with the same atomic ratio, whether a layered structure is formed or not depends on a formation condition. Thus, the illustrated regions each represent an atomic ratio with which an oxide semiconductor film has a layered structure, and boundaries of the regions A to C are not clear.

[Carrier Density of Oxide Semiconductor Film]

Next, the carrier density of an oxide semiconductor film will be described below.

Examples of a factor affecting the carrier density of an oxide semiconductor film include oxygen vacancy ($V_O$) and impurities in the oxide semiconductor film.

As the amount of oxygen vacancy in the oxide semiconductor film increases, the density of defect states increases when hydrogen is bonded to the oxygen vacancy (this state is also referred to as $V_OH$). The density of defect states also increases with an increase in the amount of impurity in the oxide semiconductor film. Hence, the carrier density of an oxide semiconductor film can be controlled by controlling the density of defect states in the oxide semiconductor film.

A transistor using the oxide semiconductor film in a channel region will be described below.

The carrier density of the oxide semiconductor film is preferably reduced in order to inhibit the negative shift of the threshold voltage of the transistor or reduce the off-state current of the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor film is lower than $8\times10^{15}$ cm$^{-3}$, preferably lower than $1\times10^{11}$ cm$^{-3}$, and further preferably lower than $1\times10^{10}$ cm$^3$ and is higher than or equal to $1\times10^{-9}$ cm$^3$.

In contrast, the carrier density of the oxide semiconductor film is preferably increased in order to improve the on-state current of the transistor or improve the field-effect mobility of the transistor. In order to increase the carrier density of the oxide semiconductor film, the impurity concentration or the density of defect states in the oxide semiconductor film is slightly increased. Alternatively, the bandgap of the oxide semiconductor film is preferably narrowed. For example, an oxide semiconductor film that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor film that has a high electron affinity and thus has a narrow bandgap so as to increase the density of thermally excited electrons (carriers) can be regarded as substantially intrinsic. Note that a transistor using an oxide semiconductor film with higher electron affinity has lower threshold voltage.

The carrier density of a substantially intrinsic oxide semiconductor film is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^3$, still further preferably higher than or equal to $1\times10^9$ cm$^3$ and lower than or equal to $5\times10^{16}$ cm$^3$, yet further preferably higher than or equal to $1\times10^{10}$ cm$^3$ and lower than or equal to $1\times10^{16}$ cm$^3$, and yet still preferably higher than or equal to $1\times10^{11}$ cm$^3$ and lower than or equal to $1\times10^{15}$ cm$^{-3}$.

Figure 26:
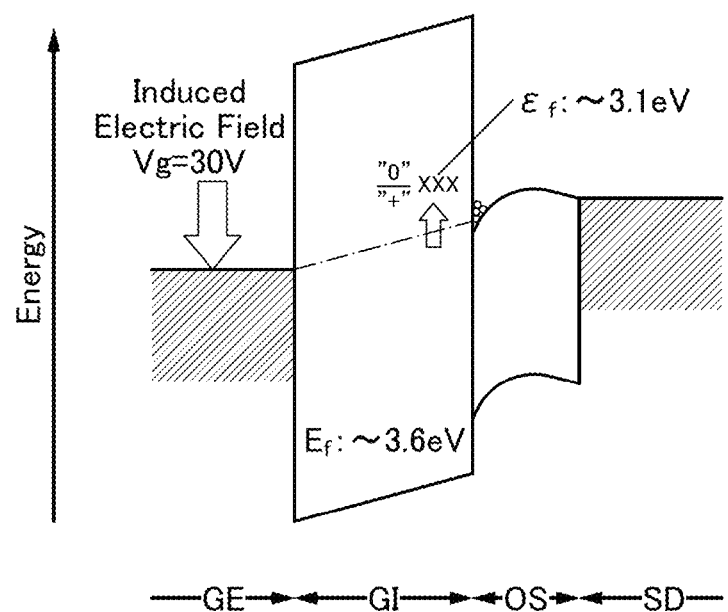
FIG. 26 is an energy band diagram of the transistor in which the oxide semiconductor is used for the channel region.

The use of the substantially intrinsic oxide semiconductor film may improve the reliability of a transistor. Here, the reason for the improvement in the reliability of a transistor which uses the oxide semiconductor film in its channel region is described with reference to FIG. 26. FIG. 26 is an energy band diagram of the transistor which uses the oxide semiconductor film in its channel region.

In FIG. 26, GE, GI, OS, and SD refer to a gate electrode, a gate insulating film, an oxide semiconductor film, and a source/drain electrode, respectively. In other words, FIG. 26 shows an example of energy bands of the gate electrode, the gate insulating film, the oxide semiconductor film, and the source/drain electrode in contact with the oxide semiconductor film.

In FIG. 26, a silicon oxide film and an In—Ga—Zn oxide are used as the gate insulating film and the oxide semiconductor film, respectively. The transition level (a) of a defect that might be formed in the silicon oxide film is assumed to be formed at a position approximately 3.1 eV away from the conduction band minimum of the gate insulating film. Furthermore, the Fermi level ($E_f$) of the silicon oxide film at the interface between the oxide semiconductor and the silicon oxide film when the gate voltage ($V_g$) is 30 V is assumed to be formed at a position approximately 3.6 eV away from the conduction band minimum of the gate insulating film. Note that the Fermi level of the silicon oxide film changes depending on the gate voltage. For example, the Fermi level ($E_f$) of the silicon oxide film at the interface between the oxide semiconductor film and the silicon oxide film is lowered as the gate voltage is increased. A white circle and x in FIG. 26 represent an electron (carrier) and a defect state in the silicon oxide film, respectively.

As shown in FIG. 26, when thermal excitation of carriers occurs during the application of a gate voltage, the carriers are trapped by the defect states (x in the diagram) and the charge state of each of the defect states is changed from positive ("+") to neutral ("0"). In other words, when the value obtained by adding the thermal excitation energy to the Fermi level ($\varepsilon_f$) of the silicon oxide film becomes greater than the transition level ($\varepsilon_f$) of the defect, the charge state of the defect states in the silicon oxide film is changed from positive to neutral, so that the threshold voltage of the transistor shifts in the positive direction.

When an oxide semiconductor film with a different electron affinity is used, the Fermi level of the interface between the gate insulating film and the oxide semiconductor film might be changed. When an oxide semiconductor film with a higher electron affinity is used, the conduction band minimum of the gate insulating film becomes relatively high at the interface between the gate insulating film and the oxide semiconductor film or in the vicinity of the interface. In that case, the defect state (x in FIG. 26) which might be formed in the gate insulating film also becomes relatively high, so that the energy difference between the Fermi level of the gate insulating film and the Fermi level of the oxide semiconductor film is increased. The increase in energy difference leads to a reduction in the amount of charge trapped in the gate insulating film. For example, a change in the charge state of the defect states which might be formed in the silicon oxide film becomes smaller, so that a change in the threshold voltage of the transistor by gate bias temperature (GBT) stress can be reduced.

Note that when the oxide semiconductor film is used for a channel region of a transistor, carrier scattering or the like at a grain boundary can be reduced; thus, the transistor can have high field-effect mobility. In addition, the transistor can have high reliability.

Charge trapped by the defect states in the oxide semiconductor film takes a long time to be released and may behave like fixed charge. Thus, the transistor in which a channel region is formed in the oxide semiconductor having a high density of defect states might have unstable electrical characteristics.

To obtain stable electrical characteristics of the transistor, it is effective to reduce the concentration of impurities in the oxide semiconductor film. In order to reduce the concentration of impurities in the oxide semiconductor film, the concentration of impurities in a film which is adjacent to the oxide semiconductor film is preferably reduced. As examples of the impurities, hydrogen, nitrogen, alkali metal, alkaline earth metal, iron, nickel, silicon, and the like are given.

Here, the influence of impurities in the oxide semiconductor film is described.

When silicon or carbon that is one of Group 14 elements is contained in the oxide semiconductor, defect states are formed. Thus, the concentration of silicon or carbon in the oxide semiconductor film and around an interface with the oxide semiconductor film (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor film contains alkali metal or alkaline earth metal, defect states are formed and carriers are generated, in some cases. Thus, a transistor including an oxide semiconductor film that contains alkali metal or alkaline earth metal is likely to be normally-on. Therefore, it is preferable to reduce the concentration of alkali metal or alkaline earth metal in the oxide semiconductor film. Specifically, the concentration of alkali metal or alkaline earth metal in the oxide semiconductor film measured by SIMS is set lower than or equal to $1\times10^{18}$ atoms/cm$^3$, and preferably lower than or equal to $2\times10^{16}$ atoms/cm$^3$.

When the oxide semiconductor film contains nitrogen, the oxide semiconductor film easily becomes n-type by generation of electrons serving as carriers and an increase of carrier density. Thus, a transistor whose semiconductor includes an oxide semiconductor film that contains nitrogen is likely to be normally-on. For example, the concentration of nitrogen in the oxide semiconductor, which is measured by SIMS, can be lower than or equal to $6\times10^{20}$ atoms/cm$^3$ or lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor film reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally-on. Accordingly, it is preferable that hydrogen in the oxide semiconductor film be reduced as much as possible. Specifically, the hydrogen concentration of the oxide semiconductor film measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor film with sufficiently reduced impurity concentration is used for a channel formation region in a transistor, the transistor can have stable electrical characteristics.

The energy gap of the oxide semiconductor film is preferably 2 eV or more or 2.5 eV or more.

The thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 60 nm.

[Structure of Oxide Semiconductor Film]

Next, a structure of the oxide semiconductor film is described.

An oxide semiconductor film is classified into a single crystal oxide semiconductor film and a non-single-crystal oxide semiconductor film. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor film is classified into an amorphous oxide semiconductor film and a crystalline oxide semiconductor film. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

In other words, a stable oxide semiconductor film cannot be regarded as a completely amorphous oxide semiconductor film. Moreover, an oxide semiconductor film that is not isotropic (e.g., an oxide semiconductor film that has a periodic structure in a microscopic region) cannot be regarded as a completely amorphous oxide semiconductor film. In contrast, an a-like OS, which is not isotropic, has an unstable structure that contains a void. Because of its instability, an a-like OS is close to an amorphous oxide semiconductor in terms of physical properties.

[CAAC-OS]

First, a CAAC-OS will be described.

A CAAC-OS is one of oxide semiconductors having a plurality of c-axis aligned crystal parts (also referred to as pellets).

As described above, the CAAC-OS is an oxide semiconductor with high crystallinity. Entry of impurities, formation of defects, or the like might decrease the crystallinity of an oxide semiconductor film. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. Further, a heavy metal such as iron or nickel, argon, carbon dioxide, or the like has a large atomic radius (molecular radius), and thus disturbs the atomic arrangement of the oxide semiconductor and causes a decrease in crystallinity.

[nc-OS]

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

The nc-OS is an oxide semiconductor that has high regularity than an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS in some cases.

[a-like OS]

An a-like OS has a structure intermediate between those of the nc-OS and the amorphous oxide semiconductor.

The a-like OS contains a void or a low-density region. The a-like OS has an unstable structure because it contains a void.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Accordingly, for the oxide semiconductor film having an atomic ratio of In:Ga:Zn=1:1:1, for example, the density of the a-like OS is higher than or equal to 5.0 $g/cm^3$ and lower than 5.9 $g/cm^3$, and the density of each of the nc-OS and the CAAC-OS is higher than or equal to 5.9 $g/cm^3$ and lower than 6.3 $g/cm^3$.

In the case where an oxide semiconductor having a certain composition does not exist in a single-crystal state, single-crystal oxide semiconductors with different compositions are combined at an adequate ratio, which makes it possible to calculate a density equivalent to that of a single-crystal oxide semiconductor with the desired composition. The density of a single-crystal oxide semiconductor having the desired composition may be calculated using a weighted average with respect to the combination ratio of the single-crystal oxide semiconductors with different compositions.

Note that it is preferable to use as few kinds of single-crystal oxide semiconductors as possible to calculate the density.

As described above, oxide semiconductors have various structures and various properties. In the oxide semiconductor film of one embodiment of the present invention, two or more of an amorphous oxide semiconductor, an a-like OS, an nc-OS, and a CAAC-OS may be mixed. An example of such a case is described below.

The oxide semiconductor film of one embodiment of the present invention can include two kinds of crystal parts. That is, two kinds of crystal parts are mixed in the oxide semiconductor film. One is a crystal part (also referred to as a first crystal part) having orientation in the thickness direction (also referred to as a film-plane direction, or a direction perpendicular to a formation surface or a film surface), i.e., a crystal part having c-axis alignment. The other is a crystal part (also referred to as a second crystal part) which does not have c-axis alignment and has random orientation.

Although crystal parts are divided into the two categories for simplicity: the first crystal part having c-axis alignment and the second crystal part having no c-axis alignment, the first crystal part and the second crystal part cannot be distinguished from each other in some cases because there is not much difference in crystallinity, crystal size, and the like. That is, the oxide semiconductor film of one embodiment of the present invention can be described without a distinction between the first crystal part and the second crystal part.

For example, the oxide semiconductor film of one embodiment of the present invention includes a plurality of crystal parts, and at least one of the crystal parts may have c-axis alignment. Furthermore, in the crystal parts existing in the film, the proportion of crystal parts having no c-axis alignment may be higher than that of crystal parts having c-axis alignment. For example, in a transmission electron microscope image of a cross section of the oxide semiconductor film which is one embodiment of the present invention in the thickness direction, a plurality of crystal parts are observed and the second crystal parts having no c-axis alignment are observed at a higher proportion than the first crystal parts having c-axis alignment in some cases. In other words, the oxide semiconductor film of one embodiment of the present invention has a high proportion of second crystal parts having no c-axis alignment.

When the oxide semiconductor film has a high proportion of second crystal parts having no c-axis alignment, the following effects can be obtained.

In the case where a source which supplies sufficient oxygen is provided in the vicinity of the oxide semiconductor film, the second crystal part having no c-axis alignment can serve as an oxygen diffusion path. Thus, in the case where a source which supplies sufficient oxygen is provided in the vicinity of the oxide semiconductor film, oxygen can be supplied from the source to the first crystal part having c-axis alignment through the second crystal part having no c-axis alignment. Accordingly, the amount of oxygen vacancy in the oxide semiconductor film can be reduced. When such an oxide semiconductor film is used as a semiconductor film of a transistor, high reliability and high field-effect mobility can be obtained.

In the first crystal part, particular crystal planes are aligned in the thickness direction. Accordingly, when an X-ray diffraction (XRD) measurement is performed in a direction substantially perpendicular to the top surface of the oxide semiconductor film including the first crystal parts, a diffraction peak derived from the first crystal parts is observed at a predetermined diffraction angle (2θ). However, even when the oxide semiconductor film includes the first crystal parts, a diffraction peak is not sufficiently observed in some cases because of x-rays scattering or increase in background due to a support substrate. Note that the higher the proportion of the first crystal parts in the oxide semiconductor film is, the higher the diffraction peak becomes; thus, the height (intensity) of the diffraction peak can be an indicator of crystallinity of the oxide semiconductor film.

As an example of a method for evaluating crystallinity of the oxide semiconductor film, electron diffraction can be given. For example, in the case where an electron diffraction measurement is performed on a cross section of the oxide semiconductor film of one embodiment of the present invention and an electron diffraction pattern thereof is observed, first regions including diffraction spots derived from the first crystal parts and second regions including diffraction spots derived from the second crystal parts are observed.

The first regions including diffraction spots derived from the first crystal parts are derived from crystal parts having c-axis alignment. The second regions including diffraction spots derived from the second crystal parts are derived from crystal parts having no orientation or crystal parts having random orientation. Therefore, different patterns are observed in accordance with the diameter of an electron beam, i.e., the area of an observed region in some cases. Note that in this specification and the like, electron diffraction with an electron beam having a diameter of 1 nmφ to 100 nmφ inclusive is referred to as nanobeam electron diffraction (NBED).

Note that the crystallinity of the oxide semiconductor film of one embodiment of the present invention may be evaluated by a method different from NBED. As examples of a method for evaluating crystallinity of the oxide semiconductor film, electron diffraction, x-ray diffraction, neutron diffraction, and the like can be given. Among the electron diffractions, transmission electron microscopy (TEM), scanning electron microscopy (SEM), convergent beam electron diffraction (CBED), selected-area electron diffraction (SAED), and the like can be favorably used in addition to the above NBED.

In NBED, a ring-like pattern is observed in a nanobeam electron diffraction pattern obtained by using an electron beam having a large diameter (e.g., greater than or equal to 25 nmφ and less than or equal to 100 nmφ, or greater than or equal to 50 nmφ and less than or equal to 100 nmφ). The ring-like pattern has luminance distribution in a radial direction in some cases. On the other hand, in an electron diffraction pattern of NBED obtained by using an electron beam having a sufficiently small diameter (e.g., greater than or equal to 1 nmφ and less than or equal to 10 nmφ), a plurality of spots distributed in a circumferential direction (also referred to as θ direction) are observed at the position of the ring-like pattern. That is, the ring-like pattern obtained by using an electron beam having a large diameter is formed from an aggregate of the plurality of spots.

For example, in an electron diffraction pattern of a cross section of a film where crystal parts having orientation and crystal parts having no orientation are mixed, which is obtained by using an electron beam having a sufficiently large diameter, spots derived from the crystal parts having orientation and a ring-like pattern derived from the crystal parts having no orientation exist together. In an electron diffraction pattern of the cross section obtained by using an electron beam having a sufficiently small diameter, spots derived from crystal parts having orientation and a plurality of spots distributed in the circumferential direction derived from crystal parts having no orientation exist together.

When the proportion of crystal parts having orientation in the film is high, an electron diffraction pattern in which a high anisotropic pattern is more dominant is obtained. For example, in an electron diffraction pattern obtained by using an electron beam having a sufficiently large diameter, the luminance of the ring-like pattern is relatively lower than that of the spots derived from crystal parts having orientation.

In the case of an amorphous film having no crystal parts, when electron diffraction is measured with an electron beam incident from the direction perpendicular to a cross section of the film, no diffraction peak is observed and a halo pattern derived from inelastic scatterings is observed in an electron diffraction pattern. In the obtained electron diffraction pattern, the halo pattern does not have orientation and is circularly symmetric about a spot of the incident electron beam (also referred to as a direct spot). In electron diffraction using an electron beam having a sufficiently large diameter, a film including only crystal parts having no orientation, a film in which crystal parts having no orientation and an amorphous region are mixed, and an amorphous film having no crystal parts cannot be distinguished from one another in some cases. Crystal parts having no orientation can be observed by electron diffraction obtained by using an electron beam having a sufficiently small diameter.

[Evaluation of Crystallinity of Oxide Semiconductor Film]

Three samples (Samples X1 to X3) each including an oxide semiconductor film were formed and the crystallinity of each of the samples was evaluated. Three kinds of oxide semiconductor films were formed in different conditions. First, methods for forming Samples X1 to X3 are described.

[Sample]

{Sample X1}

Sample X1 is a sample in which an approximately 100-nm-thick oxide semiconductor film is formed over a glass substrate. The oxide semiconductor film contains indium, gallium, and zinc. The oxide semiconductor film used for Sample X1 was formed under the following conditions: the substrate temperature was 170° C.; an argon gas with a flow rate of 140 sccm and an oxygen gas with a flow rate of 60 sccm were introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=4:2:4.1). Note that the oxygen flow rate percentage under the formation conditions for Sample X1 was 30%.

{Sample X2}

Sample X2 is a sample in which an approximately 100-nm-thick oxide semiconductor film is formed over a glass substrate. The oxide semiconductor film used for Sample X2 was formed under the following conditions: the substrate temperature was 130° C.; and an argon gas with a flow rate of 180 sccm and an oxygen gas with a flow rate of 20 sccm were introduced into a chamber of the sputtering apparatus. The oxygen flow rate percentage under the formation conditions for Sample X2 was 10%. Note that the conditions other than the substrate temperature and the oxygen flow rate percentage are the same as those for Sample X1.

{Sample X3}

Sample X3 is a sample in which an approximately 100-nm-thick oxide semiconductor film is formed over a glass substrate. The oxide semiconductor film used for Sample X3 was formed under the following conditions: the substrate temperature was room temperature (R.T.); and an argon gas with a flow rate of 180 sccm and an oxygen gas with a flow rate of 20 sccm were introduced into a chamber of the sputtering apparatus. The oxygen flow rate percentage under the formation conditions for Sample X3 was 10%. Note that the conditions other than the substrate temperature and the oxygen flow rate percentage are the same as those for Sample X1.

The conditions for forming Samples X1 to X3 are shown in Table 1.

TABLE 1

|  | Target [atomic ratio] | Substrate temperature [° C.] | Pressure [Pa] | Oxygen flow rate [%] |
|---|---|---|---|---|
| Sample X1 | In:Ga:Zn = 4:2:4.1 | 170 | 0.6 | 30 |
| Sample X2 | In:Ga:Zn = 4:2:4.1 | 130 | 0.6 | 10 |
| Sample X3 | In:Ga:Zn = 4:2:4.1 | R.T. | 0.6 | 10 |

Next, the crystallinity of Samples X1 to X3 was evaluated. In this embodiment, cross-sectional TEM observation, XRD measurement, and electron diffraction were performed to evaluate crystallinity.

[Cross-Sectional TEM Observation]

Figure 27A:
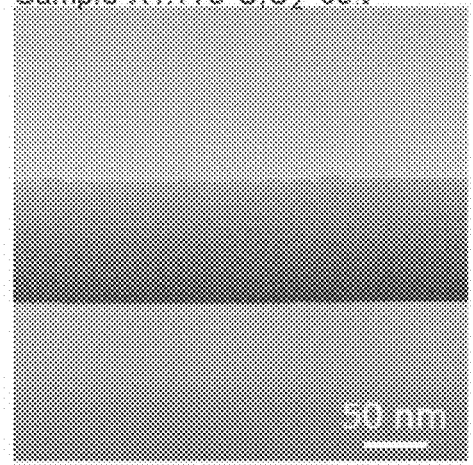
FIGS. 27A to 27C are cross-sectional TEM images and a cross-sectional HR-TEM image of an oxide semiconductor film.
Figure 27B:
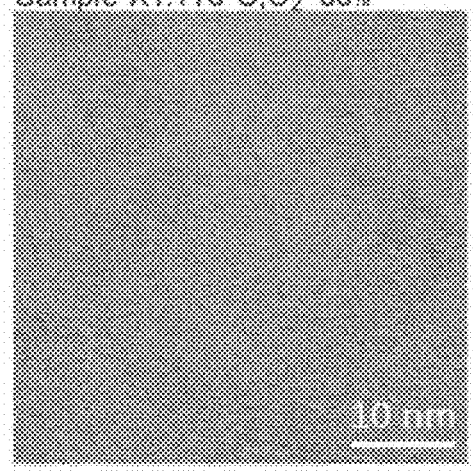
Figure 27C:
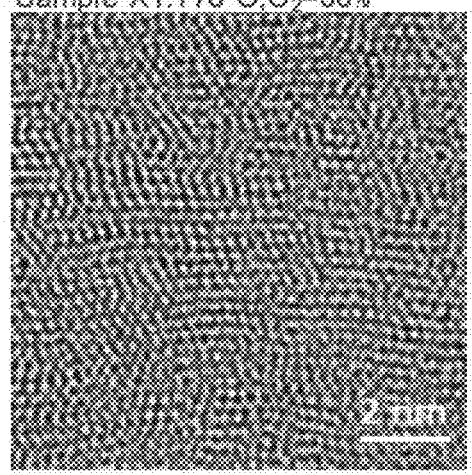
Figure 28A:
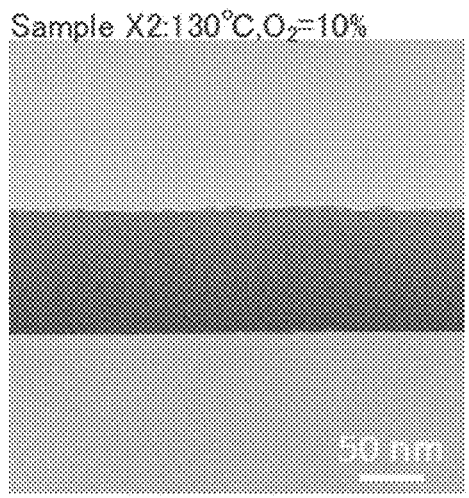
FIGS. 28A to 28C are cross-sectional TEM images and a cross-sectional HR-TEM image of an oxide semiconductor film.
Figure 28B:
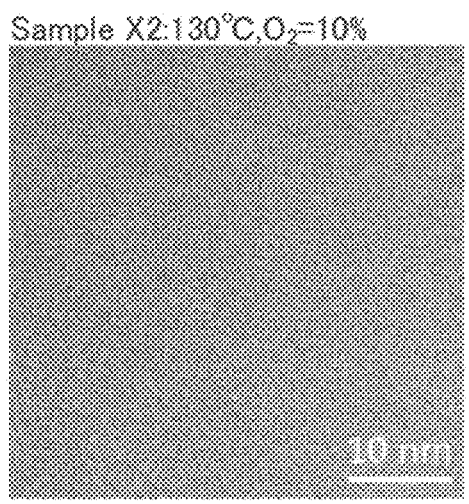
Figure 28C:
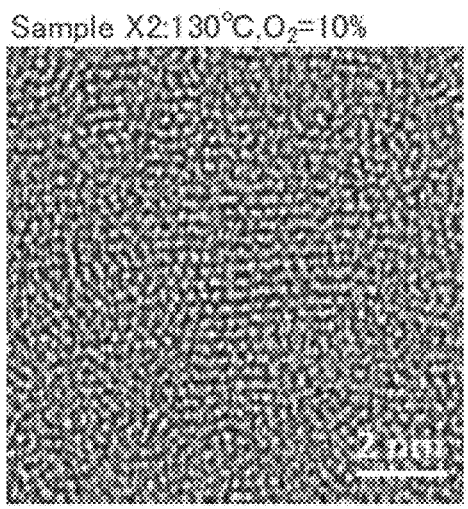
Figure 29A:
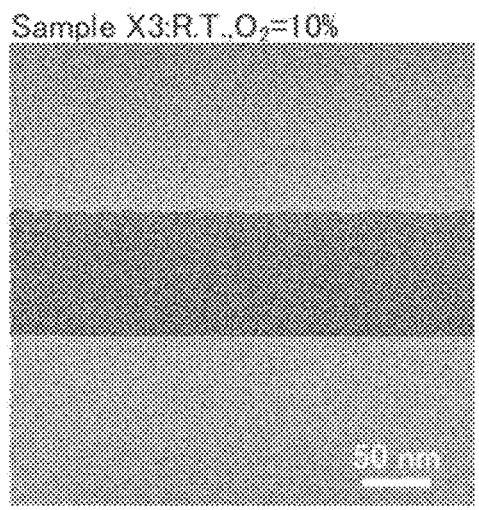
FIGS. 29A to 29C are cross-sectional TEM images and a cross-sectional HR-TEM image of an oxide semiconductor film.
Figure 29B:
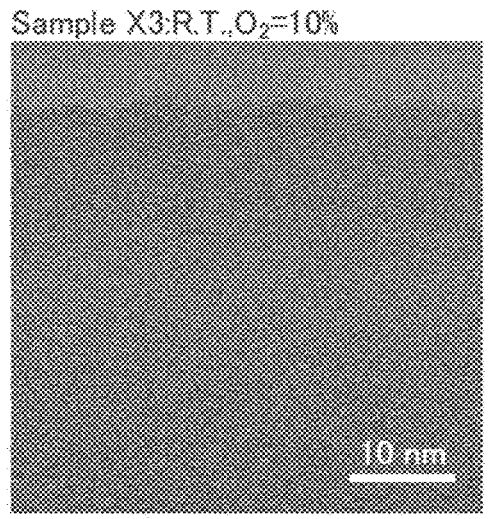

FIGS. 27A to 27C, FIGS. 28A to 28C, and FIGS. 29A to 29C show cross-sectional TEM observation results of Samples X1 to X3. FIGS. 27A and 27B are cross-sectional TEM images of Sample X1. FIGS. 28A and 28B are cross-sectional TEM images of Sample X2. FIGS. 29A and 29B are cross-sectional TEM images of Sample X3.

Figure 29C:
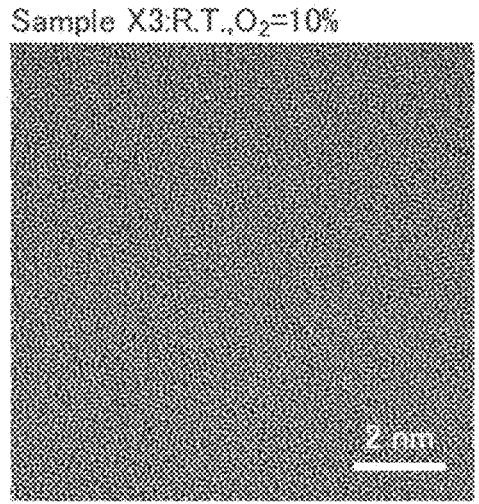

FIG. 27C, FIG. 28C, and FIG. 29C are cross-sectional high resolution transmission electron microscope (HR-TEM) images of Sample X1, Sample X2, and Sample X3, respectively. The cross-sectional HR-TEM images may be obtained with a spherical aberration corrector function. The high-resolution TEM image obtained with a spherical aberration corrector function is particularly referred to as a $C_S$-corrected high-resolution TEM image. The $C_S$-corrected high-resolution TEM image can be observed with, for example, an atomic resolution analytical electron microscope JEM-ARM200F manufactured by JEOL Ltd.

As shown in FIGS. 27A to 27C and FIGS. 28A to 28C, crystal parts in which atoms are aligned in a layered manner in the thickness direction are observed in Sample X1 and Sample X2. In particular, in HR-TEM images, crystal parts in which atoms are aligned in a layered manner are easily observed. As shown in FIGS. 29A to 29C, the state where atoms are aligned in a layered manner in the thickness direction is unlikely to be observed in Sample X3.

[XRD Measurement]

Next, XRD measurement results of the samples will be described.

Figure 30A:
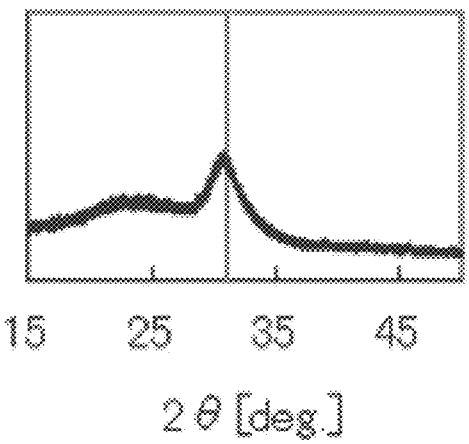
FIGS. 30A to 30C show XRD measurement results and electron diffraction patterns of an oxide semiconductor film.
Figure 31A:
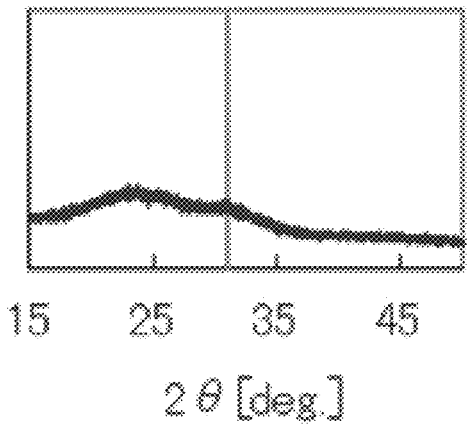
FIGS. 31A to 31C show XRD measurement results and electron diffraction patterns of an oxide semiconductor film.

FIG. 30A, FIG. 31A, and FIG. 32A show XRD measurement results of Sample X1, Sample X2, and Sample X3, respectively.

The XRD measurement was conducted by a powder method (also referred to as a θ-2θ method) which is a kind of an out-of-plane method. Note that in a θ-2θ method, X-ray diffraction intensity is measured while an incident angle of an X-ray is changed and the angle of a detector facing an X-ray source is equal to the incident angle. Note that a grazing-incidence XRD (GIXRD) method (also referred to as a thin film method or a Seemann-Bohlin method) may be used. The GIXRD method is a kind of an out-of-plane method for measuring X-ray diffraction intensity in which X-ray is incident at an angle approximately 0.40° from a film surface with use of a variable-angle detector. In FIG. 30A, FIG. 31A, and FIG. 32A, the vertical axis represents diffraction intensity in arbitrary unit and the horizontal axis represents the angle 2θ.

As shown in FIG. 30A and FIG. 31A, a peak of diffraction intensity is observed at around 2θ=31° in each of Sample X1 and Sample X2. In contrast, as shown in FIG. 32A, in Sample X3, a peak of diffraction intensity at around 2θ=31° is unlikely to be observed. Alternatively, a peak of diffraction intensity at around 2θ=31° is extremely small or does not exist.

The diffraction angle (at around 2θ=31°) at which the peak of the diffraction intensity was observed corresponds to a diffraction angle on the (009) plane of the structure model of single crystal $InGaZnO_4$. Accordingly, the above peaks indicate that each of Samples X1 and X2 includes a crystal part where the c-axes are aligned in the thickness direction (hereinafter also referred to as a crystal part having c-axis alignment or a first crystal part). Note that it is difficult to determine, by XRD measurement, whether a crystal part having c-axis alignment is included in Sample X3.

[Electron Diffraction]

Next, electron diffraction measurement results of Samples X1 to X3 are described below. In the electron diffraction measurement, a diffraction pattern was obtained in such a manner that each of the samples is irradiated with an electron beam incident in a direction perpendicular to its cross section. The electron-beam diameters were set to 1 nmφ and 100 nmφ.

In electron diffraction, as the diameter of an incident electron beam is larger and the thickness of sample is larger, information of the sample in the depth direction is likely to be shown in the electron diffraction pattern. Therefore, the information of local regions can be obtained by reducing not only the diameter of the electron beam but also the thickness of the sample in the depth direction. In contrast, when the thickness of the sample in the depth direction is too small (e.g., the thickness of the sample in the depth direction is less than or equal to 5 nm), information of only submicroscopic region is obtained. Thus, an electron diffraction pattern obtained when a crystal exists in the submicroscopic region is similar to an electron diffraction pattern of a single crystal in some cases. When the aim is not to analyze the submicroscopic region, the thickness of the sample in the depth direction is preferably greater than or equal to 10 nm and less than or equal to 100 nm, typically greater than or equal to 10 nm and less than or equal to 50 nm.

Figure 30B:
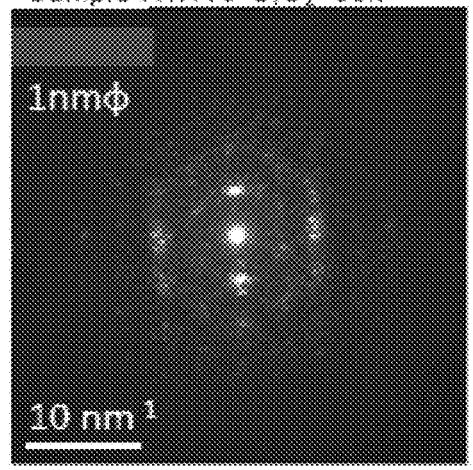
Figure 30C:
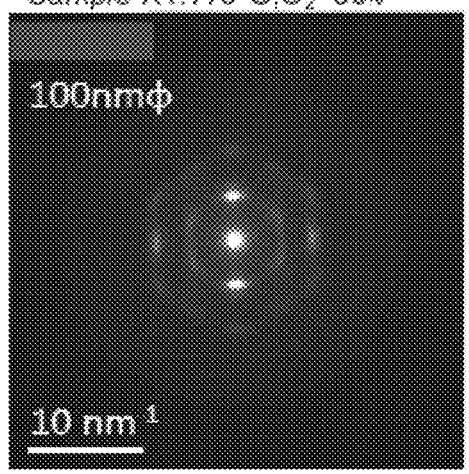
Figure 31B:
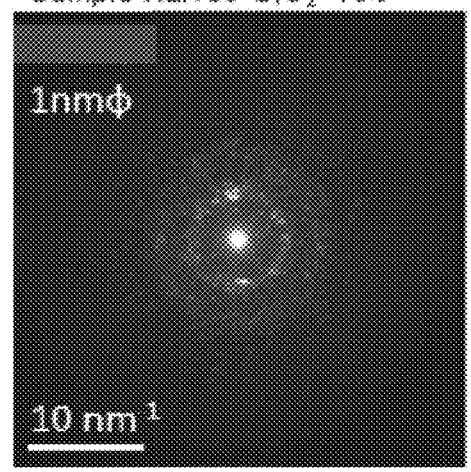
Figure 31C:
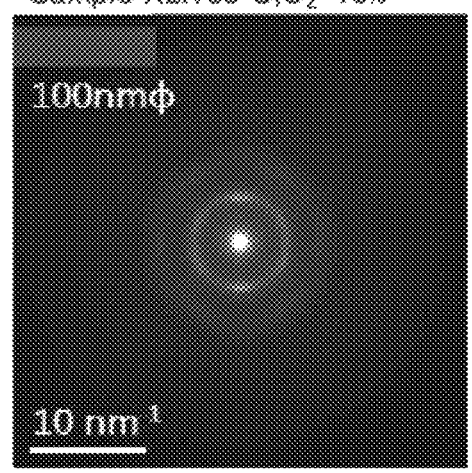

FIGS. 30B and 30C show electron diffraction patterns of Sample X1. FIGS. 31B and 31C show electron diffraction patterns of Sample X2. FIGS. 32B and 32C show electron diffraction patterns of Sample X3.

The contrast of the electron diffraction patterns shown in FIGS. 30B and 30C, FIGS. 31B and 31C, and FIGS. 32B and 32C is adjusted for clarity. In FIGS. 30B and 30C, FIGS. 31B and 31C, and FIGS. 32B and 32C, the brightest luminescent spot at the center of the pattern is derived from the incident electron beam and is the center of the electron diffraction pattern (also referred to as a direct spot or a transmitted wave).

As shown in FIG. 30B, when the diameter of the incident electron beam is set to 1 nmφ, a plurality of spots circumferentially distributed can be observed. This indicates that the oxide semiconductor film contains a plurality of submicroscopic crystal parts having random surface orientation. As shown in FIG. 30C, when the diameter of the incident electron beam is set to 100 nmφ, the luminances of a sequence of a plurality of diffraction spots derived from these plurality of crystal parts are averaged to be a ring-like diffraction pattern. Two ring-like diffraction patterns with different radii are observed in FIG. 30C. The rings are referred to as a first ring and a second ring in ascending order of radius. It is observed that the luminance of the first ring is higher than that of the second ring. In addition, two spots (referred to as first regions) with high luminance are observed at a position overlapping with the first ring.

The distance from the center to the first ring in a radial direction substantially corresponds to the distance from the center to a diffraction spot on the (009) plane of the structure model of single crystal InGaZnO$_4$ in a radical direction. The first regions are diffraction spots derived from c-axis alignment.

As shown in FIG. 30C, the observations of the ring-like diffraction patterns indicate that crystal parts having random orientation (hereinafter also referred to as crystal parts having no c-axis alignment or second crystal parts) exist in the oxide semiconductor film.

In addition, two first regions are presumed to have twohold symmetry because the regions are disposed symmetrically with respect to the center point of the electron diffraction pattern and the luminances of the regions are substantially equal to each other. As described above, since the two first regions are diffraction spots which are derived from the c-axis alignment, the orientation of a straight line which passes through the two first regions and the center is aligned with that of the c-axis of the crystal part. The thickness direction is the vertical direction of FIG. 30C, which suggests the presence of crystal part in which the c-axis is aligned in the thickness direction in the oxide semiconductor film.

As described above, the oxide semiconductor film of Sample X1 is confirmed to be a film including both crystal parts having c-axis alignment and crystal parts having no c-axis alignment.

The results of the electron diffraction patterns shown in FIGS. 31B and 31C and FIGS. 32B and 32C are substantially the same as those of the electron diffraction patterns shown in FIGS. 30B and 30C. The luminance of the two spots (first regions) derived from c-axis alignment is high in the order of Sample X1, Sample X2 and Sample X3. This indicates that the proportion of crystal parts having c-axis alignment is high in that order.

[Quantification Method of Crystallinity of Oxide Semiconductor Film]

Next, an example of a quantification method of crystallinity of an oxide semiconductor film is described with reference to FIGS. 33A and 33B, FIG. 34, and FIG. 35.

First, an electron diffraction pattern is prepared (see FIG. 33A).

FIG. 33A shows an electron diffraction pattern obtained by measuring a 100-nm-thick oxide semiconductor film using an electron beam with a diameter of 100 nmφ. FIG. 33B shows an electron diffraction pattern obtained by adjusting contrast of the electron diffraction pattern shown in FIG. 33A.

In FIG. 33B, two clear spots (first regions) are observed over and under a direct spot. The two spots (first regions) are derived from diffraction spots corresponding to (001) in a structure model of InGaZnO$_4$, that is, crystal parts having c-axis alignment. In addition to the first regions, a ring-like pattern (second regions) with a low luminance positioned on an approximately concentric circle of the first region is observed. The ring-like pattern is obtained when the luminances of spots derived from structures of crystal parts having no c-axis alignment (second crystal parts) are averaged by using the electron beam with a diameter of 100 nmφ.

Here, in the electron diffraction pattern, the first regions including diffraction spots derived from the crystal parts having c-axis alignment and the second regions including diffraction spots derived from the second crystal parts are observed to overlap with each other. Thus, a line profile including the first regions and line profiles including the second regions are obtained and compared with each other, whereby the crystallinity of the oxide semiconductor film can be quantified.

The line profile including the first regions and the line profiles including the second regions are described with reference to FIG. 34.

Figure 34:
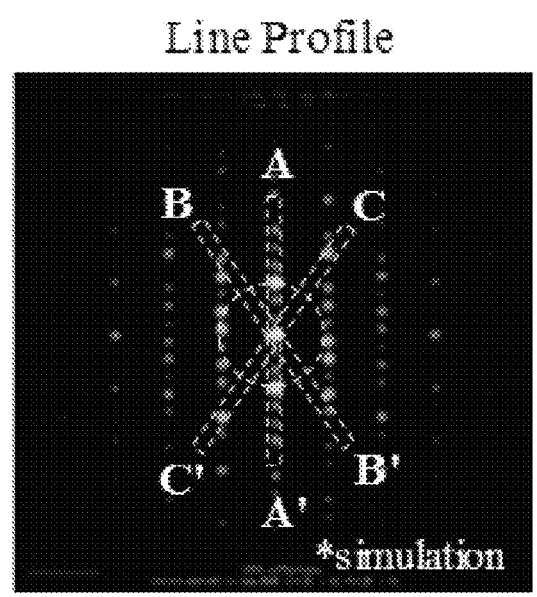
FIG. 34 shows line profiles of an electron diffraction pattern.

FIG. 34 shows a simulation pattern of electron diffraction that is obtained when an electron beam is emitted to the (100) plane of the structure model of InGaZnO$_4$. In the simulation pattern, auxiliary lines of a region A-A', a region B-B', and a region C-C' are drawn.

The region A-A' in FIG. 34 includes a straight line passing through two diffraction spots derived from the first crystal parts having c-axis alignment and a direct spot. The regions B-B' and C-C' in FIG. 34 each include a straight line passing through regions where no diffraction spot derived from the first crystal part having c-axis alignment is observed and the direct spot. An angle between the region A-A' and the region B-B' or C-C' is approximately 34°, specifically, larger than or equal to 30° and smaller than or equal to 38°, preferably larger than or equal to 32° and smaller than or equal to 36°, further preferably larger than or equal to 33° and smaller than or equal to 35°.

The line profiles have the tendencies shown in FIG. 35 in accordance with the structure of the oxide semiconductor film. FIG. 35 shows image diagrams of line profiles, relative luminance R, and a half width (FWHM: full width at half maximum) of a spectrum derived from c-axis alignment that is obtained from an electron diffraction pattern of each structure.

Relative luminance R in FIG. 35 is obtained by dividing the integrated intensity of luminance of the region A-A' by the integrated intensity of luminance of the region B-B' or the integrated intensity of luminance of the region C-C'. Note that the integrated intensity of luminance of each of the regions A-A', B-B', and C-C' is obtained by removing the luminance of background derived from the direct spot which appears at the center.

When the relative luminance R is calculated, the intensity of c-axis alignment can be quantitatively defined. For example, as shown in FIG. 35, in a single-crystal oxide semiconductor film, the peak intensity of diffraction spots derived from the first crystal parts having c-axis alignment in the region A-A' is high and there is no diffraction spot derived from the first crystal part having c-axis alignment in the regions B-B' and C-C'; thus, the relative luminance R is much larger than 1. The relative luminance R decreases in the order of single crystal, only CAAC (details of CAAC will be described later), CAAC+nanocrystal, nanocrystal, and amorphous. In particular, in nanocrystal and amorphous, which have no particular orientation, the relative luminance R is equal to 1.

As the periodicity of the crystal is higher, the intensity of the spectrum derived from the first crystal part having c-axis alignment becomes high and the half width of the spectrum becomes small. Thus, the half width of single crystal is the smallest, and the half width is increased in the order of only CAAC, CAAC+nanocrystal, and nanocrystal. The half width of amorphous is extremely large and the profile thereof is called a "halo".

[Analysis Using Line Profile]

As described above, the ratio of the integrated intensity of luminance of the first regions to the integrated intensity of luminance of the second regions is important information to presume the proportion of crystal parts having orientation.

Then, from electron diffraction patterns of Samples X1 to X3 that is described above, analysis with line profiles was performed.

FIGS. 36A1 and 36A2 show results of analysis with line profiles of Sample X1. FIGS. 36B1 and 36B2 show results of analysis with line profiles of Sample X2. FIGS. 36C1 and 36C2 show results of analysis with line profiles of Sample X3.

FIG. 36A1 shows the electron diffraction pattern in FIG. 30C in which the regions A-A', B-B', and C-C' are drawn. FIG. 36B1 shows the electron diffraction pattern in FIG. 31C in which the regions A-A', B-B', and C-C' are drawn. FIG. 36C1 shows the electron diffraction pattern in FIG. 32C in which the regions A-A', B-B', and C-C' are drawn.

The regions A-A', B-B', and C-C' can each be obtained by normalizing line profiles using the luminance of the direct spot as a reference. Note that the direct spot appears at the center of an electron diffraction pattern. With the regions, Samples X1 to X3 can be relatively compared.

When the profile of the luminance is calculated, a component of the luminance derived from inelastic scatterings and the like from a sample is subtracted as the background, in which case comparison with higher accuracy can be performed. Because the component of the luminance derived from inelastic scatterings shows an extremely broad profile in a radial direction, the luminance of the background may be obtained by a linear approximation. For example, a straight line is drawn along the tails of a target peak, and a region positioned on the luminance side lower than the straight line can be subtracted as the background.

Here, the integrated intensity of the luminance of each of the regions A-A', B-B', and C-C' is calculated from data in which the background is subtracted by the method described above. Then, the relative luminance R is obtained by dividing the integrated intensity of the luminance of the region A-A' by the integrated intensity of the luminance of the region B-B' or the integrated intensity of luminance of the region C-C'.

Figure 37:
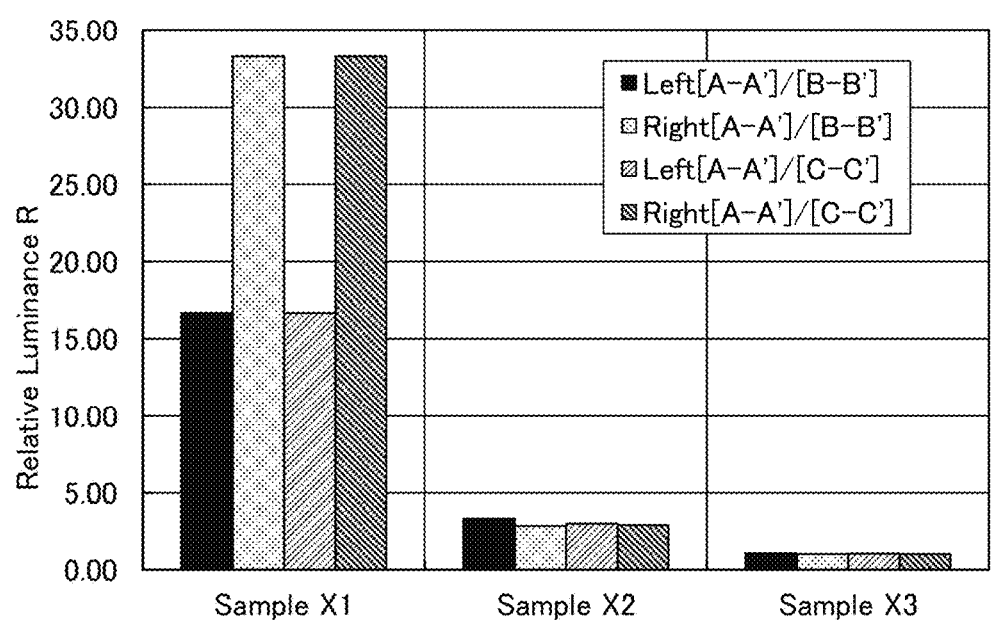
FIG. 37 shows relative luminance estimated from electron diffraction patterns of oxide semiconductor films.

FIG. 37 shows the relative luminance R of Samples X1 to X3. In FIG. 37, in a spectrum on the left side and the right side of the direct spot in the profiles of the luminance in each of FIGS. 36A2, 36B2, and 36C2, a value obtained by dividing the integrated intensity of the luminance of the region A-A' by the integrated intensity of the luminance of the region B-B' and a value obtained by dividing the integrated intensity of the luminance of the region A-A' by the integrated intensity of luminance of the region C-C' are calculated.

As shown in FIG. 37, the relative luminance of Samples X1 to X3 is as follows. The relative luminance R of Sample X1 is 25.00. The relative luminance R of Sample X2 is 3.04. The relative luminance R of Sample X3 is 1.05. Note that the relative luminance R is an average value of relative luminances at four points. As described above, the relative luminance R is high in the order of Sample X1, Sample X2, and Sample X3.

When the oxide semiconductor film of one embodiment of the present invention is used as a semiconductor film in which a channel of a transistor is formed, the relative luminance R is preferably greater than 1 and less than or equal to 40, further preferably greater than 1 and less than or equal to 10, still further preferably greater than 1 and less than or equal to 3. With use of such an oxide semiconductor film as a semiconductor film, both high stability of electrical characteristics and high field-effect mobility in a low-gate-voltage region can be achieved.

[Proportion of Crystal Part]

The proportion of crystal parts in an oxide semiconductor film can be estimated by analyzing a cross-sectional TEM image.

First, a method for analyzing the image is described. An image processing is performed as follows. First, a high-resolution TEM image is subjected to two-dimensional fast Fourier transform (FFT), whereby an FFT image is obtained. The obtained FET image is subjected to a mask processing so that a region other than a region having a periodic structure is removed. After the mask processing, the FFT image is subjected to two-dimensional inverse fast Fourier transform (IFFT), whereby an FFT filtering image is obtained.

In this manner, a real-space image in which only crystal parts are extracted can be obtained. Then, the proportion of crystal parts can be estimated from the proportion of area of the remaining image. Moreover, the proportion of area other than the crystal parts can be estimated by subtracting the remaining region from the area of the region used for calculation (also referred to as the area of an original image).

FIG. 38A1 shows a cross-sectional TEM image of Sample X1. FIG. 38A2 shows an image obtained through the analysis of the cross-sectional TEM image of Sample X1. FIG. 38B1 shows a cross-sectional TEM image of Sample X2. FIG. 38B2 shows an image obtained through the analysis of the cross-sectional TEM image of Sample X2. FIG. 38C1 shows a cross-sectional TEM image of Sample X3. FIG. 38C2 shows an image obtained through the analysis of the cross-sectional TEM image of Sample X3.

White regions in the oxide semiconductor film in the images obtained through the analysis correspond to regions including crystal parts having orientation. Black regions correspond to regions including crystal parts having no orientation or crystal parts having random orientation.

From the result shown in FIG. 38A2, the proportion of the area other than the region including crystal parts having orientation is approximately 43.1% in Sample X1. From the result shown in FIG. 38B2, the proportion of the area other than the region including crystal parts having orientation is approximately 61.7% in Sample X2. From the result shown in FIG. 38C2, the proportion of the area other than the region including crystal parts having orientation is approximately 89.5% in Sample X3.

The proportion of the region other than crystal parts having orientation in an oxide semiconductor film, which is estimated in the above manner, is preferably greater than or equal to 5% and less than 40% because the oxide semiconductor film has extremely high crystallinity and extremely high stability of electrical characteristics and hardly generates oxygen vacancies. In contrast, when the proportion of the region other than crystal parts having orientation in an oxide semiconductor film is higher than or equal to 40% and lower than 100%, preferably higher than or equal to 60% and lower than or equal to 90%, the oxide semiconductor film includes both the crystal parts having orientation and the crystal parts having no orientation at an appropriate ratio and thus can achieve both high stability of electrical characteristics and high mobility.

Here, a region other than the crystal parts that can be easily observed in a cross-sectional TEM image or a cross-sectional TEM image obtained through analysis can be referred to as a lateral growth buffer region (LGBR).

[Oxygen Diffusion into Oxide Semiconductor Film]

Next, the evaluation results of ease of oxygen diffusion to oxide semiconductor films are described below.

[Samples]

The following three samples (Samples Y1 to Y3) were fabricated

[Sample Y1]

First, an approximately 50-nm-thick oxide semiconductor film was formed over a glass substrate in a manner similar to that of Sample X1. Next, an approximately 30-nm-thick silicon oxynitride film, an approximately 100-nm-thick silicon oxynitride film, and an approximately 20-nm-thick silicon oxynitride film were stacked over the oxide semiconductor film by a plasma CVD method. Note that in the following description, an oxide semiconductor film and a silicon oxynitride film are referred to as OS and GI, respectively, in some cases.

After that, heat treatment was performed at 350° C. for one hour in a nitrogen atmosphere.

Next, a 5-nm-thick In—Sn—Si oxide film was formed by a sputtering method.

Next, oxygen was added to the silicon oxynitride film. The oxygen addition treatment was performed with an ashing apparatus under the conditions where the substrate temperature was 40° C., an oxygen gas ($^{16}O$) at a flow rate of 150 sccm and an oxygen gas ($^{18}O$) at a flow rate of 100 sccm were introduced into a chamber, the pressure was 15 Pa, and an RF power of 4500 W was supplied for 600 sec. between parallel-plate electrodes provided in the ashing apparatus so that a bias would be applied to the substrate side. Since the silicon oxynitride film contained oxygen ($^{16}O$) at a main component level when deposited, an oxygen gas ($^{18}O$) was used to exactly measure the amount of oxygen added by the oxygen addition treatment.

Then, an approximately 100-nm-thick silicon nitride film was formed by a plasma CVD method.

{Sample Y2}

Sample Y2 is a sample whose oxide semiconductor film was formed in different conditions from those of Sample Y1. In Sample Y2, an approximately 50-nm-thick oxide semiconductor film was formed in a manner similar to that of Sample X2 described above.

{Sample Y3}

Sample Y3 is a sample whose oxide semiconductor film was formed in different conditions from those of Sample Y1. In Sample Y3, an approximately 50-nm-thick oxide semiconductor film was formed in a manner similar to that of Sample X3 described above.

Through the above process, Samples Y1 to Y3 were formed.

[SIMS Analysis]

The concentration of $^{18}O$ in Samples Y1 to Y3 was measured by secondary ion mass spectrometry (SIMS) analysis. The SIMS analysis was performed under three conditions: a condition in which Samples Y1 to Y3 were not subjected to heat treatment; a condition in which Samples Y1 to Y3 were subjected to heat treatment at 350° C. for one hour in a nitrogen atmosphere; and a condition in which Samples Y1 to Y3 were subjected to heat treatment at 450° C. for one hour in a nitrogen atmosphere.

Figure 39A:
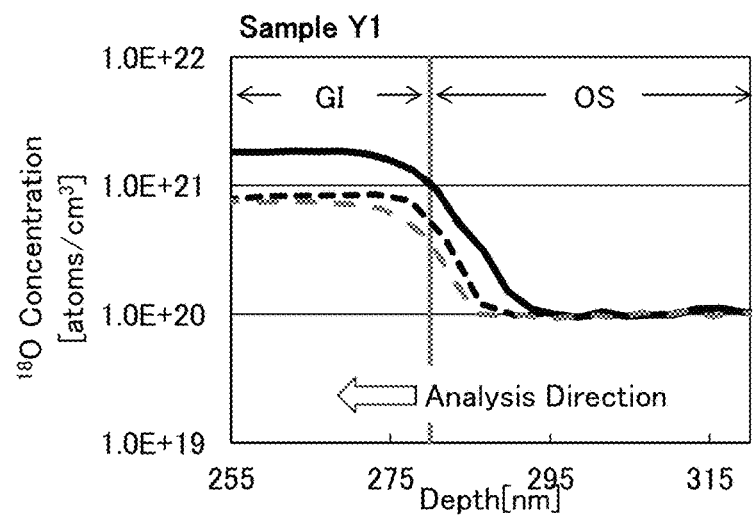
FIGS. 39A to 39C show SIMS measurement results of oxide semiconductor films.
Figure 39B:
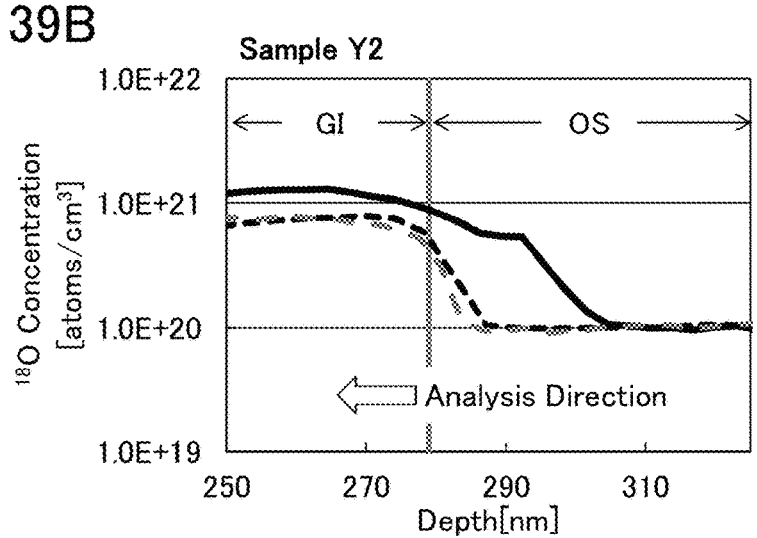
Figure 39C:
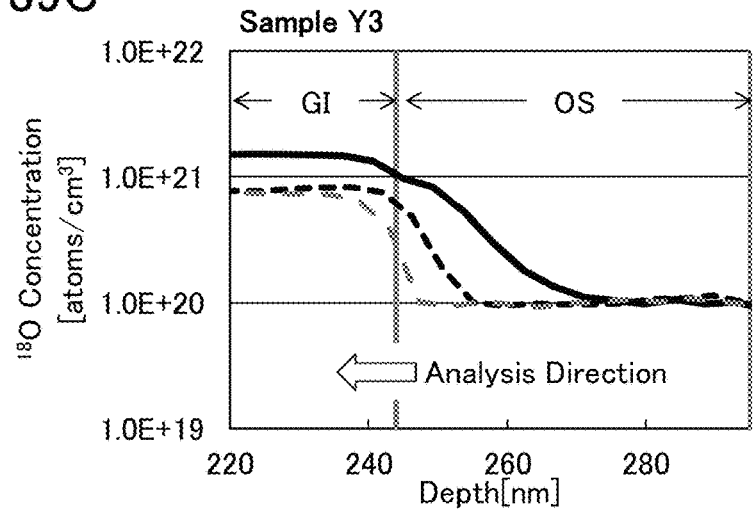

FIGS. 39A to 39C show SIMS measurement results. FIG. 39A, FIG. 39B, and FIG. 39C show SIMS measurement results of Sample Y1, Sample Y2, and Sample Y3, respectively.

FIGS. 39A to 39C show the analysis results of a region including GI and OS. Note that FIGS. 39A to 39C show results of SIMS (also referred to as substrate side depth profile (SSDP)-SIMS) analysis performed from the substrate side.

In FIGS. 39A to 39C, a gray dashed line indicates a profile of Sample in which heat treatment was not performed, a black dashed line indicates a profile of Sample in which heat treatment was performed at 350° C., and a black solid line indicates a profile of Sample in which heat treatment was performed at 450° C.

In each of Samples Y1 to Y3, it is found that $^{18}O$ was diffused to GI and also to OS. Furthermore, the position where $^{18}O$ was diffused was deeper in the order of Sample Y1, Sample Y2, and Sample Y3. In addition, when heat treatment was performed at 350° C. or 450° C., $^{18}O$ was more deeply diffused.

From the above results, it is found that an oxide semiconductor film including both crystal parts having orientation and crystal parts having no orientation and a low proportion of crystal parts having orientation is a film which easily transmits oxygen, in other words, a film in which oxygen is easily diffused. In addition, when heat treatment is performed at 350° C. or 450° C., oxygen in a GI film is diffused to OS.

The above result indicates that the higher the proportion (density) of crystal parts having orientation is, the more difficult it is for oxygen to be diffused in the thickness direction, and the lower the density is, the easier it is for oxygen to be diffused in the thickness direction. The ease of oxygen diffusion to the oxide semiconductor film can be considered as follows.

In an oxide semiconductor film containing both crystal parts having orientation and submicroscopic crystal parts having no orientation, a region other than the crystal parts which can be obviously observed in a cross-sectional observation image (LGBR) can be a region in which oxygen is easily diffused, that is, can serve as an oxygen diffusion path. As a result, in the case where a source which supplies sufficient oxygen is provided in the vicinity of the oxide semiconductor film, oxygen can be easily supplied through the LGBR to the crystal parts having orientation, and the amount of oxygen vacancy in the film can be reduced.

For example, an oxide film which easily releases oxygen is formed to be in contact with the oxide semiconductor film and heat treatment is performed, so that oxygen released from the oxide film is diffused to the oxide semiconductor film in the thickness direction through the LGBR. Through the LGBR, oxygen can be supplied laterally to crystal parts having orientation. Accordingly, oxygen is easily supplied sufficiently to the crystal parts having orientation and a region other than the crystal parts in the oxide semiconductor film, which leads to an effective reduction of oxygen vacancy in the film.

When a hydrogen atom which is not bonded to a metal atom exists in the oxide semiconductor film, an oxygen atom is bonded to the hydrogen atom, and then OH is formed and fixed in some cases. The state in which a certain amount (e.g., approximately $1 \times 10^{17}$ cm$^{-3}$) of hydrogen atoms trapped in oxygen vacancy ($V_O$) in the oxide semiconductor film (such a hydrogen atom is referred to as $V_OH$) is formed in the deposition at low temperature, whereby generation of OH is inhibited. A certain amount of carrier exists in the oxide semiconductor film because $V_OH$ generates a carrier. Thus, the oxide semiconductor film with an increased carrier density can be formed. Although oxygen vacancy is formed concurrently with the deposition, the oxygen vacancy can be reduced by introducing oxygen through the LGBR as described above. In this manner, the oxide semiconductor film with a relatively high carrier density and a sufficiently reduced amount of oxygen vacancy can be formed.

A clear grain boundary cannot be observed in the oxide semiconductor film because submicroscopic crystal parts having no orientation at the time of the deposition is formed in a region other than crystal parts having orientation. The submicroscopic crystal part is positioned between a plurality of crystal parts having orientation. The submicroscopic crystal part is bonded to an adjacent crystal part having orientation by growing in the lateral direction with heat at the time of the deposition. The submicroscopic crystal part functions as a region where a carrier is generated. The oxide semiconductor film with such a structure is expected to improve field-effect mobility when applied to a transistor.

In addition, plasma treatment in an oxygen atmosphere is preferably performed after the oxide semiconductor film is formed and an oxide insulating film such as a silicon oxide film is formed over the oxide semiconductor film. The treatment can reduce the hydrogen concentration as well as can supply oxygen to the film. For example, during plasma treatment, fluorine which remains in the chamber is doped at the same time to the oxide semiconductor film in some cases. Fluorine exists as a fluorine atom with negative charges and is bonded to a hydrogen atom with positive charges by Coulomb force, and then HF is generated. HF is released to the outside of the oxide semiconductor film during plasma treatment, and as a result, the hydrogen concentration in the oxide semiconductor film can be reduced. In plasma treatment, $H_2O$ in which an oxygen atom and hydrogen atoms are bonded is released to the outside of the film in some cases.

A structure in which a silicon oxide film (or a silicon oxynitride film) is stacked over the oxide semiconductor film is considered. Fluorine in the silicon oxide film does not affect electrical characteristics of the oxide semiconductor film because the halogen element is bonded to hydrogen in the film and can exist as HF which is electrically neutral. Note that Si—F bond is generated in some cases, which is also electrically neutral. Furthermore, HF in the silicon oxide film does not affect the diffusion of oxygen.

According to the above mechanism, oxygen vacancy in the oxide semiconductor film can be reduced and hydrogen which is not bonded to a metal atom in the film can be reduced, which leads to the improvement of reliability. The electrical characteristics are expected to be improved because the carrier density of the oxide semiconductor film is greater than or equal to a certain amount.

[Deposition Method of Oxide Semiconductor Film]

A deposition method of the oxide semiconductor film which is one embodiment of the present invention is described below.

The oxide semiconductor film used in one embodiment of the present invention can be formed by a sputtering method in an atmosphere containing oxygen.

The substrate temperature during the deposition is higher than or equal to room temperature and lower than or equal to 150° C., preferably higher than or equal to 50° C. and lower than or equal to 150° C., further preferably higher than or equal to 100° C. and lower than or equal to 150° C., typified by 130° C. The substrate temperature within the above range can control the ratio of crystal parts having orientation to crystal parts having no orientation.

The oxygen flow rate ratio (partial pressure of oxygen) during the deposition is preferably higher than or equal to 1% and lower than 33%, further preferably higher than or equal to 5% and lower than or equal to 30%, still further preferably higher than or equal to 5% and lower than or equal to 20%, and yet still further preferably higher than or equal to 5% and lower than or equal to 15%, typified by 10%. Low oxygen flow rate can result in a large number of crystal parts having no orientation in the film.

Accordingly, setting the substrate temperature and the oxygen flow rate during the deposition within the above ranges can result in an oxide semiconductor film containing both crystal parts having orientation and crystal parts having no orientation. Furthermore, the substrate temperature and the oxygen flow rate within the above ranges can adjust the proportions of crystal parts having orientation and crystal parts having no orientation.

An oxide target that can be used for forming the oxide semiconductor film of this embodiment is not limited to an In—Ga—Zn-based oxide; for example, an In-M-Zn-based oxide (M is Al, Ga, Y, or Sn) can be used.

When the oxide semiconductor film is an In-M-Zn oxide, as the atomic ratio of metal elements in a sputtering target used for formation of the In-M-Zn oxide, In:M:Zn=1:1:0.5, In:M:Zn=1:1:1, In:M:Zn=1:1:1.2,=2:1:1.5, In:M:Zn=2:1: 2.3, In:M:Zn=2:1:3, In:M:Zn=3:1:2, In:M:Zn=4:2:4.1, In:M:Zn=5:1:7, or the like is preferable.

When an oxide semiconductor film containing crystal parts is formed as the oxide semiconductor film using a sputtering target containing a polycrystalline oxide having a plurality of crystal grains, an oxide semiconductor film with crystallinity is more likely to be obtained than in the case of using a sputtering target not containing a polycrystalline oxide.

The consideration of the deposition mechanism of the oxide semiconductor film is made below. In the case where a sputtering target contains a plurality of crystal grains each of which has a layered structure and an interface at which the crystal grain is easily cleaved, ion collision with the sputtering target might cleave crystal grains to make plate-like or pellet-like sputtering particles. The obtained plate-like or pellet-like sputtering particles are deposited on a substrate, which probably results in formation of an oxide semiconductor film containing nanocrystals. An oxide semiconductor film containing crystal parts having orientation is likely to be formed when the substrate is heated because the nanocrystals are then bonded to each other or rearranged at a substrate surface.

Note that the above consideration is made on the assumption that a sputtering method is used; a sputtering method is particularly preferable because the crystallinity can be easily adjusted. Note that instead of a sputtering method, a pulsed laser deposition (PLD) method, a plasma-enhanced chemical vapor deposition (PECVD) method, a thermal chemical vapor deposition (CVD) method, an atomic layer deposition (ALD) method, a vacuum evaporation method, or the like may be used. As an example of the thermal CVD method, a metal organic chemical vapor deposition (MOCVD) method can be given.

Embodiment 5

In this embodiment, a semiconductor device including the oxide semiconductor film of one embodiment of the present invention is described with reference to FIG. 40, FIG. 41, and FIG. 42.

STRUCTURAL EXAMPLE 1 OF SEMICONDUCTOR DEVICE

Figure 40:
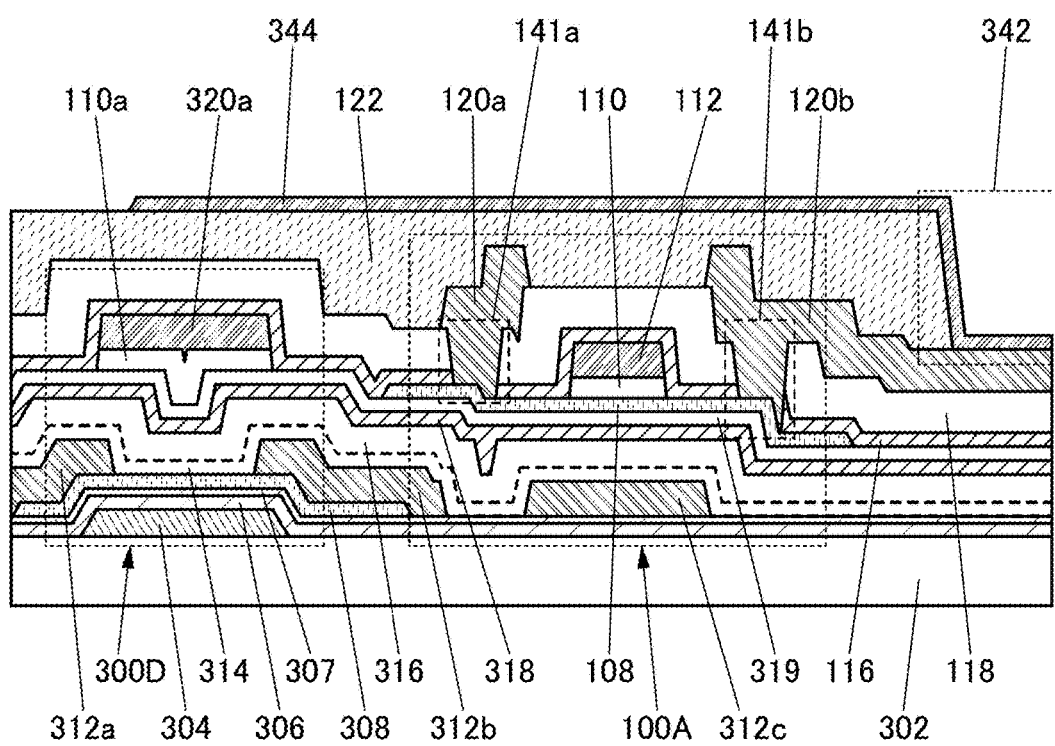
FIG. 40 is a cross-sectional view illustrating a semiconductor device.

FIG. 40 is a cross-sectional view in the channel length (L) direction when the transistor 300D described in Embodiment 3 and the transistor 100A described in Embodiment 2 are stacked.

With the stacked structure of the transistor 300D and the transistor 100A, the area of a region where the transistors are disposed can be reduced.

For example, the structure in FIG. 40 is used for a pixel portion of a display device, whereby the pixel density of the display device can be increased. The arrangement of the transistors in FIG. 40 can increase the aperture ratio of pixels even in the case where the pixel density of the display device is greater than 1000 pixels per inch (ppi) or the pixel density of the display device is greater than 2000 ppi. Note that ppi is a unit indicating the number of pixels per inch.

The structure in this embodiment is different from the above structure in that the transistor 300D and the transistor 100A are stacked.

For example, the structure of transistor 300D in FIG. 40 is different from the above structure as follows.

The transistor 300D in FIG. 40 includes an insulating film 319 and an insulating film 110a between an insulating film 318 and a conductive film 320a.

The material of the insulating film 314 or the insulating film 316 can be used for the insulating film 319. The insulating film 319 is provided so that the oxide semiconductor film 108 is not in contact with the insulating film 318. The insulating film 110a is formed by processing the same insulating film as the insulating film 110. Note that the conductive film 320a included in the transistor 300D and the conductive film 112 included in the transistor 100A are formed by processing the same conductive film.

The transistor 100A in FIG. 40 includes the conductive film 312c instead of the conductive film 106. In addition, the transistor 100A in FIG. 40 includes the insulating films 314, 316, 318, and 319 instead of the insulating film 104. Since the transistor 300D includes the insulating films 314, 316, 318, and 319 instead of the insulating film 104, the number of manufacturing steps of the transistor can be reduced.

In FIG. 40, the conductive film 120b of the transistor 300D is connected to a conductive film 344. The conductive film 344 is electrically connected to the conductive film 120b in the opening 342 provided in the insulating film 122. The material of the conductive film 320a can be used for the conductive film 344. Note that the conductive film 344 serves as a pixel electrode of the display device.

FIG. 40 illustrates the case where the transistor 300D and the transistor 100A are stacked; however, the present invention is not limited thereto. For example, structures illustrated in FIG. 41 and FIG. 42 may be used.

STRUCTURAL EXAMPLE 2 OF SEMICONDUCTOR DEVICE

Figure 41:
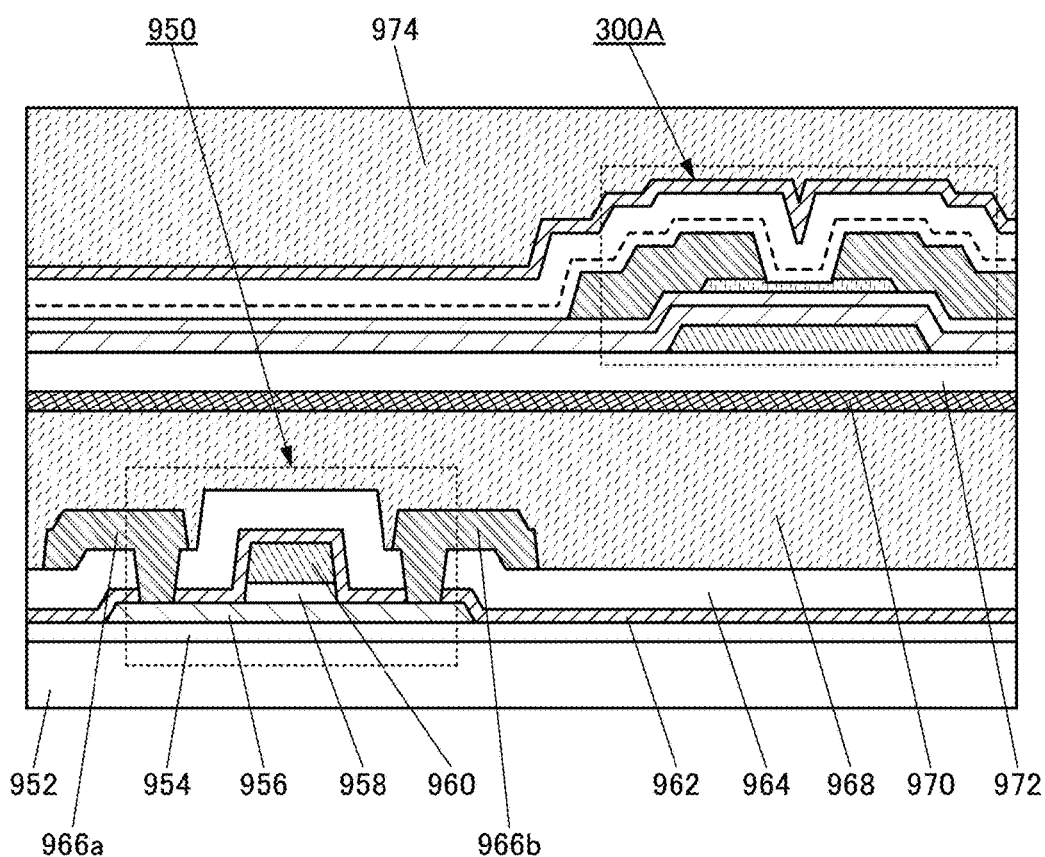
FIG. 41 is a cross-sectional view illustrating a semiconductor device.
Figure 42:
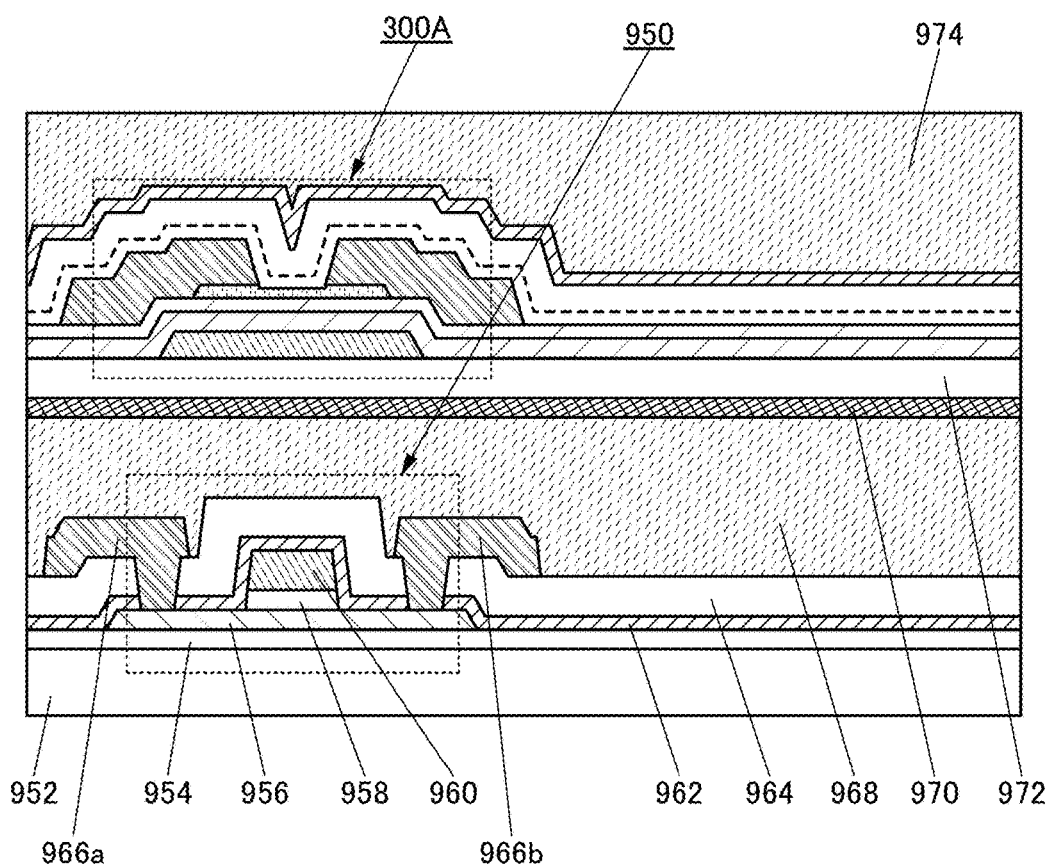
FIG. 42 is a cross-sectional view illustrating a semiconductor device.

FIG. 41 is a cross-sectional view in the channel length (L) direction when the transistor 950 and the transistor 300A described in Embodiment 2 are stacked.

The transistor 950 illustrated in FIG. 41 includes a substrate 952; an insulating film 954 over the substrate 952; a semiconductor film 956 over the insulating film 954; an insulating film 958 over the semiconductor film 956; a conductive film 960 over the insulating film 958, an insulating film 962 over the insulating film 954, the semiconductor film 956, and the conductive film 960; an insulating film 964 over the insulating film 962; and a conductive film 966a and a conductive film 966b which are electrically connected to the semiconductor film 956. An insulating film 968 is provided over the transistor 950.

The semiconductor film 956 includes silicon. In particular, the semiconductor film 956 preferably includes crystalline silicon. The transistor 950 is a transistor that uses low-temperature polysilicon. It is preferable to use the transistor using low-temperature polysilicon in the driver circuit portion of the display device because high field-effect mobility can be obtained. Furthermore, the transistor 300A is preferably used in a pixel portion of the display device to reduce power consumption.

A glass substrate, a plastic substrate, or the like can be used for the substrate 952. The insulating film 954 serves as a base insulating film of the transistor 950. For example, a silicon oxide film, a silicon nitride film, a silicon oxynitride film, a silicon nitride oxide film, or the like can be used as the insulating film 954. The insulating film 958 functions as a gate insulating film of the transistor 950. The materials described above for the insulating film 954 can be used for the insulating film 958. The conductive film 960 functions as a gate electrode of the transistor 950. The material of the conductive films 312a, 312b, 120a, 120b, and the like in the above embodiments can be used for the conductive film 960. The insulating films 962, 964, and 968 serve as a protective insulating film of the transistor 950. The conductive films 966a and 966b serve as a source electrode and a drain electrode of the transistor 950. The same material as the conductive films 312a, 312b, 120a, 120b, and the like in the above embodiments can be used for the conductive films 966a and 966b.

An insulating film 970 and an insulating film 972 are provided between the transistor 950 and the transistor 300A. The insulating film 970 serves as a barrier film. Specifically, the insulating film 970 is formed so that impurities such as hydrogen contained in the transistor 950 do not enter the transistor 300A side. The insulating film 972 serves as a base insulating film of the transistor 300A.

For the insulating film 970, a material which releases a small amount of hydrogen and can inhibit diffusion of hydrogen, such as silicon nitride and aluminum oxide, is preferably used. The insulating film 972 preferably contains excess oxygen. The materials of the insulating films 314 and 316 can be used for the insulating film 972.

Although the transistor 950 is not overlapped with the transistor 300A in FIG. 41, the present invention is not limited thereto. For example, the channel region of the transistor 950 may overlap with the channel region of the transistor 300A as illustrated in FIG. 42. FIG. 42 is a cross-sectional view in the channel length (L) direction when the transistor 950 and the transistor 300A are stacked. With the structure in FIG. 42, the area of a region where the transistors are disposed can be reduced.

Although not illustrated, the transistor 950 and other transistors in Embodiment 2 and Embodiment 3 (e.g., the transistors 100A to 100J and the transistors 300A to 300G) may be stacked.

In this manner, the oxide semiconductor film of one embodiment of the present invention can be favorably used for the structure in which transistors of various shape are stacked.

At least part of this embodiment can be implemented in combination with any of the other embodiments described in this specification as appropriate.

Embodiment 6

In this embodiment, an example of a display device that includes any of the transistors described in the embodiment above will be described below with reference to FIG. 43, FIG. 44, FIG. 45, FIG. 46, FIGS. 47A to 47D, FIG. 48, FIG. 49, and FIG. 50.

Figure 43:
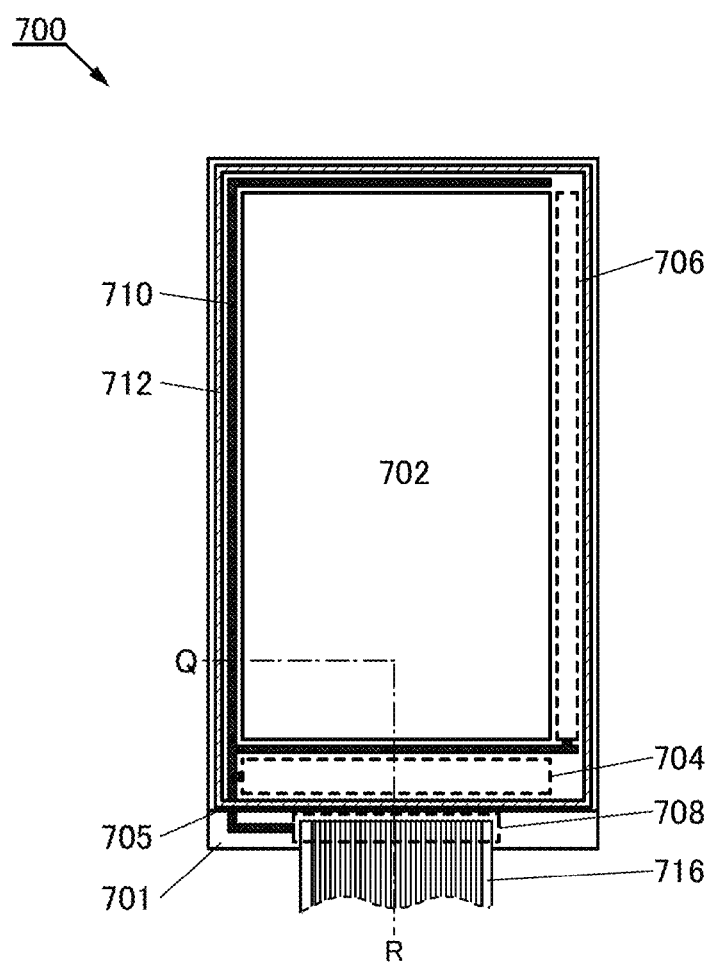
FIG. 43 is a top view illustrating one embodiment of a display device.

FIG. 43 is a top view illustrating an example of a display device. A display device 700 illustrated in FIG. 43 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 43, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. The variety of signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors.

The display device 700 can include any of a variety of elements. As examples of the elements, electroluminescent (EL) element (e.g., an EL element containing organic and inorganic materials, an organic EL element, an inorganic EL element, or an LED), a light-emitting transistor element (a transistor which emits light depending on current), an electron emitter, a liquid crystal element, an electronic ink display, an electrophoretic element, an electrowetting element, a plasma display panel (PDP), a micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used to obtain a full-color display device in which white light (W) is used for a backlight (e.g., an organic EL element, an inorganic EL element, an LED, or a fluorescent lamp). As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 44:
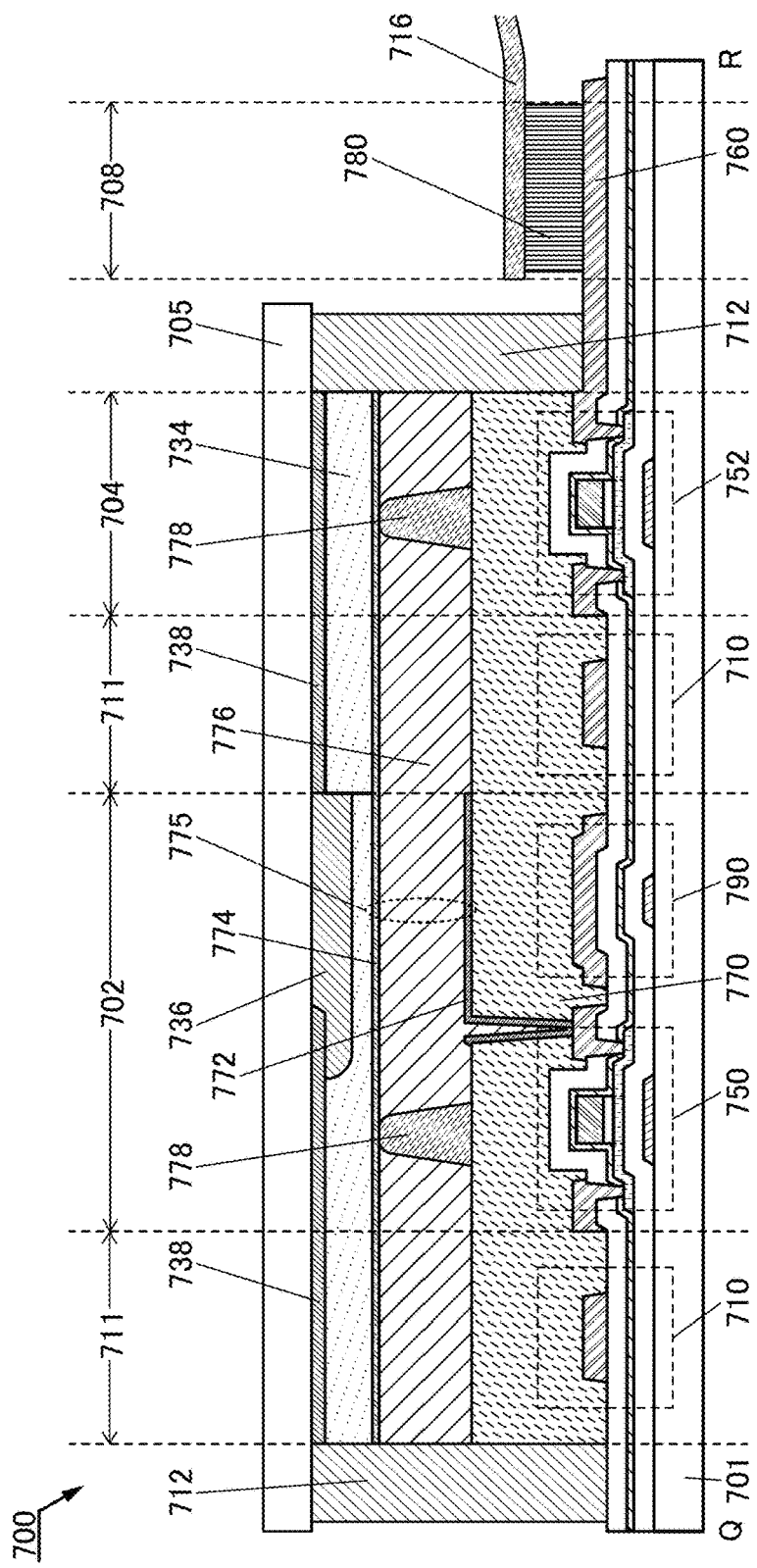
FIG. 44 is a cross-sectional view of one embodiment of a display device.
Figure 45:
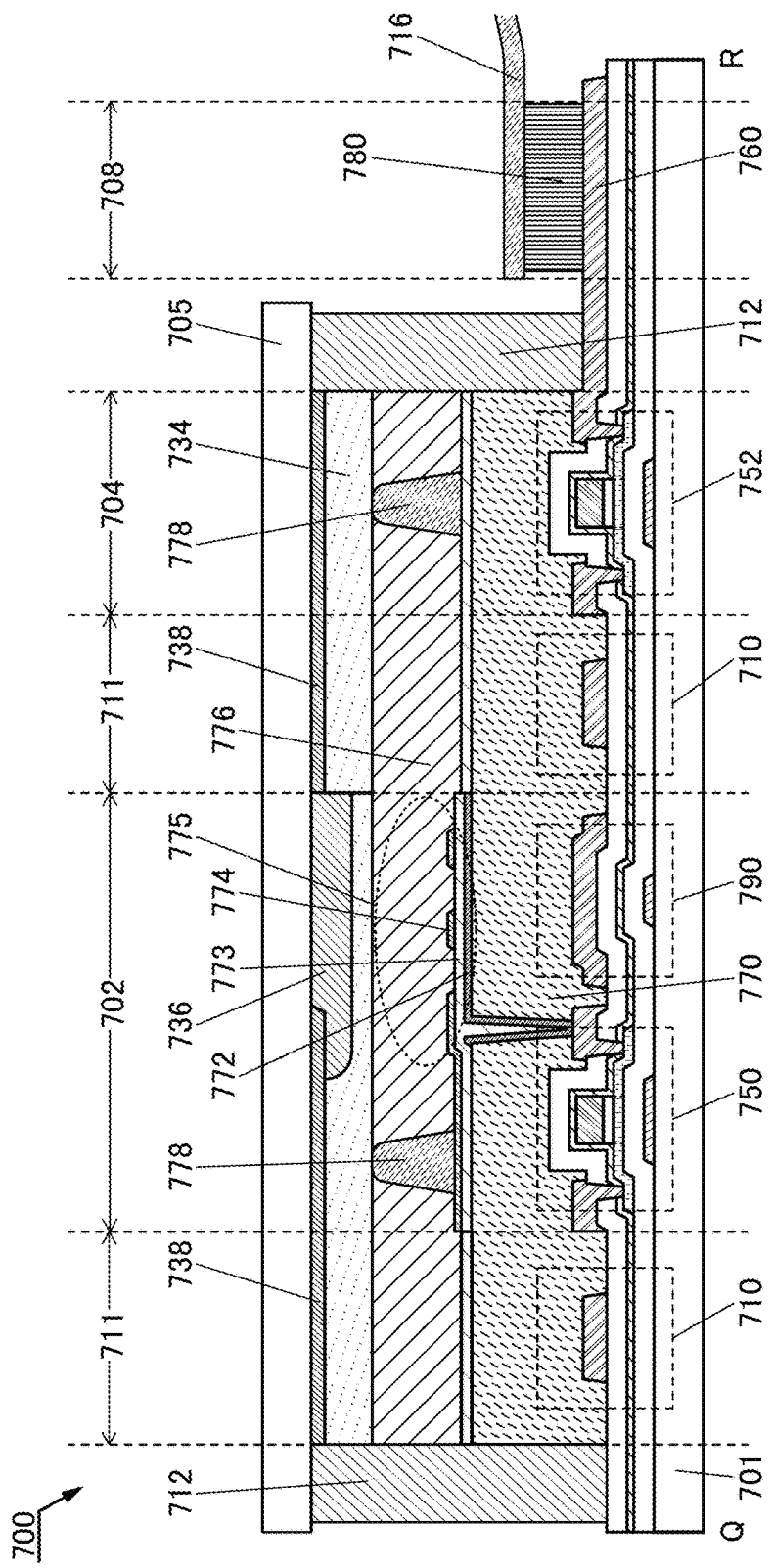
FIG. 45 is a cross-sectional view of one embodiment of a display device.
Figure 46:
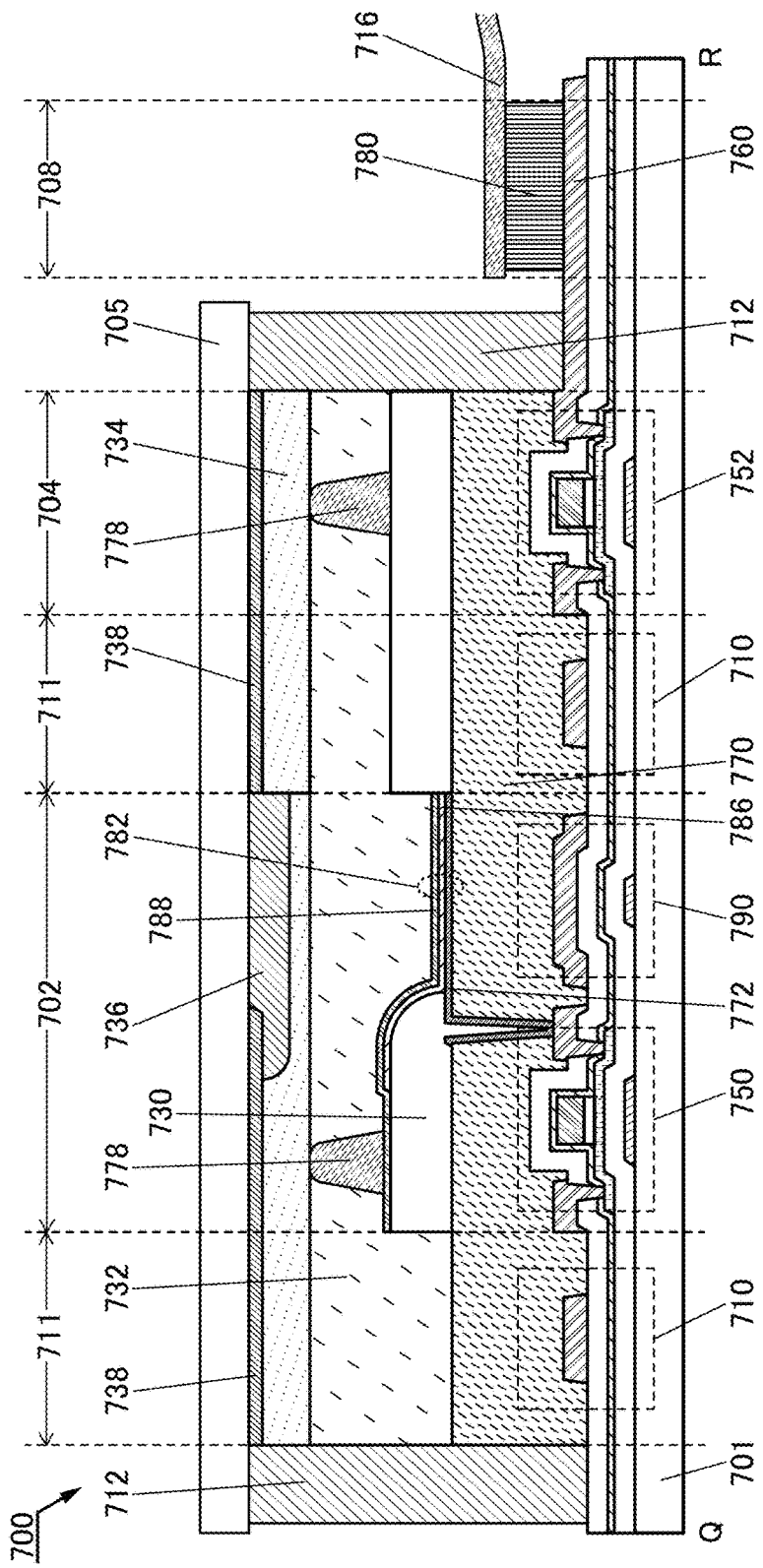
FIG. 46 is a cross-sectional view of one embodiment of a display device.

In this embodiment, a structure including a liquid crystal element and an EL element as display elements is described with reference to FIG. 44, FIG. 45, and FIG. 46. Note that FIG. 44 and FIG. 45 are each a cross-sectional view taken along the dashed-dotted line Q-R shown in FIG. 43 and show a structure including a liquid crystal element as a display element. FIG. 46 is a cross-sectional view taken along dashed-dotted line Q-R in FIG. 43 and illustrates the structure including an EL element as a display element.

Portions common to FIG. 44, FIG. 45, and FIG. 46 are described first, and then different portions are described.

[Common Portions in Display Devices]

The display device 700 illustrated in FIG. 44, FIG. 45, and FIG. 46 include a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100A described above. Note that the transistor 750 and the transistor 752 may each have the structure of any of the other transistors described in the above embodiments.

The transistors used in this embodiment each include an oxide semiconductor film which is highly purified and in which formation of oxygen vacancies is suppressed. The transistor can have low off-state current. Accordingly, an electrical signal such as an image signal can be held for a longer period, and a writing interval can be set longer in an on state. Accordingly, the frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

A capacitor 790 includes a lower electrode that is formed through a step of processing the same conductive film as a conductive film functioning as a first gate electrode of the transistor 750 and an upper electrode that is formed through a step of processing the same conductive film as a conductive film functioning as a source electrode or a drain electrode of the transistor 750. Furthermore, between the lower electrode and the upper electrode, an insulating film that is formed through a step of forming the same insulating film as an insulating film functioning as a first gate insulating film of the transistor 750 and an insulating film that is formed through a step of forming the same insulating film as an insulating film functioning as a protective insulating film of the transistor 750 are provided. That is, the capacitor 790 has a stacked-layer structure in which the insulating films functioning as a dielectric film are positioned between a pair of electrodes.

In FIG. 44, FIG. 45, and FIG. 46, a planarization insulating film 770 is provided over the transistor 750, the transistor 752, and the capacitor 790.

Although FIG. 44, FIG. 45, and FIG. 46 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a top-gate transistor is used in the pixel portion 702 and a bottom-gate transistor is used in the source driver circuit portion 704, or a structure in which a bottom-gate transistor is used in the pixel portion 702 and a top-gate transistor is used in the source driver circuit portion 704 may be employed. Note that the term "source driver circuit portion 704" can be replaced by the term "gate driver circuit portion".

The signal line 710 is formed through the same process as the conductive films functioning as source electrodes and drain electrodes of the transistors 750 and 752. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

STRUCTURE EXAMPLE OF DISPLAY DEVICE USING LIQUID CRYSTAL ELEMENT

The display device 700 illustrated in FIG. 44 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 illustrated in FIG. 44 can display an image in such a manner that transmission or non-transmission of light is controlled by the alignment state in the liquid crystal layer 776 which is changed depending on the voltage applied to between the conductive film 772 and the conductive film 774.

The conductive film 772 is electrically connected to the conductive film that functions as a source electrode and a drain electrode included in the transistor 750. The conductive film 772 is formed over the planarization insulating film 770 to function as a pixel electrode, i.e., one electrode of the display element.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light.

In the case where a conductive film that reflects visible light is used as the conductive film 772, the display device 700 becomes a reflective-type liquid crystal display device. In the case where a conductive film that transmits visible light is used as the conductive film 772, the display device 700 becomes a transmissive liquid crystal display device.

When a structure over the conductive film 772 is changed, a driving method of the liquid crystal element can be changed. An example of this case is illustrated in FIG. 45. The display device 700 illustrated in FIG. 45 is an example of employing a transverse electric field mode (e.g., an FFS mode) as a driving mode of the liquid crystal element. In the structure illustrated in FIG. 45, an insulating film 773 is provided over the conductive film 772 and the conductive film 774 is provided over the insulating film 773. In such a structure, the conductive film 774 functions as a common electrode, and an electric field generated between the conductive film 772 and the conductive film 774 through the insulating film 773 can control the alignment state of the liquid crystal layer 776.

Although not illustrated in FIG. 44 and FIG. 45, the conductive film 772 and/or the conductive film 774 may be provided with an alignment film on a side in contact with the liquid crystal layer 776. Although not illustrated in FIG. 44 and FIG. 45, an optical member (optical substrate) or the like, such as a polarizing member, a retardation member, or an anti-reflection member, may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy, which makes the alignment process unneeded. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Moreover, the liquid crystal material which exhibits a blue phase has a small viewing angle dependence.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

[Display Device Including Light-Emitting Element]

The display device 700 illustrated in FIG. 46 includes a light-emitting element 782. The light-emitting element 782 includes a conductive film 772, an EL layer 786, and a conductive film 788. The display device 700 shown in FIG. 46 is capable of displaying an image by light emission from the EL layer 786 included in the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. The quantum dot containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The EL layer 786 can be formed using the above-described organic compound and the inorganic compound by a method such as an evaporation method (including a vacuum evaporation method), a droplet discharging method (also referred to as an ink-jet method), a coating method, or a gravure printing method. A low molecular material, a middle molecular material (including an oligomer and a dendrimer), or a high molecular material may be included in the EL layer 786.

Here, a method for forming the EL layer 786 by a droplet discharge method is described with reference to FIGS. 47A to 47D. FIGS. 47A to 47D are cross-sectional views illustrating the method for forming the EL layer 786.

Figure 47A:
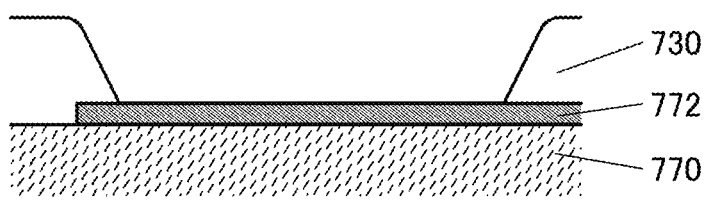
FIGS. 47A to 47D are cross-sectional views illustrating a method for forming an EL layer.
Figure 47B:
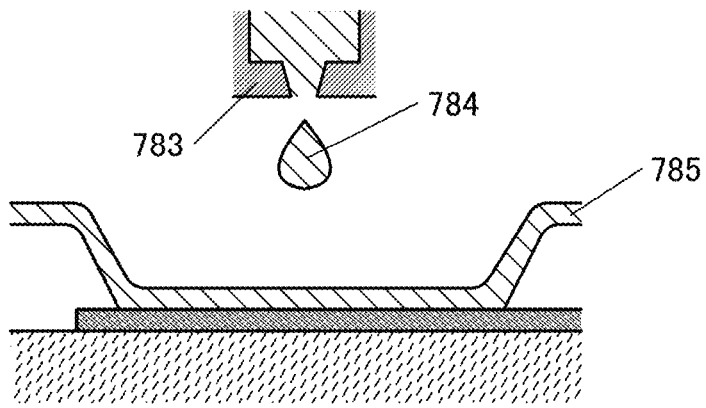

First, the conductive film 772 is formed over the planarization insulating film 770, and an insulating film 730 is formed to cover part of the conductive film 772 (see FIG. 47A).

Next, a droplet 784 is discharged to an exposed portion of the conductive film 772, which is an opening of the insulating film 730, from a droplet discharge apparatus 783, so that a layer 785 containing a composition is formed. The droplet 784 is a composition containing a solvent and is attached over the conductive film 772 (see FIG. 47B).

Note that the method for discharging the droplet 784 may be performed under reduced pressure.

Figure 47C:
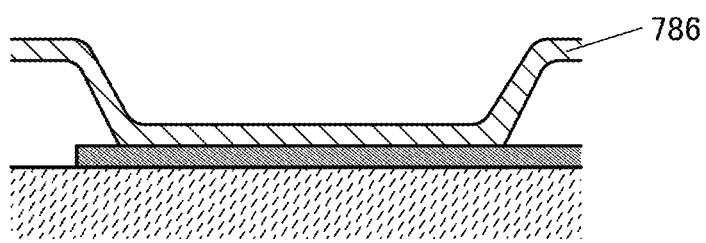

Then, the solvent is removed from the layer 785 containing the composition, and the resulting layer is solidified to form the EL layer 786 (see FIG. 47C).

The solvent may be removed by drying or heating.

Figure 47D:
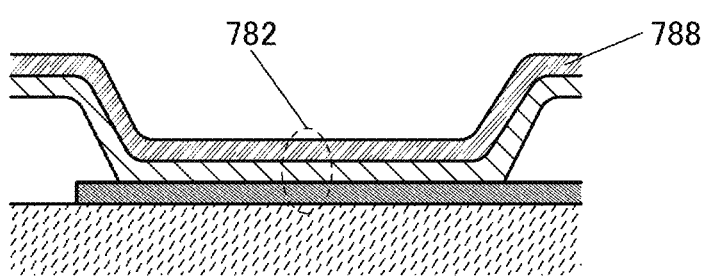

Next, the conductive film 788 is formed over the EL layer 786; thus, the light-emitting element 782 is formed (see FIG. 47D).

When the EL layer 786 is formed by a droplet discharging method as described above, the composition can be selectively discharged; accordingly, waste of material can be reduced. Furthermore, a lithography process or the like for shaping is not needed, and thus, the process can be simplified and cost reduction can be achieved.

The droplet discharge method described above is a general term for a means including a nozzle equipped with a composition discharge opening or a means to discharge droplets such as a head having one or a plurality of nozzles.

Figure 48:
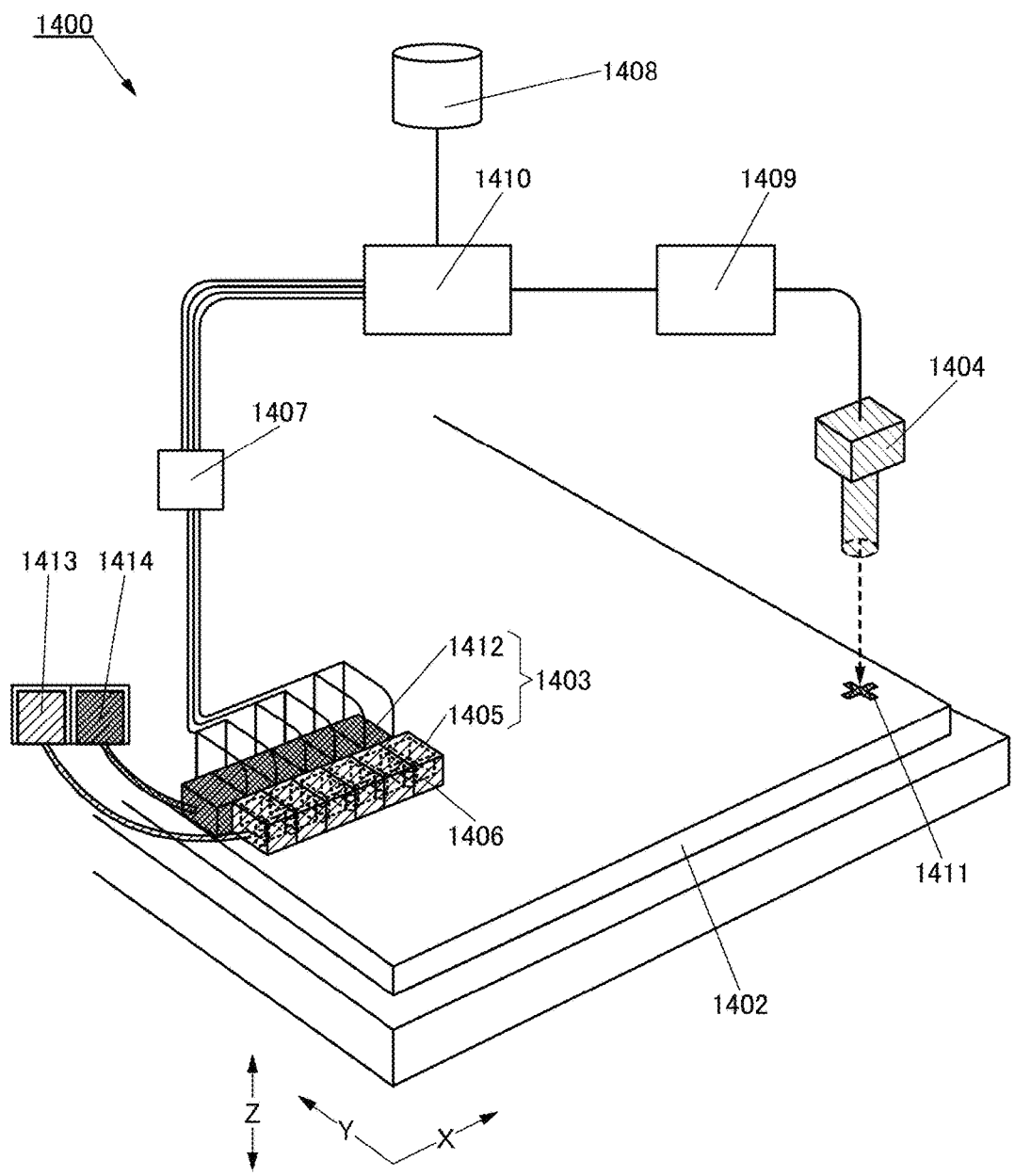
FIG. 48 is a conceptual diagram illustrating a droplet discharge apparatus.

Next, a droplet discharge apparatus used for the droplet discharge method is described with reference to FIG. 48. FIG. 48 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407, and this control means 1407 is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal oxide semiconductor (CMOS) can be used as the imaging means 1404. Data about a pattern to be formed over the substrate 1402 is stored in a storage medium 1408, and the control signal is transmitted to the control means 1407 based on the data, so that each of the heads 1405 and 1412 of the droplet discharging means 1403 can be individually controlled. The heads 1405 and 1412 are supplied with a material to be discharged from material supply sources 1413 and 1414 through pipes, respectively.

Inside the head 1405, a space as indicated by a dotted line 1406 to be filled with a liquid material and a nozzle which is a discharge outlet are provided. Although it is not shown, an inside structure of the head 1412 is similar to that of the head 1405. When the nozzle sizes of the heads 1405 and 1412 are different from each other, different materials with different widths can be discharged simultaneously. Each head can discharge and draw a plurality of light emitting materials. In the case of drawing over a large area, the same material can be simultaneously discharged to be drawn from a plurality of nozzles in order to improve throughput. When a large substrate is used, the heads 1405 and 1412 can freely scan the substrate in directions indicated by arrows X, Y, and Z in FIG. 48, and a region in which a pattern is drawn can be freely set. Thus, a plurality of the same patterns can be drawn over one substrate.

Further, a step of discharging the composition may be performed under reduced pressure. Also, a substrate may be heated when the composition is discharged. After discharging the composition, either drying or baking or the both is performed. Both the drying and baking are heat treatments but different in purpose, temperature, and time period. The steps of drying and baking are performed under normal pressure or under reduced pressure by laser irradiation, rapid thermal annealing, heating using a heating furnace, or the like. Note that the timing of the heat treatment and the number of times of the heat treatment are not particularly limited. The temperature for performing each of the steps of drying and baking in a favorable manner depends on the materials of the substrate and the properties of the composition.

In the above manner, the EL layer 786 can be formed with the droplet discharge apparatus.

The display device 700 shown in FIG. 46 is described again.

In the display device 700 in FIG. 46, an insulating film 730 is provided over the planarization insulating film 770 and the conductive film 772. The insulating film 730 covers part of the conductive film 772. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 772 side, or a dual-emission structure in which light is emitted to both the conductive film 772 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 in FIG. 46, the structure is not limited thereto. In the case where the EL layer 786 is formed by a separate coloring method, the coloring film 736 is not necessarily provided.

STRUCTURE EXAMPLE OF DISPLAY DEVICE PROVIDED WITH INPUT/OUTPUT DEVICE

An input/output device may be provided in the display device 700 illustrated in FIG. 45 and FIG. 46. As an example of the input/output device, a touch panel or the like can be given.

Figure 49:
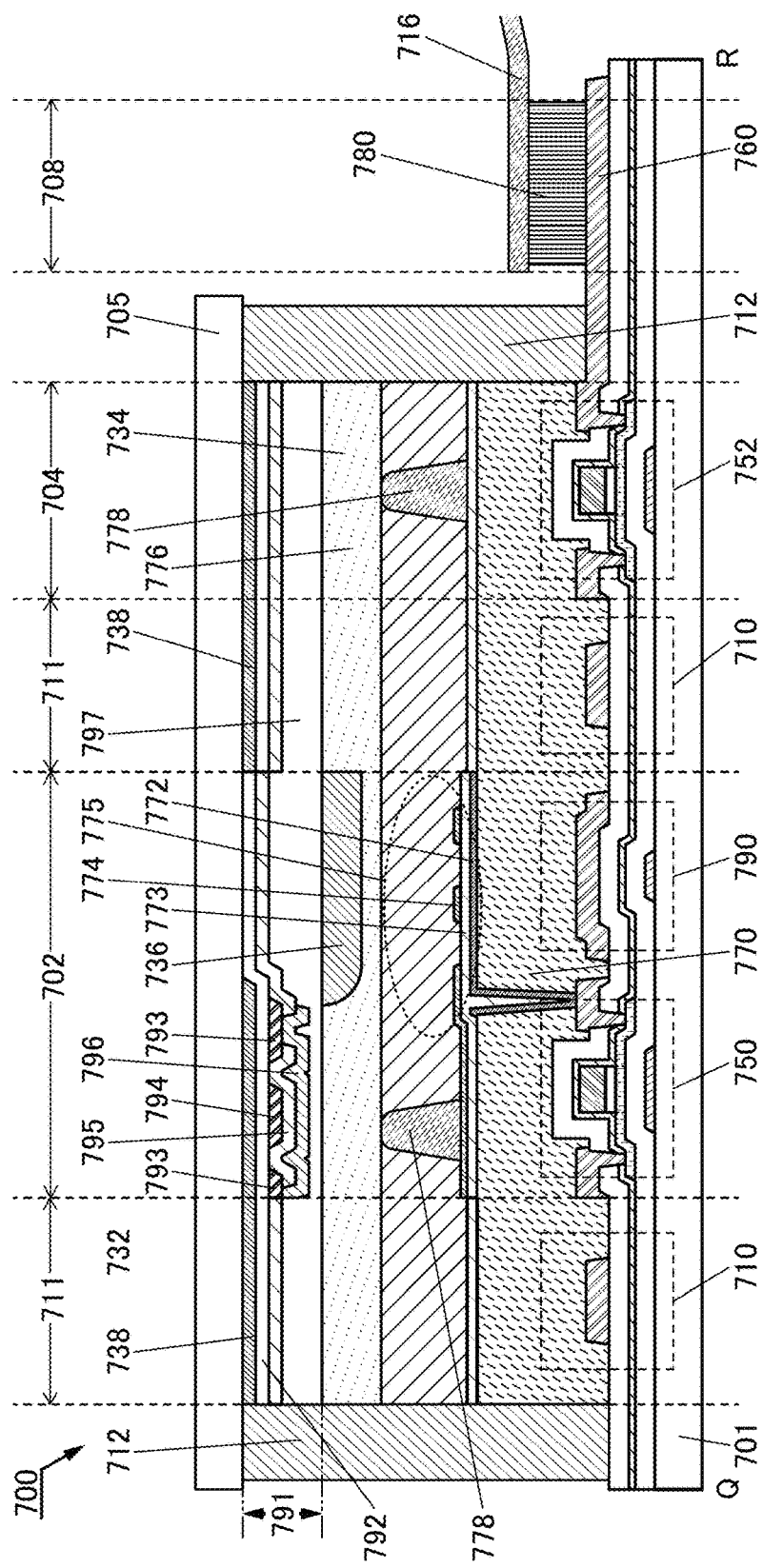
FIG. 49 is a cross-sectional view of one embodiment of a display device.
Figure 50:
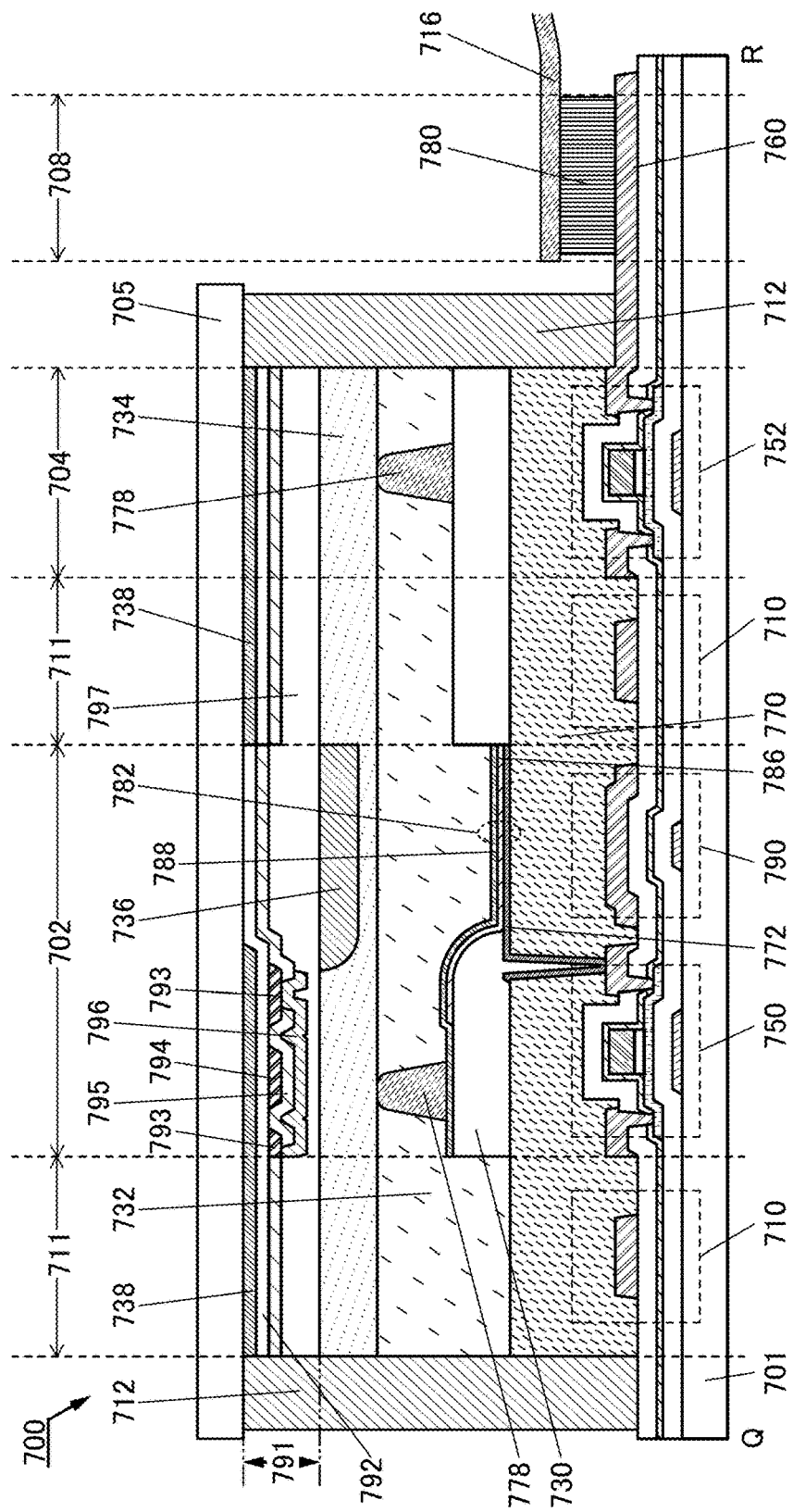
FIG. 50 is a cross-sectional view of one embodiment of a display device.

FIG. 49 is a cross-sectional view of the structure in which the touch panel 791 is provided in the display device 700 illustrated in FIG. 45. FIG. 50 is a cross-sectional view of the structure in which the touch panel 791 is provided in the display device 700 illustrated in FIG. 46.

First, the touch panel 791 illustrated in FIG. 49 and FIG. 50 is described below.

The touch panel 791 illustrated in FIG. 49 and FIG. 50 is an in-cell touch panel provided between the substrate 705 and the coloring film 736. The touch panel 791 is formed on the substrate 705 side before the light-blocking film 738 and the coloring film 736 are formed.

The touch panel 791 includes the light-blocking film 738, an insulating film 792, an electrode 793, an electrode 794, an insulating film 795, an electrode 796, and an insulating film 797. A change in the capacitance between the electrode 793 and the electrode 794 can be sensed when an object such as a finger or a stylus approaches, for example.

A portion in which the electrode 793 intersects with the electrode 794 is illustrated in the upper portion of the transistor 750 illustrated in FIG. 49 and FIG. 50. Through openings in the insulating film 795, the electrode 796 is electrically connected to the two electrodes 793 between which the electrode 794 is positioned. Note that a structure in which a region where the electrode 796 is provided is provided in the pixel portion 702 is illustrated in FIG. 49 and FIG. 50 as an example; however, one embodiment of the present invention is not limited thereto. For example, the region where the electrode 796 is provided may be provided in the source driver circuit portion 704.

The electrodes 793 and 794 are provided in a region overlapping with the light-blocking film 738. As illustrated in FIG. 49, it is preferable that the electrode 793 do not overlap with the light-emitting element 782. As illustrated in FIG. 50, it is preferable that the electrode 793 do not overlap with the liquid crystal element 775. In other words, the electrode 793 has an opening in its region overlapping with the light-emitting element 782 and the liquid crystal element 775. That is, the electrode 793 has a mesh shape. With this structure, the electrode 793 does not block light emitted from the light-emitting element 782. Alternatively, the electrode 793 can have a structure which does not block light transmitted through the liquid crystal element 775. Thus, since luminance is hardly reduced even when the touch panel 791 is placed, a display device with high visibility and low power consumption can be achieved. Note that the electrode 794 can have a similar structure.

In addition, since the electrodes 793 and 794 do not overlap with the light-emitting element 782, the electrodes 793 and 794 can be formed using a metal material with low visible light transmittance. In the case where the electrode 793 and the electrode 794 do not overlap with the liquid crystal element 775, a metal material having low transmittance with respect to visible light can be used for the electrode 793 and the electrode 794.

Accordingly, the resistance of the electrodes 793 and 794 can be reduced as compared with an electrode using an oxide material with high visible light transmittance, so that the sensitivity of the touch panel can be increased.

For example, conductive nanowires may be used for the electrodes 793, 794, and 796. The nanowires may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where a Ag nanowire is used for any one of or all of the electrodes 664, 665, and 667, the transmittance of visible light can be greater than or equal to 89% and the sheet resistance can be greater than or equal to 40 Ω/square and less than or equal to 100 Ω/square.

Although the structure of the in-cell touch panel is illustrated in FIG. 49 and FIG. 50, one embodiment of the present invention is not limited thereto. For example, a touch panel formed over the display device 700 (an on-cell touch panel), or a touch panel attached to the display device 700 (an out-cell touch panel) may be used.

In this manner, the display device of one embodiment of the present invention can be combined with various types of touch panels.

At least part of this embodiment can be implemented in combination with any of the other embodiments described in this specification as appropriate.

Embodiment 7

In this embodiment, an example of a semiconductor device of one embodiment of the present invention will be described. A transistor in this embodiment is suitable for miniaturization.

The above description can be referred to for materials and the like which can be used for components.

Figure 51A:
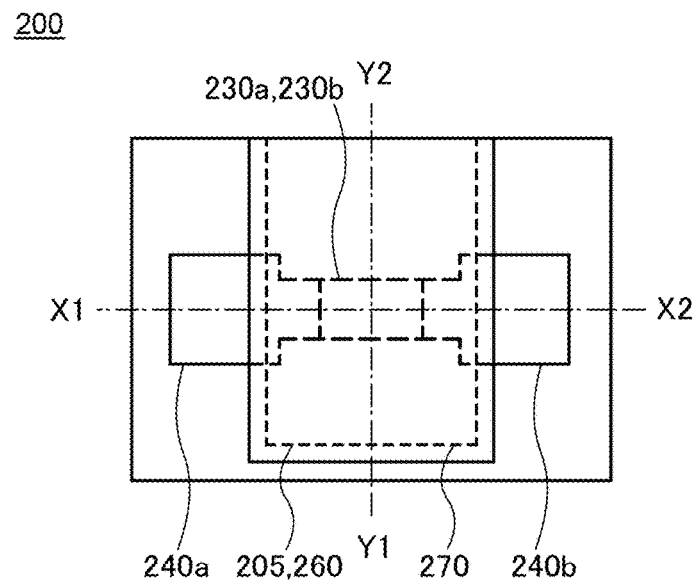
FIGS. 51A to 51C are a top view and cross-sectional views illustrating a semiconductor device.
Figure 51B:
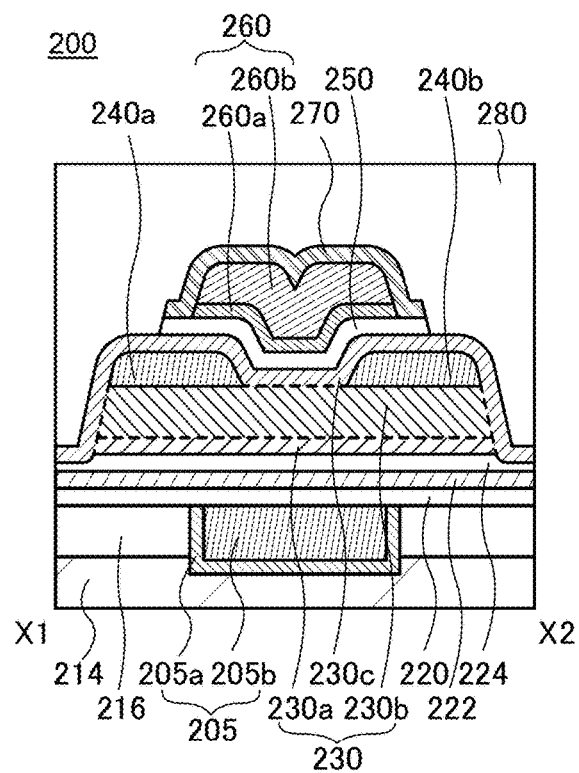
Figure 51C:
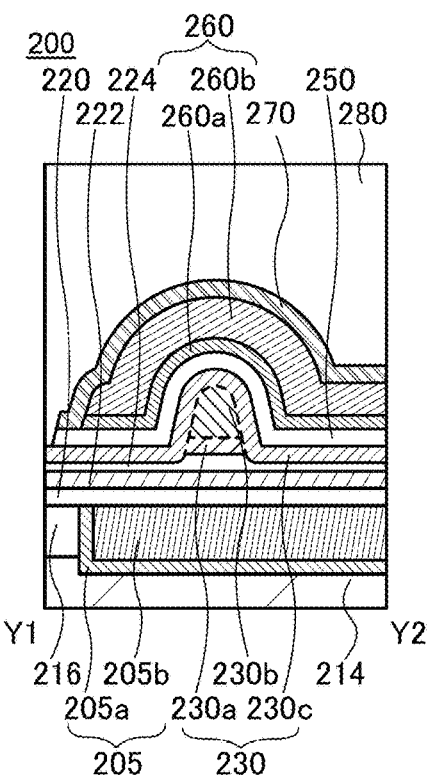

FIGS. 51A to 51C illustrate a top surface of a transistor 200. FIG. 51A illustrates a top surface of the transistor 200. For simplification of the figure, some films are omitted in FIG. 51A. FIG. 51B is a cross-sectional view taken along dashed-dotted line X1-X2 in FIG. 51A. FIG. 51C is a cross-sectional view taken along dashed-dotted line Y1-Y2 in FIG. 51A.

The transistor 200 includes a conductor 205 (a conductor 205a and a conductor 205b) and a conductor 260 (a conductor 260a and a conductor 260b) that function as gate electrodes; an insulator 220, an insulator 222, an insulator 224, and an insulator 250 that function as gate insulating layers; an oxide semiconductor 230 (an oxide semiconductor 230a, an oxide semiconductor 230b, and an oxide semiconductor 230c) that includes a region where a channel is formed; a conductor 240a that functions as one of a source and a drain; a conductor 240b that functions as the other of the source and the drain; and an insulator 280 that includes excess oxygen.

The oxide semiconductor 230 includes the oxide semiconductor 230a, the oxide semiconductor 230b over the oxide semiconductor 230a, and the oxide semiconductor 230c over the oxide semiconductor 230b. When the transistor 200 is turned on, a current flows (a channel is formed) mainly in the oxide semiconductor 230b. Although current sometimes flows through a region in the vicinity of the interface (a mixed region in some cases) between the oxide semiconductor 230b and the oxide semiconductors 230a and 230c, the oxide semiconductors 230a and 230c function as insulators at the other region.

FIGS. 51A to 51C illustrate a stacked-layer structure in which the conductor 260 serving as a gate electrode includes the conductor 260a and the conductor 260b. The insulator 270 is provided over the conductor 260 serving as a gate electrode.

For example, a conductor having a barrier property with respect to hydrogen, e.g., tantalum nitride, may be used as the conductor 205a, and tungsten, which has high conductivity, may be stacked thereover as the conductor 205b. The use of the combination of the materials can prevent diffusion of hydrogen into the oxide semiconductor 230 while conductivity of a wiring is ensured. A two-layer structure of a conductor 205a and a conductor 205b is shown in FIGS. 51A to 51C, but the structure of the conductor 205 is not limited thereto, and a single-layer structure or a stacked-layer structure of three or more layers may be used.

Each of the insulators 220 and 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). In the case where such an insulator containing excess oxygen is provided in contact with an oxide in the transistor 200, oxygen vacancies in the oxide can be compensated. Note that the insulators 220 and 224 are not necessarily formed of the same material.

The insulator 222 is preferably formed using an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST).

Note that the insulator 222 may have a stacked-layer structure of two or more layers. In this case, the stacked layers are not necessarily formed of the same material but may be formed of different materials.

In the case where the insulator 222 including a high-k material is provided between the insulator 220 and the insulator 224, electrons can be trapped in the insulator 222 under specific conditions, and the threshold voltage can be increased. As a result, the insulator 222 is negatively charged in some cases.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide in the transistor 200 to the conductor 205. At this time, some of the moving electrons are trapped by the electron trap states of the insulator 222.

In the transistor in which a necessary amount of electrons is trapped by the electron trap states of the insulator 222, the threshold voltage is shifted in the positive direction. By controlling the voltage of the conductor 205, the amount of electrons to be trapped can be controlled, and thus the threshold voltage can be controlled. The transistor 200 having the structure is a normally-off transistor which is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging.

The threshold voltages can be controlled by appropriate adjustment of the thicknesses of the insulator 220, the insulator 222, and the insulator 224. A transistor having a low leakage current in an off state can be provided. A transistor with stable electrical characteristics can be provided. A transistor having a high on-state current can be provided. A transistor with a small subthreshold swing value can be provided. A highly reliable transistor can be provided.

A high-k material which is similar to that for the insulating film 222 may be used for the insulator 250.

As the insulator 250, like the insulator 224, an oxide insulator that contains oxygen in excess of the stoichiometric composition is preferably used. When such an insulator containing excess oxygen is provided in contact with the oxide semiconductor 230, oxygen vacancies in the oxide semiconductor 230 can be reduced.

As the insulator 250, an insulating film which has barrier properties with respect to oxygen and hydrogen can be used. The insulator formed of such a material functions as a layer that prevents release of oxygen from the oxide semiconductor 230 or entry of an impurity such as hydrogen from the outside.

Note that the insulator 250 may have a stacked-layer structure similar to that of the insulator 220, the insulator 222, and the insulator 224. When the insulator 250 includes an insulator in which a necessary amount of electrons is trapped by electron trap states, the threshold voltage of the transistor 200 can be shifted in the positive direction. The transistor 200 having the structure is a normally-off transistor which is in a non-conduction state (also referred to as an off state) even when the gate voltage is 0 V.

In addition to the insulator 250, a barrier film may be provided between the oxide semiconductor 230 and the conductor 260 in the semiconductor device illustrated in FIGS. 51A to 51C. The oxide semiconductor 230c may have a barrier property.

For example, an insulating film containing excess oxygen is provided in contact with the oxide semiconductor 230 and covered by a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide semiconductor 230.

One of a pair of the conductor 240a and the conductor 240b functions as a source electrode, and the other pair functions as a drain electrode. The conductor 260 functions as a gate electrode.

The conductor 260a is formed by a thermal CVD method, an MOCVD method, and an ALD method. In particular, the conductor 260a is preferably formed by an atomic layer deposition (ALD) method. Plasma damage to the insulator 250 can be reduced by using an ALD method and the like. In addition, the conductive layer 260a is preferably formed by an ALD method or the like because coverage thereof can be improved. Accordingly, a highly reliable transistor 200 can be provided.

The conductor 260b is formed by a material with high conductivity such as a metal material.

The insulator 270 may be provided to cover the conductor 260. In the case where the insulator 280 is formed using an oxide material from which oxygen is released, the insulator 270 is formed using a substance having a barrier property with respect to oxygen to prevent the conductor 260 from being oxidized by the released oxygen.

For example, the insulator 270 can be formed using metal oxide such as aluminum oxide. Thus, the oxidation of the conductor 260 can be prevented, and oxygen released from the insulator 280 can be supplied to the oxide semiconductor 230 efficiently. The insulator 270 is formed to a thickness with which the oxidation of the conductor 260 is prevented. The thickness of the insulator 270 is set greater than or equal to 1 nm and less than or equal to 10 nm, preferably greater than or equal to 3 nm and less than or equal to 7 nm.

An insulator 280 is provided over the transistor 200. The insulator 280 preferably includes oxide containing oxygen in excess of that in the stoichiometric composition. That is, in the insulator 280, a region containing oxygen in excess of that in the stoichiometric composition (hereinafter also referred to as excess-oxygen region) is preferably formed. In particular, in the case of using an oxide semiconductor in the transistor 200, when an insulator including an excess-oxygen region is provided as an interlayer film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used. Oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, silicon oxynitride refers to a material that contains oxygen at a higher proportion than nitrogen, and silicon nitride oxide refers to a material that contains nitrogen at a higher proportion than oxygen.

The insulator 280 covering the transistor 200 may function as a planarization film that covers a roughness thereunder.

APPLICATION EXAMPLE

An example of stacking transistors with different compositions is described below.

Figure 52:
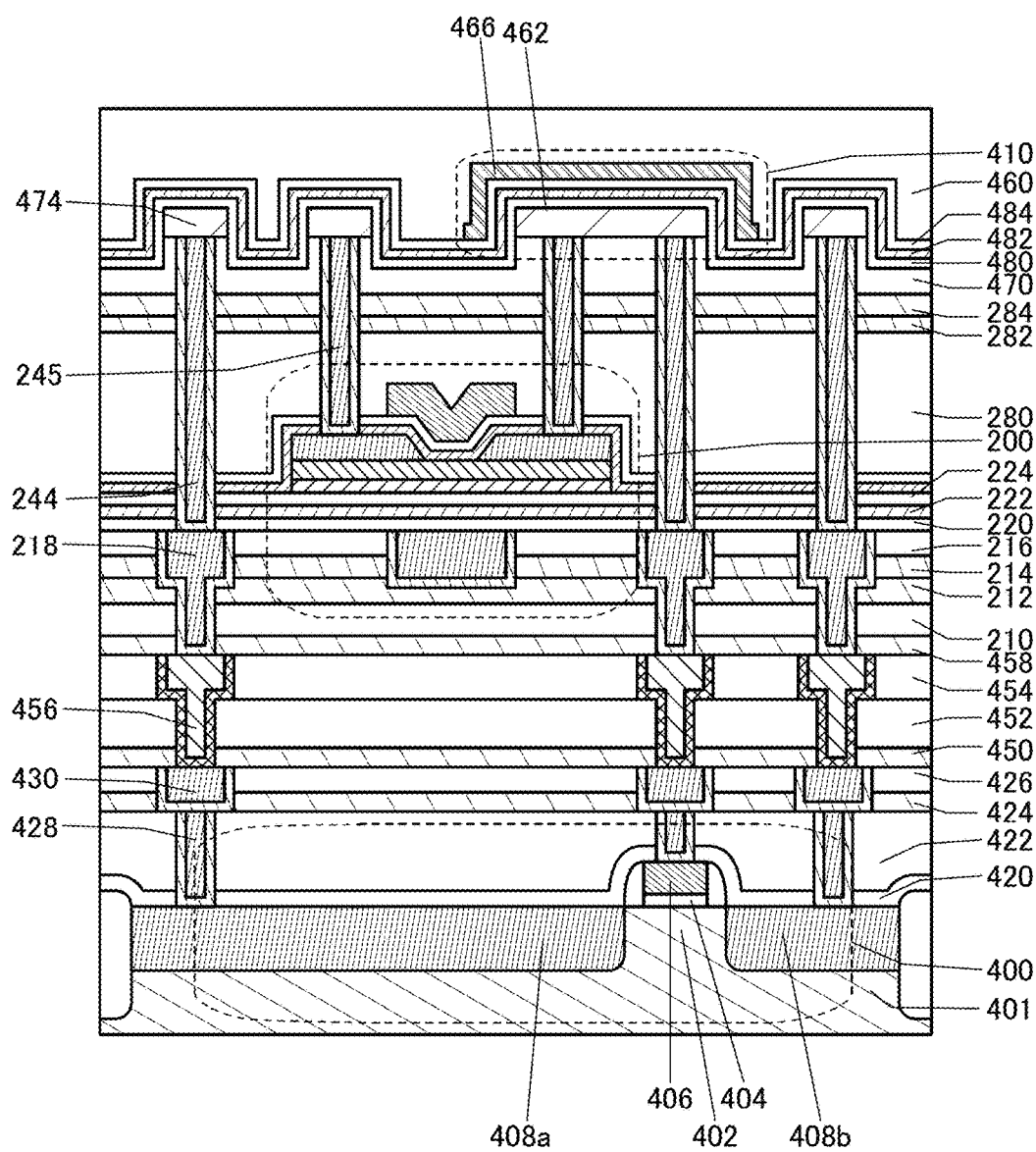
FIG. 52 is a cross-sectional view illustrating a semiconductor device.

A semiconductor device shown in FIG. 52 includes a transistor 400, a transistor 200, and a capacitor 410.

The transistor 200 is a transistor in which a channel is formed in a semiconductor layer including an oxide semiconductor. Since the off-state current of the transistor 200 is small, by using the transistor 200 in the semiconductor device (memory device), stored data can be held for a long time. In other words, it is possible to obtain a semiconductor device (memory device) which does not require refresh operation or has an extremely low frequency of the refresh operation, which leads to a sufficient reduction in power consumption.

The semiconductor device includes the transistor 400, the transistor 200, and the capacitor 410 as shown in FIG. 52. The transistor 200 is provided over the transistor 400, and the capacitor 410 is provided over the transistor 400 and the transistor 200.

The transistor 400 is provided over a substrate 401 and includes a conductor 406, an insulator 404, a semiconductor region 402 that is part of the substrate 401, and low-resistance regions 408a and 408b functioning as a source region and a drain region. The low-resistance regions 408a and 408b each contain an impurity such as phosphorus or boron.

The transistor 400 may be a p-channel transistor or an n-channel transistor.

It is preferable that a region of the semiconductor region 402 where a channel is formed, a region in the vicinity thereof, the low-resistance regions 408a and 408b functioning as a source region and a drain region, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 400 may be a high-electron-mobility transistor (HEMT) with GaAs and GaAlAs or the like.

Note that the transistor 400 shown in FIG. 52 is just an example and is not limited to the structure shown therein; an appropriate transistor may be used in accordance with a circuit configuration or a driving method.

An insulator 420, an insulator 422, an insulator 424, and an insulator 426 are stacked sequentially and cover the transistor 400.

The insulator 422 functions as a planarization film for eliminating a level difference caused by the transistor 400 or the like underlying the insulator 422. A top surface of the insulator 422 may be planarized by planarization treatment using a chemical mechanical polishing (CMP) method or the like to increase the level of planarity.

The insulator 424 is preferably formed using, for example, a film having a barrier property that prevents hydrogen or impurities from diffusing from the substrate 401, the transistor 400, or the like into a region where the transistor 200 is formed.

Note that the dielectric constant of the insulator 426 is preferably lower than that of the insulator 424. For example, the relative dielectric constant of the insulator 426 is preferably lower than 4, more preferably lower than 3. For example, the relative dielectric constant of the insulator 424 is preferably 0.7 times or less that of the insulator 426, more preferably 0.6 times or less that of the insulator 426. In the case where a material with a low dielectric constant is used as an interlayer film, the parasitic capacitance between wirings can be reduced.

A conductor 428, a conductor 430, and the like that are electrically connected to the capacitor 410 or the transistor 200 are embedded in the insulator 420, the insulator 422, the insulator 424, and the insulator 426. Note that the conductor 428 and the conductor 430 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

Furthermore, the conductor 428 and the conductor 430 preferably include a conductor having a barrier property with respect to hydrogen such as tantalum nitride. The conductor having a barrier property with respect to hydrogen is formed particularly in an opening portion of the insulator 424 having a barrier property with respect to hydrogen. In such a structure, the transistor 400 and the transistor 200 can be separated by a layer having a barrier property, so that diffusion of hydrogen from the transistor 400 to the transistor 200 can be prevented.

A wiring layer may be provided over the insulator 426 and the conductor 430. For example, in FIG. 52, an insulator 450, an insulator 452, and an insulator 454 are stacked sequentially. The conductor 456 is formed in the insulator 450, the insulator 452, and the insulator 454. The conductor 456 functions as a plug or a wiring. Note that the conductor 456 can be formed using a material similar to that used for forming the conductor 428 and the conductor 430.

In addition, the conductor 456 is preferably formed using a low-resistance conductive material such as aluminum or copper.

Furthermore, an insulator which inhibits diffusion of copper or has a barrier property against oxygen and hydrogen, such as silicon nitride, is preferably used as the insulator 450. It is preferable to provide the conductor which inhibits diffusion of copper in contact with an opening of the insulator 450 which inhibits diffusion of copper. Copper is preferably stacked over the conductor which inhibits diffusion of copper.

An insulator 458, an insulator 210, an insulator 212, and an insulator 214 are stacked in this order over the insulator 454. A material inhibiting diffusion of copper or a material having a barrier property against oxygen or hydrogen is preferably used for one or all of the insulator 458, the insulator 210, the insulator 212, and the insulator 214.

An insulator 216 is provided over the insulator 214. The insulator 216 can be formed using a material similar to that used for forming the insulator 420.

A conductor 218, a conductor 205 forming the transistor 200, and the like are embedded in the insulator 458, the insulator 210, the insulator 212, the insulator 214, and the insulator 216. Note that the conductor 218 functions as a plug or a wiring that is electrically connected to the capacitor 410 or the transistor 400.

In particular, the conductor 218 is preferably a conductor inhibiting diffusion of copper or having a barrier property against oxygen, hydrogen, and water.

The transistor 200 and the insulator 280 are provided over the insulator 214. Note that the transistor 200 shown in FIG. 52 is just an example and is not limited to the structure shown therein; an appropriate transistor may be used in accordance with a circuit configuration or a driving method.

An insulator 282, an insulator 284, and an insulator 470 are stacked sequentially over the insulator 280. A conductor 244 and the like are embedded in an insulator 220, an insulator 222, an insulator 224, the insulator 280, the insulator 282, the insulator 284, and the insulator 470. A conductor 245 and the like which connect a conductor in an above layer are provided over the conductor such as the conductor 240a and the conductor 240b included in the transistor 200. Note that the conductor 244 functions as a plug or a wiring that is electrically connected to the capacitor 410, the transistor 200, or the transistor 400. The conductor 244 can be formed using a material similar to that used for forming the conductor 428 and the conductor 430.

A material having a barrier property against oxygen or hydrogen is preferably used for one or both of the insulator 282 and the insulator 284.

The capacitor 410 and a conductor 474 are provided over the insulator 470. The capacitor 410 is provided over the insulator 470 and includes the conductor 462, the insulator 480, the insulator 482, the insulator 484, and the conductor 466. Note that the conductor 474 functions as a plug or a wiring that is electrically connected to the capacitor 410, the transistor 200, or the transistor 400.

The insulator 480, the insulator 482, the insulator 484 are provided over the conductor 474 and the conductor 462.

For example, a material with high dielectric strength such as silicon oxynitride is preferably used as the insulator 480 and the insulator 484. In addition, as the insulator 482, a high dielectric constant (high-k) material such as aluminum oxide is preferably stacked with a material with high dielectric strength such as silicon oxynitride. With this structure, the capacitor 410 can have a sufficient capacitance owing to a high dielectric constant (high-k) insulator and can have a higher dielectric strength owing to an insulator with high dielectric strength for avoiding electrostatic breakdown.

The conductor 466 is provided over the conductor 462 with the insulator 480, the insulator 482, and the insulator 484 provided therebetween.

For example, the insulator 480, the insulator 482, and the insulator 484 may be provided to cover the top surface and the side surface of the conductor 462 as illustrated in FIG. 52. Furthermore, the conductor 466 may be provided to cover the top surface and the side surface of the conductor 462 with the insulator 480, the insulator 482, and the insulator 484 provided therebetween.

That is, a capacitance is formed also on the side surface of the conductor 462, so that a capacitance per projected area of a capacitor can be increased. Thus, the semiconductor device can be reduced in area, highly integrated, and miniaturized.

An insulator 460 is provided over the conductor 466 and the insulator 484. The insulator 460 can be formed using a material similar to that used for forming the insulator 420. The insulator 460 covering the capacitor 410 may function as a planarization film that covers a roughness thereunder.

The above is the description of the application example.

At least part of this embodiment can be implemented in combination with any of the other embodiments described in this specification as appropriate.

Embodiment 8

In this embodiment, a display device that includes the semiconductor device of one embodiment of the present invention is described with reference to FIGS. 53A to 53C.

[Circuit Configuration of Display Device]

The display device illustrated in FIG. 53A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (image signal) from which a data signal is derived, as well as a signal for driving the shift register, through the terminal portion 507. The source driver 504b has a function of generating a data signal to be written to the pixel circuit 501 which is based on the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches, for example. The source driver 504b can output, as the data signals, signals obtained by time-dividing the image signal by sequentially turning on the plurality of analog switches.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

The protection circuit 506 is a circuit that electrically connects a wiring connected to the protection circuit to another wiring when a potential out of a certain range is applied to the wiring connected to the protection circuit.

Figure 53A:
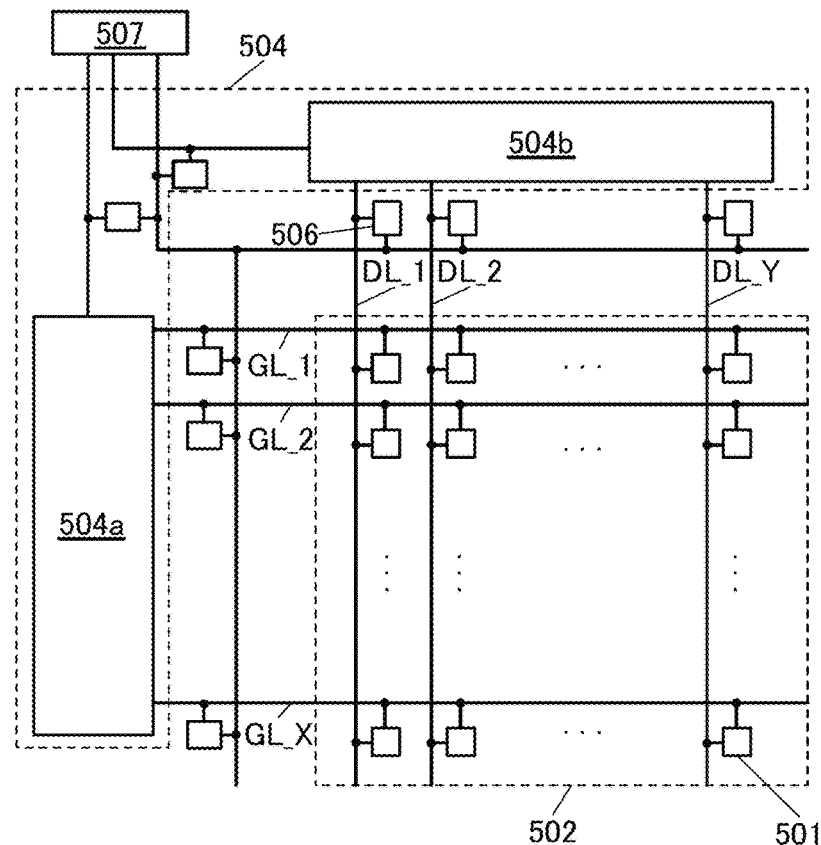
FIGS. 53A to 53C are a block diagram and circuit diagrams illustrating a display device.

The protection circuit 506 illustrated in FIG. 53A is connected to, for example, the scan line GL between the gate driver 504a and the pixel circuit 501, the data line DL between the source driver 504b and the pixel circuit 501, or a wiring between the terminal portion 507 and the gate driver 504a or the source driver 504b. Note that the terminal portion 507 means a portion having terminals for inputting power, control signals, and video signals to the display device from external circuits.

As illustrated in FIG. 53A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto, and for example, the protection circuit 506 may be connected to the gate driver 504a, the source driver 504b, or the terminal portion 507.

In FIG. 53A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 53B:
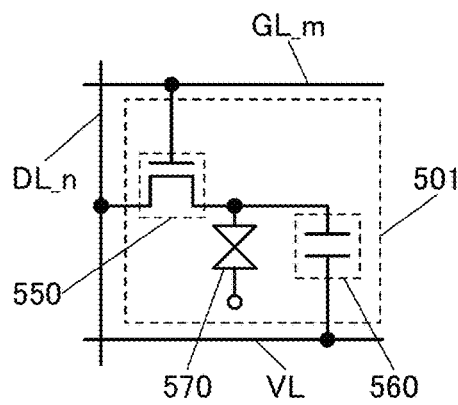

Each of the plurality of pixel circuits 501 in FIG. 53A can have the structure illustrated in FIG. 53B, for example.

The pixel circuit 501 in FIG. 53B includes a liquid crystal element 570, a transistor 550, and a capacitor 560. As the transistor 550, any of the transistors described in the above embodiment, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the method of driving the display device include an electrically controlled birefringence (ECB) mode, a polymer-dispersed liquid crystal (PDLC) mode, a polymer network liquid crystal (PNLC) mode, and a guest-host mode. A variety of liquid crystal elements and the driving methods thereof can be used.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 53B, the pixel circuits 501 are sequentially selected row by row by the gate driver 504a illustrated in FIG. 53A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 53C:
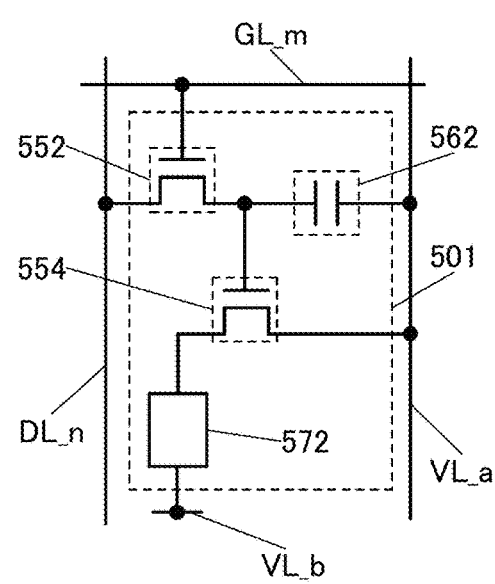

Alternatively, each of the plurality of pixel circuits 501 in FIG. 53A can have the structure illustrated in FIG. 53C, for example.

The pixel circuit 501 illustrated in FIG. 53C includes transistors 552 and 554, a capacitor 562, and a light-emitting element 572. Any of the transistors described in the above embodiment, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) can be used, for example. Note that the light-emitting element 572 is not limited to an organic EL element; an inorganic EL element including an inorganic material may be used.

Note that a high power supply potential $V_{DD}$ is supplied to one of the potential supply line VL_a and the potential supply line VL_b, and a low power supply potential $V_{SS}$ is supplied to the other.

For example, in the display device including the pixel circuit 501 in FIG. 53C, the pixel circuits 501 are sequentially selected row by row by the gate driver 504a illustrated in FIG. 53A, whereby the transistor 552 is turned on and a data signal is written.

When the transistor 552 is turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with luminance corresponding to the amount of flowing current. This operation is sequentially performed row by row; thus, an image is displayed.

At least part of this embodiment can be implemented in combination with any of the other embodiments described in this specification as appropriate.

Embodiment 9

In this embodiment, circuit configuration examples to which the transistors described in the above embodiments can be applied will be described with reference to FIGS. 54A to 54C and FIGS. 55A to 55C.

[Configuration Example of Inverter Circuit]

Figure 54A:
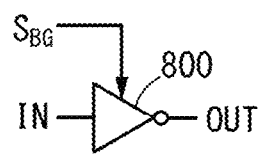
FIGS. 54A to 54C are circuit diagrams and a timing chart for describing one embodiment of the present invention.

FIG. 54A is a circuit diagram of an inverter which can be used for a shift register, a buffer, or the like included in the driver circuit. An inverter 800 outputs a signal whose logic is inverted from the logic of a signal supplied to an input terminal IN to an output terminal OUT. The inverter 800 includes a plurality of OS transistors. A signal SBG can switch electrical characteristics of the OS transistors.

Figure 54B:
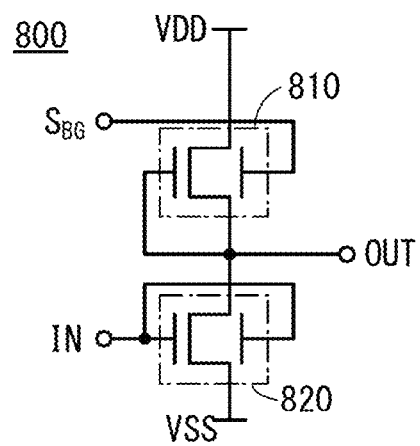

FIG. 54B illustrates an example of the inverter 800. The inverter 800 includes OS transistors 810 and 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including Si transistors. Since the inverter 800 can be provided so as to overlap with the CMOS circuit, no additional area is required for the inverter 800, and thus, an increase in the circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal SBG. The first terminal of the OS transistor 810 is connected to a wiring which supplies a voltage $V_{DD}$. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring which supplies a voltage $V_{SS}$.

Figure 54C:
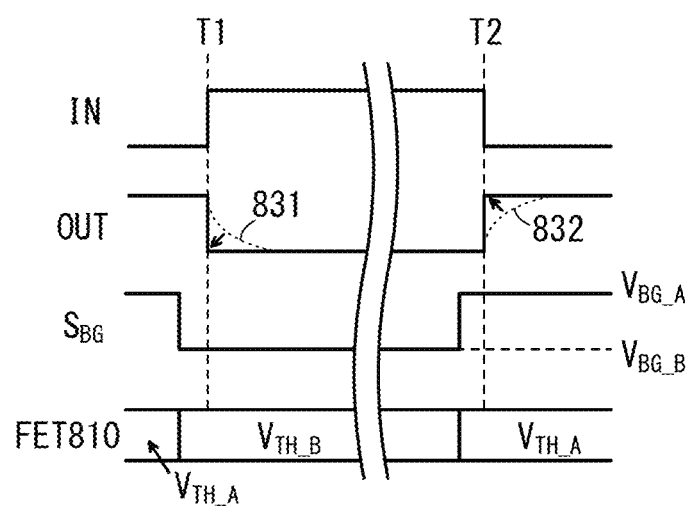

FIG. 54C is a timing chart illustrating the operation of the inverter 800. The timing chart in FIG. 54C illustrates changes of a signal waveform of the input terminal IN, a signal waveform of the output terminal OUT, a signal waveform of the signal SBG, and the threshold voltage of the OS transistor 810.

The signal SBG can be supplied to the second gate of the OS transistor 810 to control the threshold voltage of the OS transistor 810.

The signal SBG includes a voltage $B_{BG\_A}$ for shifting the threshold voltage in the negative direction and a voltage $B_{BG\_B}$ for shifting the threshold voltage in the positive direction. The threshold voltage of the OS transistor 810 can be shifted in the negative direction to be a threshold voltage $V_{TH\_A}$ when the voltage $B_{BG\_A}$ is applied to the second gate. The threshold voltage of the OS transistor 810 can be shifted in the positive direction to be a threshold voltage $V_{TH\_B}$ when the voltage $B_{BG\_B}$ is applied to the second gate.

The shift of the threshold voltage in the positive direction toward the threshold voltage $V_{TH\_B}$ can make current less likely to flow in the OS transistor 810.

Thus, a current that flows in the OS transistor 810 can be extremely low. Thus, when a signal supplied to the input terminal IN is at a high level and the OS transistor 820 is on, the voltage of the output terminal OUT can be sharply decreased.

Since a state in which a current is less likely to flow in the OS transistor 810 can be obtained, a signal waveform of the output terminal in the timing chart in FIG. 54C can be made steep. Shoot-through current between the wiring that supplies the voltage $V_{DD}$ and the wiring that supplies the voltage $V_{SS}$ can be low, leading to low-power operation.

The shift of the threshold voltage in the negative direction toward the threshold voltage $V_{TH\_A}$ can make current flow easily in the OS transistor 810. Thus, when a signal supplied to the input terminal IN is at a low level and the OS transistor 820 is off, the voltage of the output terminal OUT can be increased sharply.

Note that the threshold voltage of the OS transistor 810 is preferably controlled by the signal SBG before the state of the OS transistor 820 is switched, i.e., before Time T1 or T2. For example, as in FIG. 54C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 54C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 55A:
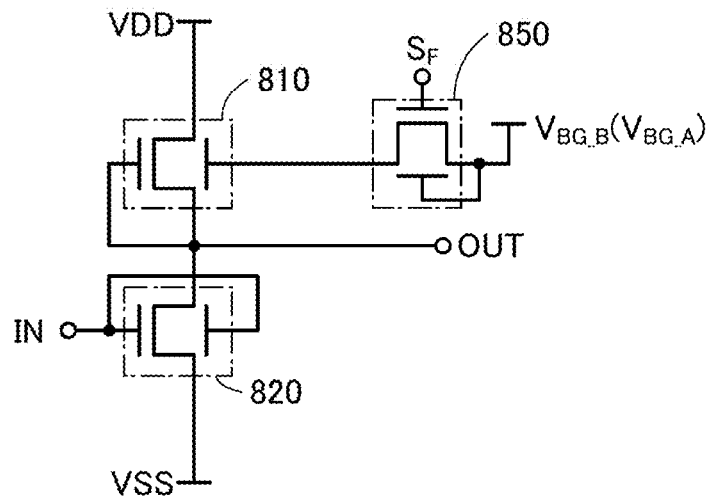
FIGS. 55A and 55B are circuit diagrams each illustrating one embodiment of the present invention.

Although the timing chart in FIG. 54C shows the structure in which the level of the signal SBG is switched in accordance with the signal supplied to the input terminal IN, a different structure may be employed in which voltage for controlling the threshold voltage is held by the second gate of the OS transistor 810 in a floating state, for example. FIG. 55A illustrates an example of such a circuit configuration.

The circuit configuration in FIG. 55A is the same as that in FIG. 54B, except that an OS transistor 850 is added. A first terminal of the OS transistor 850 is connected to the second gate of the OS transistor 810. A second terminal of the OS transistor 850 is connected to a wiring which supplies the voltage $B_{BG\_B}$ (or the voltage $B_{BG\_A}$). A first gate of the OS transistor 850 is connected to a wiring which supplies a signal $S_F$. A second gate of the OS transistor 850 is connected to the wiring which supplies the voltage $B_{BG\_B}$ (or the voltage $B_{BG\_A}$).

Figure 55B:
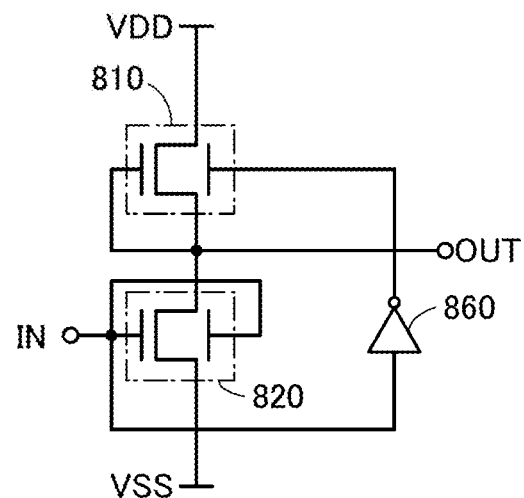

Although FIGS. 54B and 54A illustrate the case where the voltage is supplied to the second gate of the OS transistor 810 by control from the outside, a different configuration in which voltage for controlling the threshold voltage is generated on the basis of the signal supplied to the input terminal IN and supplied to the second gate of the OS transistor 810 may be employed, for example. FIG. 55B illustrates an example of such a circuit structure.

The circuit configuration in FIG. 55B is the same as that in FIG. 54B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

As described above, in the structure of the inverter including the OS transistor in this embodiment, the voltage of the back gate is switched in accordance with the logic of the signal supplied to the input terminal IN. In such a structure, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

At least part of this embodiment can be implemented in combination with any of the other embodiments described in this specification as appropriate.

Embodiment 10

In this embodiment, a display module and electronic devices, each of which includes a semiconductor device of one embodiment of the present invention, will be described with reference to FIG. 56, FIGS. 57A to 57E, FIGS. 58A to 58G, and FIGS. 59A and 59B.

[Display Module]

Figure 56:
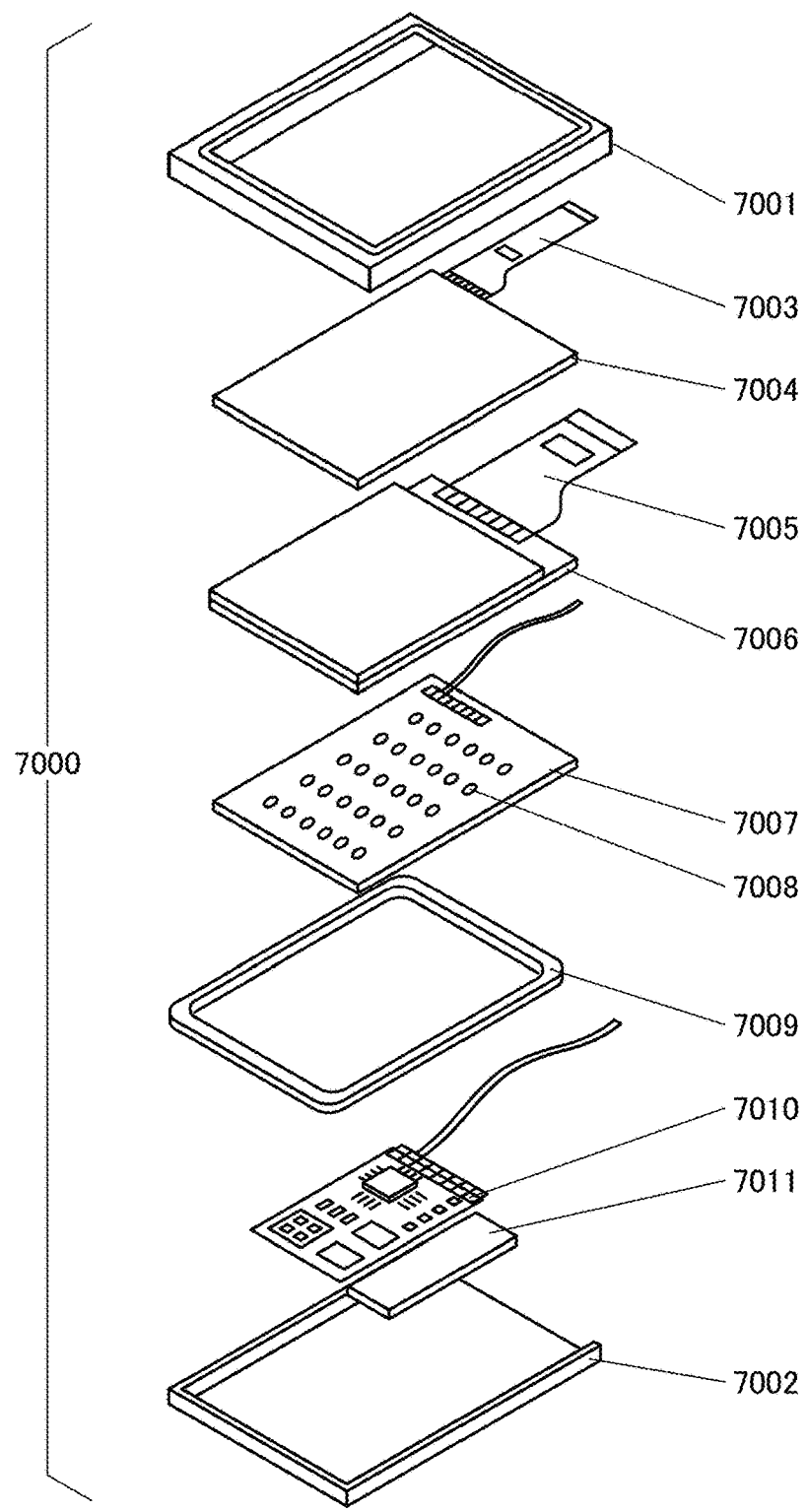
FIG. 56 illustrates a display module.

In a display module 7000 illustrated in FIG. 56, a touch panel 7004 connected to an FPC 7003, a display panel 7006 connected to an FPC 7005, a backlight 7007, a frame 7009, a printed board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 56, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed board 7010. The frame 7009 may also function as a radiator plate.

The printed board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

[Electronic Device 1]

Next, FIGS. 57A to 57E illustrate examples of electronic devices.

Figure 57A:
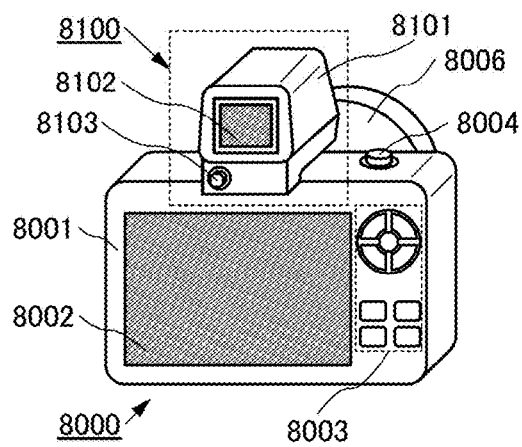
FIGS. 57A to 57E illustrate electronic devices.

FIG. 57A is an external view of a camera 8000 to which a finder 8100 is attached.

The camera 8000 includes a housing 8001, a display portion 8002, operation buttons 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 which serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 functions as a power supply button. With the button 8103, the display portion 8102 can be turned on and off A display device of one embodiment of the present invention can be used in the display portion 8002 of the camera 8000 and the display portion 8102 of the finder 8100.

Although the camera 8000 and the finder 8100 are separate and detachable electronic devices in FIG. 57A, the housing 8001 of the camera 8000 may include a finder having a display device.

Figure 57B:
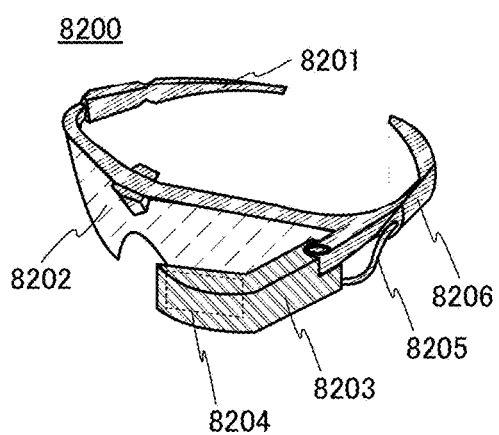

FIG. 57B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 57C:
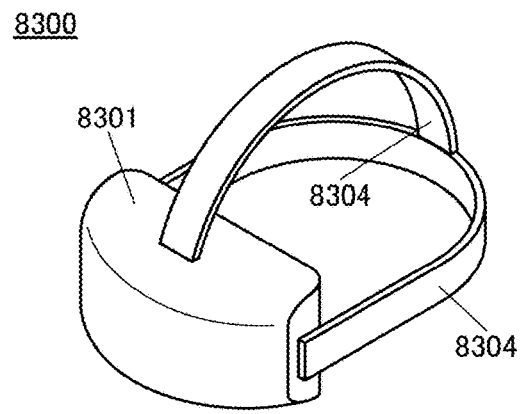
Figure 57D:
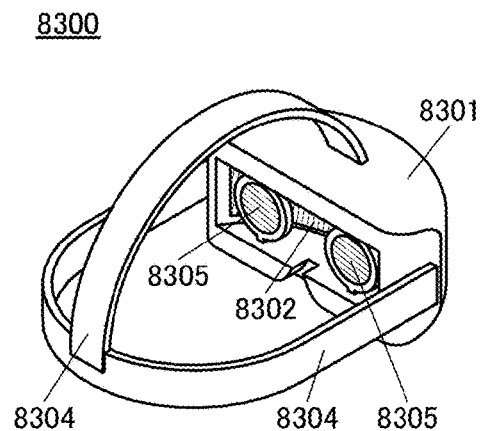
Figure 57E:
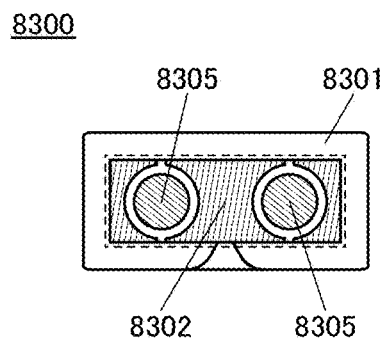

FIGS. 57C to 57E are external views of a head-mounted display 8300. The head-mounted display 8300 includes a housing 8301, a display portion 8302, fixing bands 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 57E, the user does not perceive pixels, and thus a more realistic image can be displayed.

[Electronic Device 2]

Next, FIGS. 57A to 57E illustrate examples of electronic devices that are different from those illustrated in FIGS. 58A to 58G.

Electronic devices illustrated in FIGS. 58A to 58G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 58A to 58G can have a variety of functions. For example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display portion. Note that functions which can be provided for the electronic devices illustrated in FIGS. 58A to 58G are not limited them, and the electronic devices can have a variety of functions. Although not illustrated in FIGS. 58A to 58G, the electronic devices may each have a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 58A to 58G will be described in detail below.

Figure 58A:
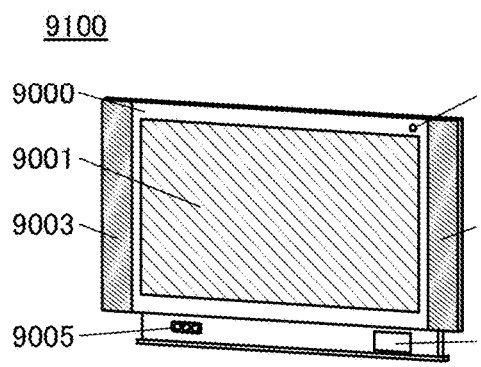
FIGS. 58A to 58G illustrate electronic devices.

FIG. 58A is a perspective view illustrating a television device 9100. The television device 9100 can include the display portion 9001 having a large screen size of, for example, 50 inches or more, or 100 inches or more.

Figure 58B:
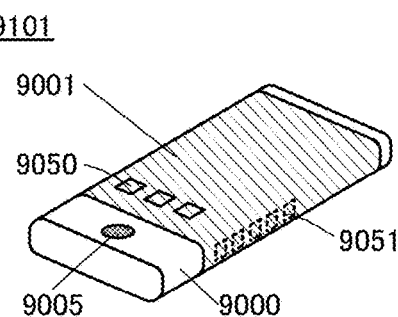

FIG. 58B is a perspective view of a portable information terminal 9101. The portable information terminal 9101 functions as, for example, one or more of a telephone set, a notebook, an information browsing system, and the like. Specifically, the portable information terminal can be used as a smartphone. Note that the portable information terminal 9101 may include the speaker 9003, the connection terminal 9006, the sensor 9007, or the like. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 58C:
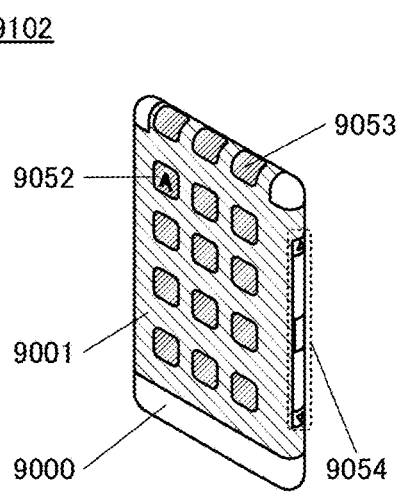

FIG. 58C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 58D:
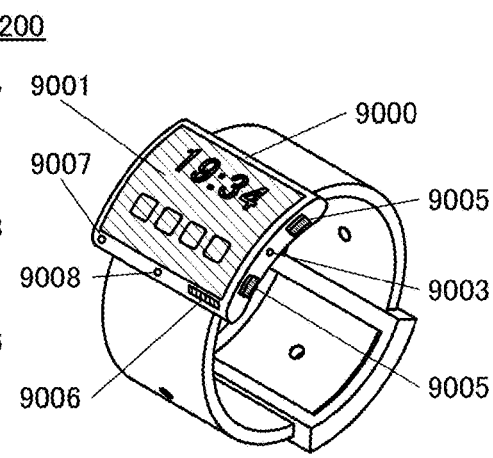

FIG. 58D is a perspective view illustrating a wrist-watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 58E:
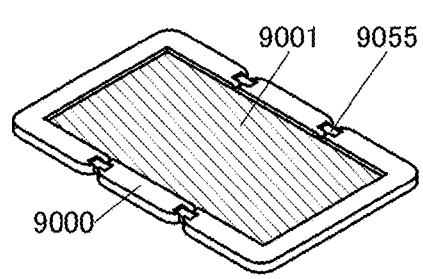
Figure 58F:
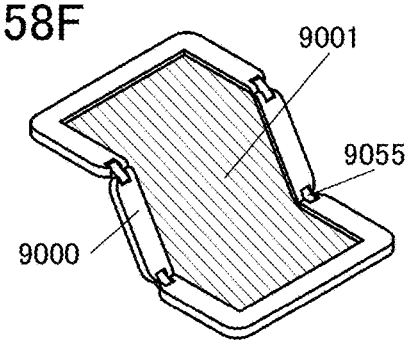
Figure 58G:
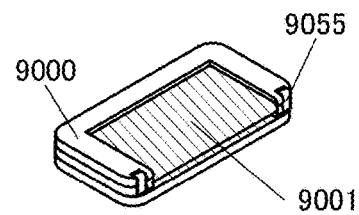

FIGS. 58E to 58G are perspective views of a foldable portable information terminal 9201. FIG. 58E is a perspective view of the foldable portable information terminal 9201 that is opened. FIG. 58F is a perspective view of the foldable portable information terminal 9201 that is being opened or being folded. FIG. 58G is a perspective view of the foldable portable information terminal 9201 that is folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

Figure 59A:
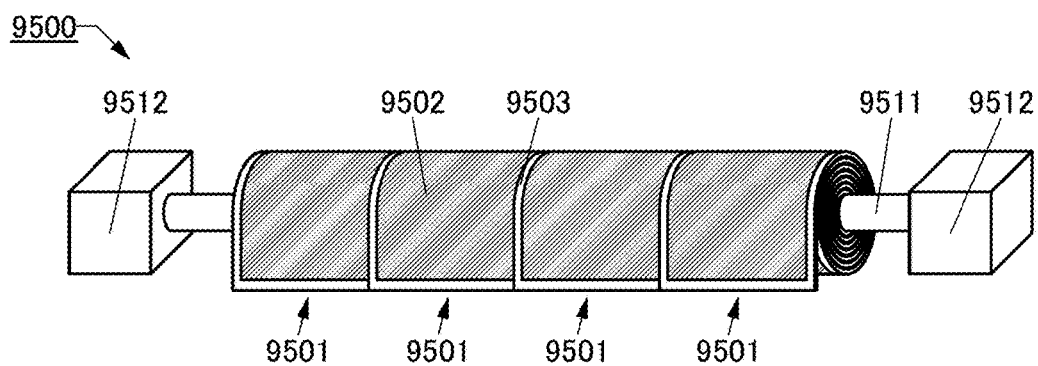
FIGS. 59A and 59B are perspective views illustrating a display device.
Figure 59B:
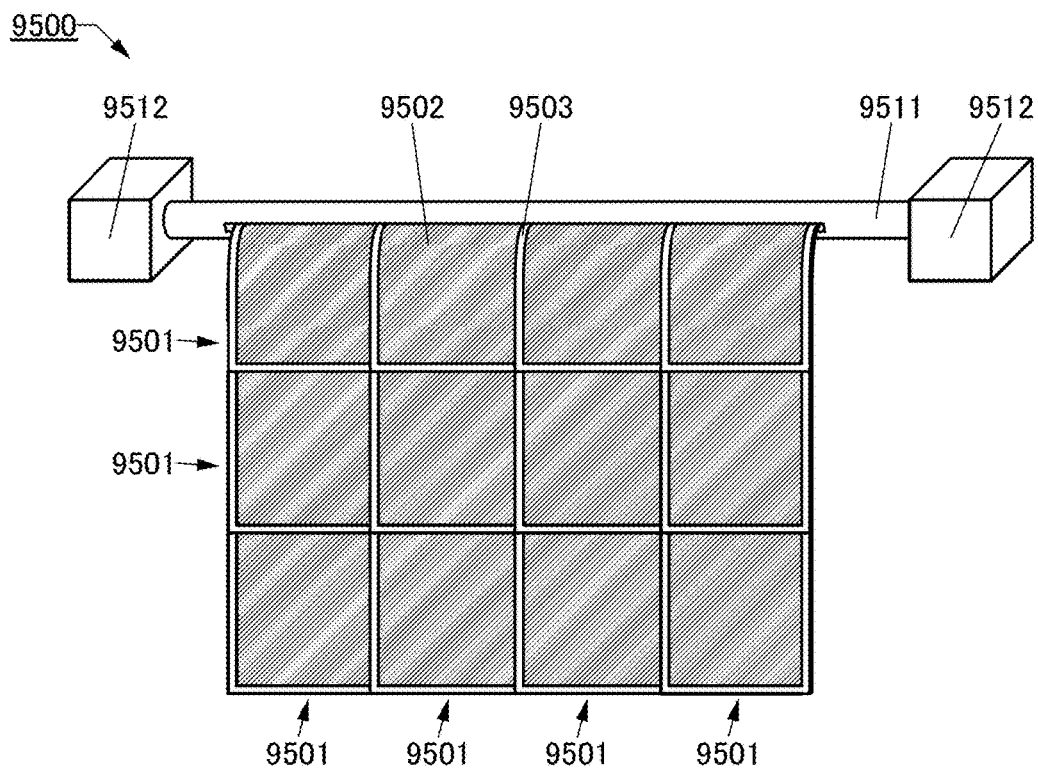

Next, FIGS. 59A and 59B illustrate examples of electronic devices that are different from those illustrated in FIGS. 57A to 57E and FIGS. 58A to 58G. FIGS. 59A and 59B are perspective views of a display device including a plurality of display panels. Note that the plurality of display panels are wound in the perspective view in FIG. 59A and are unwound in the perspective view in FIG. 59B.

A display device 9500 illustrated in FIGS. 59A and 59B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 59A and 59B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the semiconductor device of one embodiment of the present invention can also be used for an electronic device that does not have a display portion.

At least part of this embodiment can be implemented in combination with any of the other embodiments described in this specification as appropriate.

This application is based on Japanese Patent Application serial no. 2016-024845 filed with Japan Patent Office on Feb. 12, 2016, and Japanese Patent Application serial no. 2016-125480 filed with Japan Patent Office on Jun. 24, 2016, the entire contents of which are hereby incorporated by reference.

What is claimed is:

1. A semiconductor device comprising:
a transistor comprising a semiconductor layer,
wherein the semiconductor layer comprises an oxide semiconductor,
wherein the semiconductor layer is a stacked-layer structure,
wherein the semiconductor layer comprises In, M and Zn,
wherein M is Al, Ga, Y, or Sn,
wherein field-effect mobility of the transistor increases as a temperature increases within a range of a first gate voltage to a second gate voltage, and
wherein the first gate voltage is equal to or higher than 0 V and the second gate voltage is equal to or lower than 10 V.

2. The semiconductor device according to claim 1, wherein the field-effect mobility increases continuously as a temperature increases within a temperature range of 25° C. to 120° C.

3. The semiconductor device according to claim 1, wherein a channel length is preferably less than or equal to 3 μm.

4. The semiconductor device according to claim 1, wherein the field-effect mobility of the transistor is greater than or equal to 10 $cm^2/V_s$ within a range of a third gate voltage to a fourth gate voltage at temperatures ranging from 25° C. to 120° C., and
wherein the third gate voltage is equal to or higher than 2 V and the fourth gate voltage is equal to or lower than 10 V.

5. The semiconductor device according to claim 1, wherein a drain current of the transistor in an off state is preferably lower than $5\times10^{-12}$ A at temperatures ranging from 25° C. to 120° C.

6. The semiconductor device according to claim 1, wherein the semiconductor layer comprises a non-single-crystal region.

7. The semiconductor device according to claim 6, wherein the semiconductor layer preferably comprises a first crystal part in which a c-axis is aligned in a thickness direction.

8. The semiconductor device according to claim 6, wherein the semiconductor layer comprises a second crystal part with a size less than or equal to 10 nm which does not have orientation.

9. The semiconductor device according to claim 6, wherein the semiconductor layer comprises an amorphous region.

10. The semiconductor device according to claim 1, wherein the semiconductor layer comprises a region in which a proportion of In is greater than 33% and less than or equal to 60% is preferably included when the sum of the proportions of In, M, and Zn is defined as 1.

11. A semiconductor device comprising:
a transistor comprising:
a semiconductor layer;
a first conductive layer;
a second conductive layer;
a third conductive layer;
a fourth conductive layer;
a first insulating layer;
a second insulating layer; and
a third insulating layer,
wherein the first conductive layer is provided over a formation surface,
wherein the first insulating layer covering the first conductive layer is provided,
wherein the semiconductor layer overlapping with the first conductive layer is provided over the first insulating layer,
wherein the second insulating layer and the second conductive layer are stacked over the semiconductor layer,
wherein the third insulating layer is provided to cover the semiconductor layer and the second conductive layer,
wherein the third conductive layer and the fourth conductive layer are provided apart from each other over the third insulating layer,
wherein the third conductive layer and the fourth conductive layer are provided in contact with regions of the semiconductor layer not overlapping with the second conductive layer, through openings provided in the third insulating layer,
wherein the first conductive layer and the second conductive layer are electrically connected to each other and function as gates,
wherein the semiconductor layer comprises an oxide semiconductor,
wherein the semiconductor layer is a stacked-layer structure,
wherein the semiconductor layer comprises In, M and Zn,
wherein M is Al, Ga, Y, or Sn,
wherein field-effect mobility of the transistor increases as a temperature increases within a range of a first gate voltage to a second voltage, and
wherein the first gate voltage is equal to or higher than 0 V and the second gate voltage is equal to or lower than 10 V.

12. The semiconductor device according to claim 11, wherein the field-effect mobility increases continuously as a temperature increases within a temperature range of 25° C. to 120° C.

13. The semiconductor device according to claim 11, wherein a channel length is preferably less than or equal to 3 μm.

14. The semiconductor device according to claim 11,
wherein the field-effect mobility of the transistor is greater than or equal to 10 cm$^2$/V$_s$ within a range of a third gate voltage to a fourth gate voltage at temperatures ranging from 25° C. to 120° C., and
wherein the third gate voltage is equal to or higher than 2 V and the fourth gate voltage is equal to or lower than 10 V.

15. The semiconductor device according to claim 11, wherein a drain current of the transistor in an off state is preferably lower than $5\times10^{-12}$ A at temperatures ranging from 25° C. to 120° C.

16. A semiconductor device comprising:
a transistor comprising:
a semiconductor layer;
a first conductive layer;
a second conductive layer;
a third conductive layer;
a fourth conductive layer;
a first insulating layer; and
a second insulating layer,
wherein the first conductive layer is provided over a formation surface,
wherein the first insulating layer covering the first conductive layer is provided,
wherein the semiconductor layer overlapping with the first conductive layer is provided over the first insulating layer,
wherein the third conductive layer and the fourth conductive layer are provided apart from each other to be in contact with a top surface of the semiconductor layer,
wherein the second insulating layer covering the semiconductor layer, the third conductive layer, and the fourth conductive layer is provided,
wherein the second conductive layer overlapping with a region of the semiconductor layer where the third conductive layer and the fourth conductive layer are apart from each other is provided over the second insulating layer,
wherein the first conductive layer and the second conductive layer are electrically connected with each other and function as gates,
wherein the semiconductor layer comprises an oxide semiconductor,
wherein the semiconductor layer is a stacked-layer structure,
wherein the semiconductor layer comprises In, M and Zn,
wherein M is Al, Ga, Y, or Sn,
wherein field-effect mobility of the transistor increases as a temperature increases within a range of a first gate voltage to a second voltage, and
wherein the first gate voltage is equal to or higher than 0 V and the second gate voltage is equal to or lower than 10 V.

17. The semiconductor device according to claim 16, wherein the field-effect mobility increases continuously as a temperature increases within a temperature range of 25° C. to 120° C.

18. The semiconductor device according to claim 16, wherein a channel length is preferably less than or equal to 3 μm.

19. The semiconductor device according to claim 16,
wherein the field-effect mobility of the transistor is greater than or equal to 10 cm$^2$/V$_s$ within a range of a third gate voltage to a fourth gate voltage at temperatures ranging from 25° C. to 120° C., and wherein the third gate voltage is equal to or higher than 2 V and the fourth gate voltage is equal to or lower than 10 V.

20. The semiconductor device according to claim 16, wherein a drain current of the transistor in an off state is preferably lower than $5 \times 10^{-12}$ A at temperatures ranging from 25° C. to 120° C.

21. The semiconductor device according to claim 1, wherein the semiconductor layer is formed over a substrate, the substrate is not heated.

22. The semiconductor device according to claim 11, wherein the semiconductor layer is formed over a substrate, the substrate is not heated.

23. The semiconductor device according to claim 16, wherein the semiconductor layer is formed over a substrate, the substrate is not heated.

* * * * *